US012706153B2

(12) United States Patent
Hofmann et al.

(10) Patent No.: US 12,706,153 B2
(45) Date of Patent: Aug. 11, 2026

(54) CALCULATION UNIT SPLITTING FOR NAND IN-MEMORY COMPUTE

(71) Applicant: Sandisk Technologies, Inc., Milpitas, CA (US)

(72) Inventors: Jaco Hofmann, Santa Clara, CA (US); Dejan Vucinic, San Jose, CA (US)

(73) Assignee: Sandisk Technologies, Inc., Milpitas, CA (US)

(*) Notice: Subject to any disclaimer, the term of this patent is extended or adjusted under 35 U.S.C. 154(b) by 91 days.

(21) Appl. No.: 18/655,122

(22) Filed: May 3, 2024

(65) Prior Publication Data

US 2025/0342888 A1 Nov. 6, 2025

(51) Int. Cl.
*G11C 16/10* (2006.01)
*G11C 16/04* (2006.01)

(52) U.S. Cl.
CPC ........ *G11C 16/102* (2013.01); *G11C 16/0483* (2013.01)

(58) Field of Classification Search
CPC .......................... G11C 16/102; G11C 16/0483
USPC .................................................. 365/189.011
See application file for complete search history.

(56) References Cited

U.S. PATENT DOCUMENTS 7,551,477 B2 6/2009 Mokhlesi et al.
8,724,390 B2 5/2014 Hung et al.
8,908,432 B2 12/2014 Kamei et al.
2020/0192971 A1 6/2020 Lue et al.
2022/0180933 A1* 6/2022 Tang .................. G11C 16/0483
2023/0022516 A1 1/2023 Lee et al.
2024/0021249 A1* 1/2024 Gajula ................. G11C 16/102

OTHER PUBLICATIONS

Lee, Sung-Tae, et al., "Neuromorphic Computing Using NAND Flash Memory Architecture With Pulse Width Modulation Scheme," frontiers in Neuroscience, vol. 14, Article 571292, Sep. 2020, 10 pages.

Chowdary, Aswin, et al., "ADC-less 3D-NAND Computer-in-Memory Architecture using Margin Propagation," IEEE 66th International Midwest Symposium on Circuits and Systems, Aug. 2023, 4 pages.

(Continued)

*Primary Examiner* — Amir Zarabian
*Assistant Examiner* — Daniel John King
(74) *Attorney, Agent, or Firm* — Pearl Cohen LLP

(57) ABSTRACT

Technology for in-memory computing. NAND memory cells are organized into calculation cell units based on one or more physical and/or operational characteristics of the NAND memory cells. Variances in physical and/or operational characteristics of the NAND memory cells in a calculation cell unit can negatively impact accuracy of the in-memory compute. NAND memory cell transistors that are similar to each other in the one or more physical and/or operational characteristics are placed into a calculation cell unit even if those memory cells are not adjacent to each other. Two memory cell transistors of one calculation cell unit may be separated by at least one memory cell transistor of a different calculation cell unit. Organizing NAND memory cell transistors into calculation cell units based on one or more physical and/or operational characteristics improves accuracy of NAND in-memory compute.

19 Claims, 41 Drawing Sheets

(56) References Cited

OTHER PUBLICATIONS

Kim, Minsu, et al., "An Embedded NAND Flash-Based Compute-In-Memory Array Demonstrated in a Standard Logic Process," IEEE Journal of Solid-State Circuits, Jul. 2021, 14 pages.
U.S. Appl. No. 18/655,079, filed May 3, 2024.
U.S. Appl. No. 18/655,132, filed May 3, 2024.
U.S. Appl. No. 18/655,110, filed May 3, 2024.

* cited by examiner

207

2400

2450

2500

CALCULATION UNIT SPLITTING FOR NAND IN-MEMORY COMPUTE

BACKGROUND

The present disclosure relates to technology for in-memory computing.

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. Although such neural networks can provide highly accurate results, they are extremely computationally intensive, and the data transfers involved in reading the weights connecting the different layers out of memory and transferring these weights into the processing units of a processing unit can be quite intensive.

BRIEF DESCRIPTION OF THE DRAWINGS

Like-numbered elements refer to common components in the different figures.

DETAILED DESCRIPTION

Technology is disclosed for in-memory computing. Multiply and accumulate (MAC) operations are a basic operation in the implementation of machine learning algorithms, such as artificial neural networks. Such operations typically involve extremely large amounts of data and large numbers of operations. As such, they are extremely computationally intensive, involving large numbers of data transfers and consuming large amounts of time and power. A basic operation for these computations is vector-matrix multiplication (or even more basically vector-vector multiplication). The result of the vector-matrix multiplication (VMM) is typically a vector. The result of the vector-vector multiplication is typically a scalar. The vector-vector multiplication may be referred to as a vector dot product or, more generally, as a vector inner product. These operations can be efficiently performed by compute in memory operations, in which the matrices are programed into a non-volatile and the vectors applied as bias levels to the arrays of the memory device. Compute in memory vector-matrix multiplication can be implemented in both binary valued embodiments and analog or multi-bit embodiments.

A technical challenge for NAND in-memory computing is variations between characteristics of the NAND memory cells used in the in-memory computing. Cell to cell variations in the physical and/or operational characteristics of the NAND memory cells may negatively impact accuracy of the in-memory compute. In some techniques NAND memory cells are organized into calculation cell units. Each calculation cell has two or more NAND memory cells whose respective threshold voltages (Vt) are programmed such that the calculation cell unit represents some value, such as value in a vector. Variances in physical and/or operational characteristics of the NAND memory cells in a calculation cell unit can negatively impact accuracy of the in-memory compute. In an embodiment, the calculation cell units are organized based on one or more physical and/or operational characteristics of individual NAND memory cell transistors. NAND memory cell transistors that are similar to each other in the one or more physical and/or operational characteristics are placed into a calculation cell unit even if those memory cells are not adjacent to each other. This organization may result in calculation cell units being formed from NAND memory cell transistors that are not adjacent to each other. For example, two memory cell transistors of one calculation cell unit may be separated by at least one memory cell transistor of a different calculation cell unit (resulting in "calculation unit splitting"). Organizing NAND memory cell transistors into calculation cell units based on one or more physical and/or operational characteristics improves accuracy of NAND in-memory compute.

Figure 1:
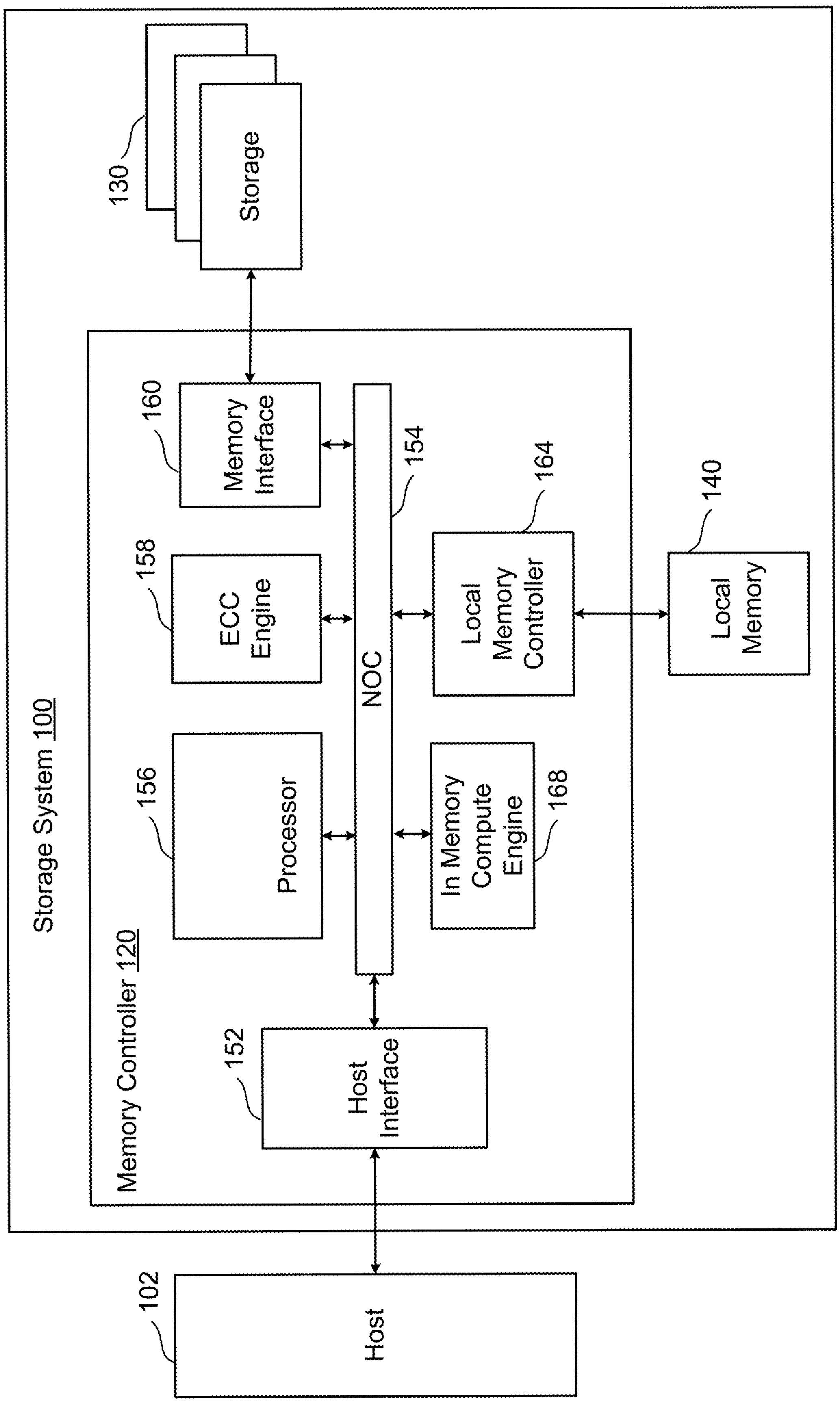
FIG. 1 is a block diagram depicting one embodiment of a memory system.

FIG. 1 is a block diagram of one embodiment of a memory system 100 that implements the technology described herein. In one embodiment, memory system 100 performs in-memory computing. In an embodiment, storage 130 is used for in-memory compute. In one embodiment, memory system 100 is a solid state drive ("SSD"). Memory system 100 can also be a memory card, USB drive or other type of memory system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156. In an embodiment in which memory controller 120 oversees in-memory compute in storage 130, the ECC engine 158 is not needed for data encoding and decoding.

Processor 156 performs the various controller memory operations such as programming, erasing, reading, and memory management processes. The in memory compute engine 168 oversees in-memory compute in the storage 130 and/or local memory 140. The in memory compute engine 168 may program weights of an AI model into memory cells in storage 130 and/or local memory 140. The in memory compute engine 168 may provide input vectors to storage 130 and/or local memory during in-memory compute. The in memory compute engine 168 may return computation results to the host 102. Although depicted as separated from the processor 156, the in memory compute engine 168 may be implemented by the processor 156. In one embodiment, processor 156 is programmed by firmware. In other embodiments, processor 156 is a custom and dedicated hardware circuit without any software. In some embodiments, the storage 130 is used only for in-memory compute. In some embodiments, the storage 130 is used for both in-memory compute and host storage. The following will describe an option to use a portion of storage for host storage. Processor 156 may also implement a translation module, as a software/firmware process or as a dedicated hardware circuit. In many systems, the non-volatile memory is addressed internally to the memory system using physical addresses associated with the one or more memory die. However, the host system will use logical addresses to address the various memory locations. This enables the host to assign data to consecutive logical addresses, while the memory system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a memory system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
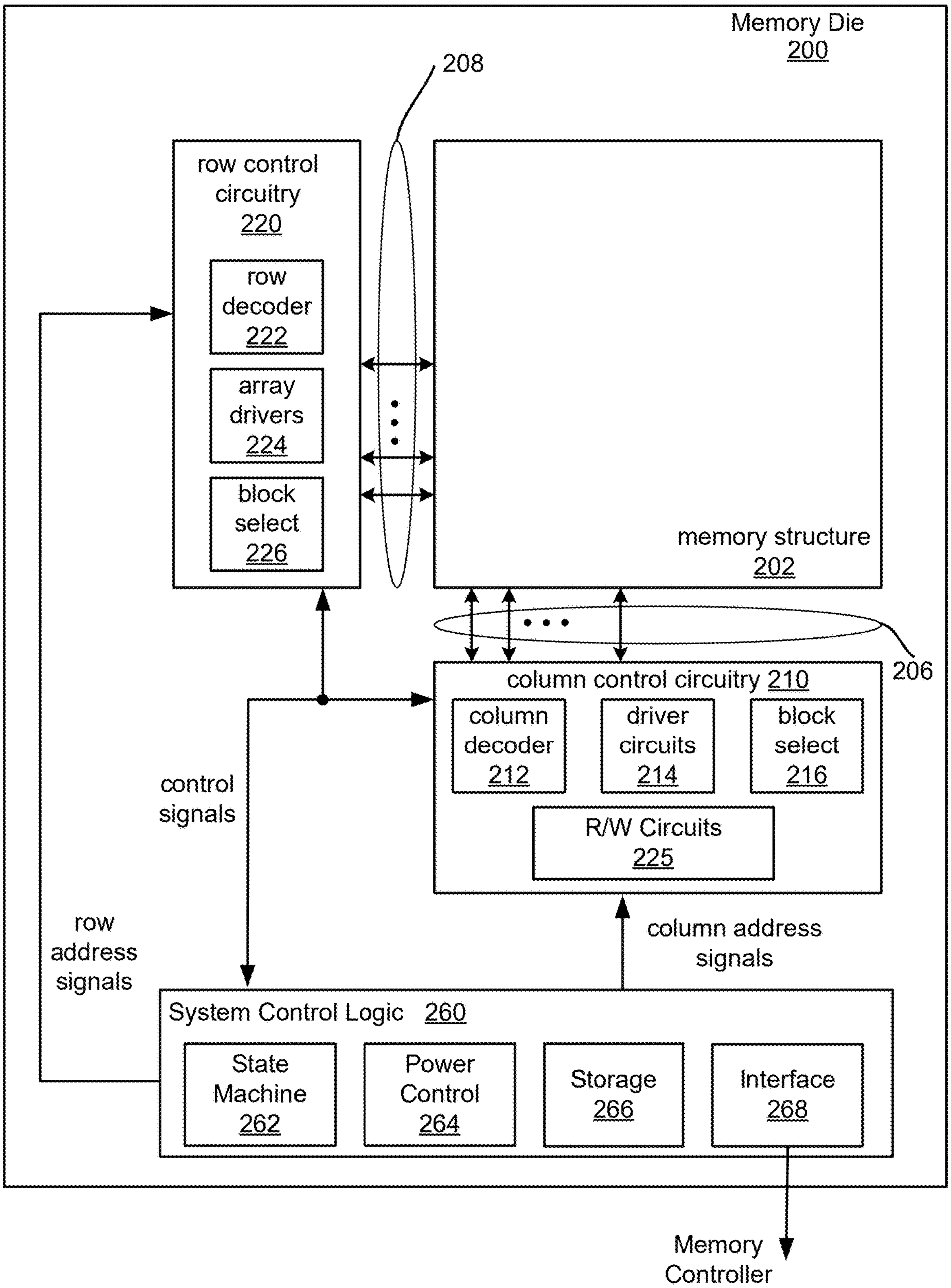
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuitry 220 are configured to control memory operations such as open block reads at the die level.

System control logic 260 receives data and commands from memory controller 120 and provides output data and status to the host. In an embodiment the data includes weights of an AI model to program into memory cells in the memory structure 202. In an embodiment the output data includes computation results from an in-memory compute. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of memory system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the memory system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
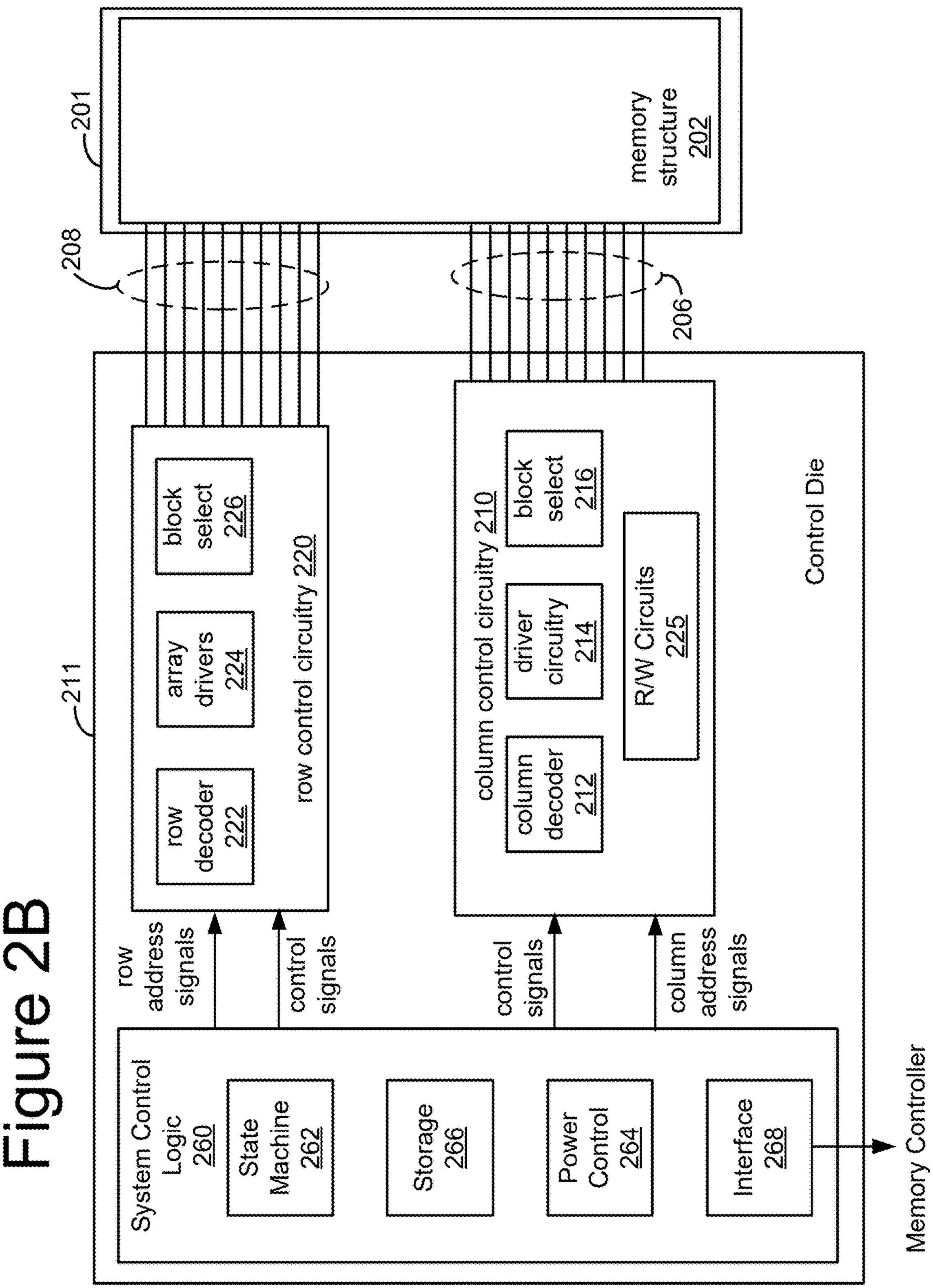
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of memory system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, memory system 100, memory controller 120, storage 130, memory die 200, integrated memory assembly 207, and/or control die 211.

Figure 3A:
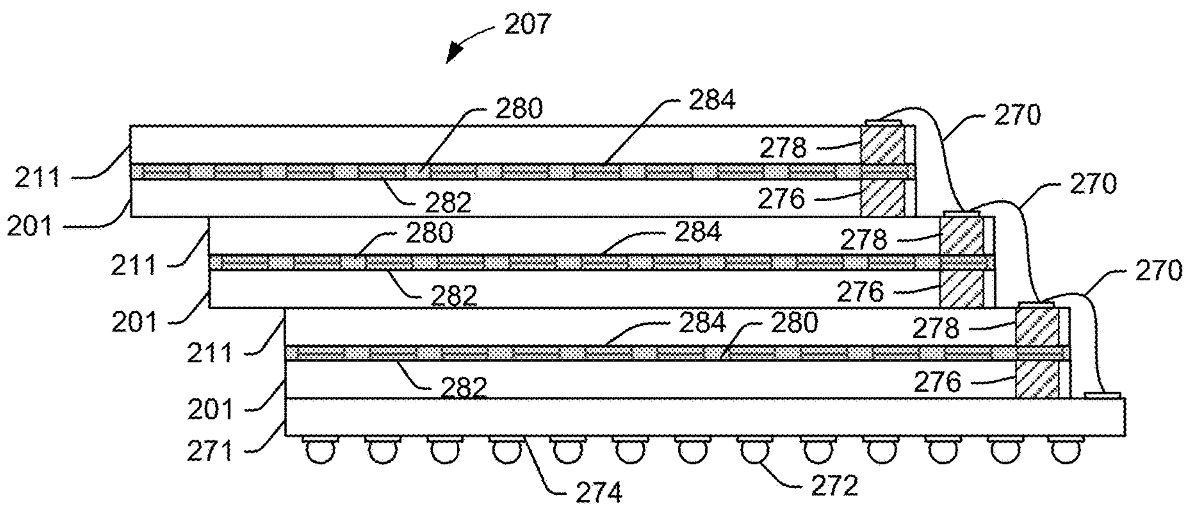
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
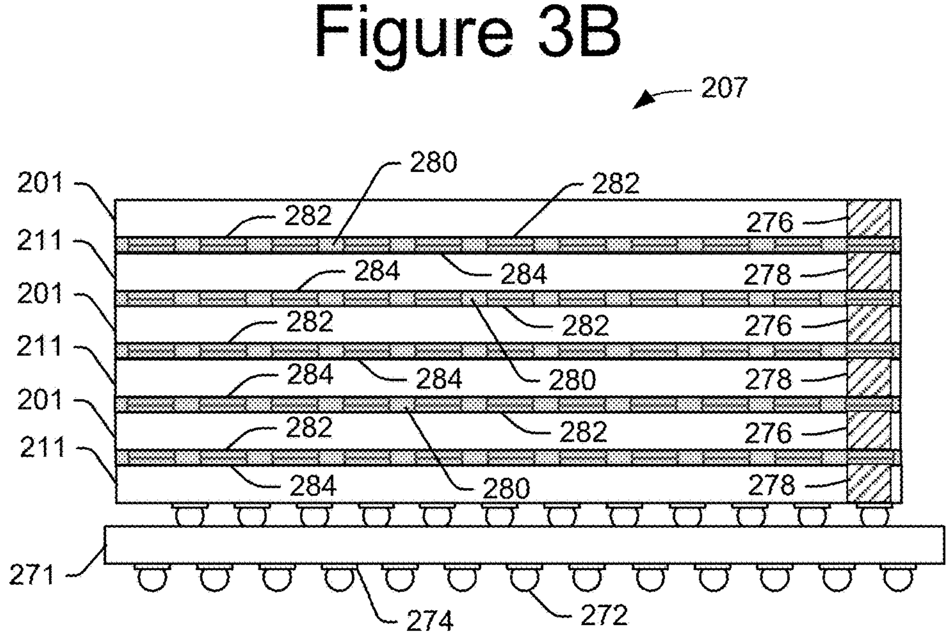

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
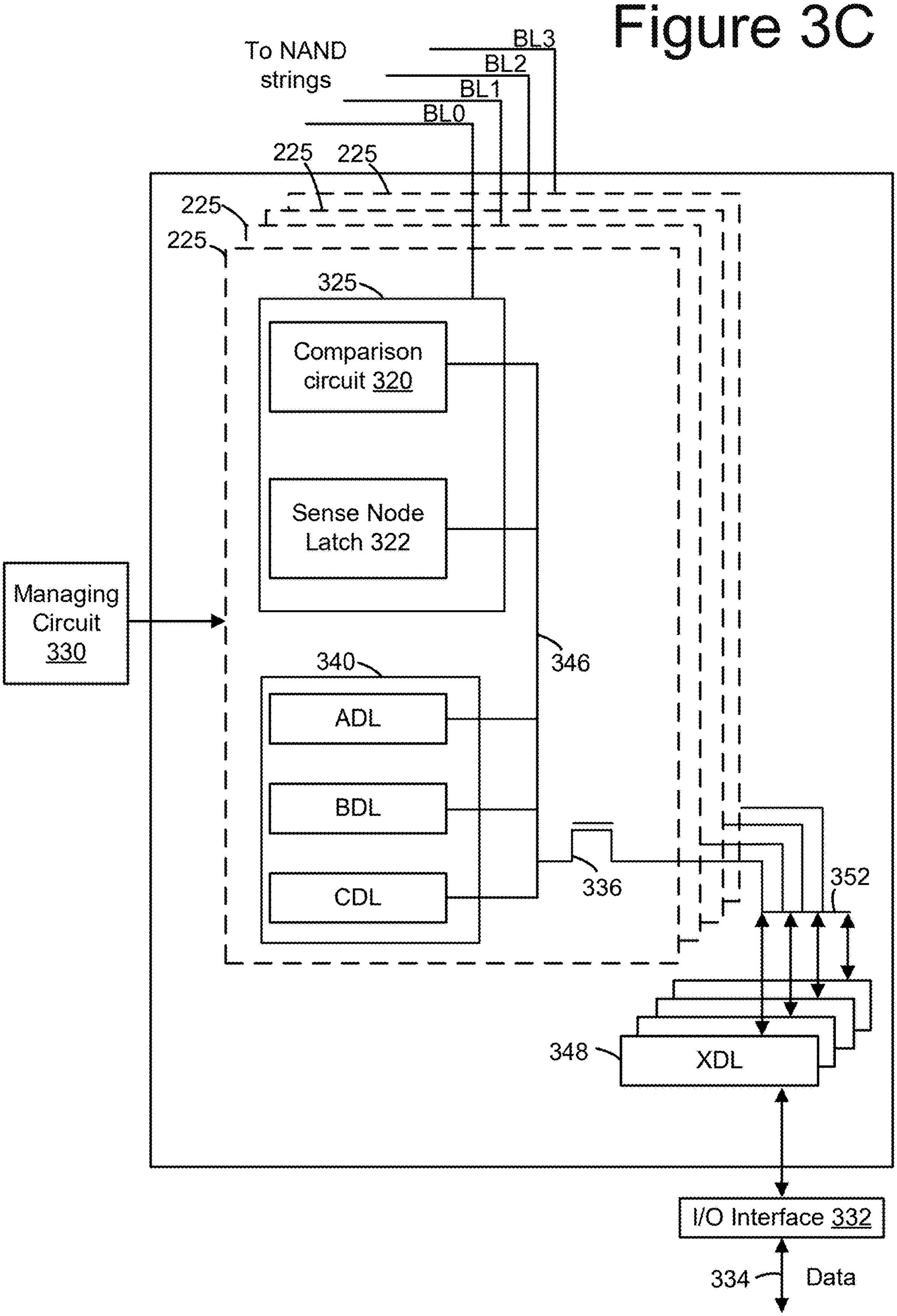
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, read, and in-memory compute operations. Sense amplifiers are also used to sense the condition (e.g., data state) of a memory cell in a NAND string connected to the bit line that connects to the respective sense amplifier. The following will discuss use of the sense amplifier 325 to sense a condition (e.g., data state) of a memory cell.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the program verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
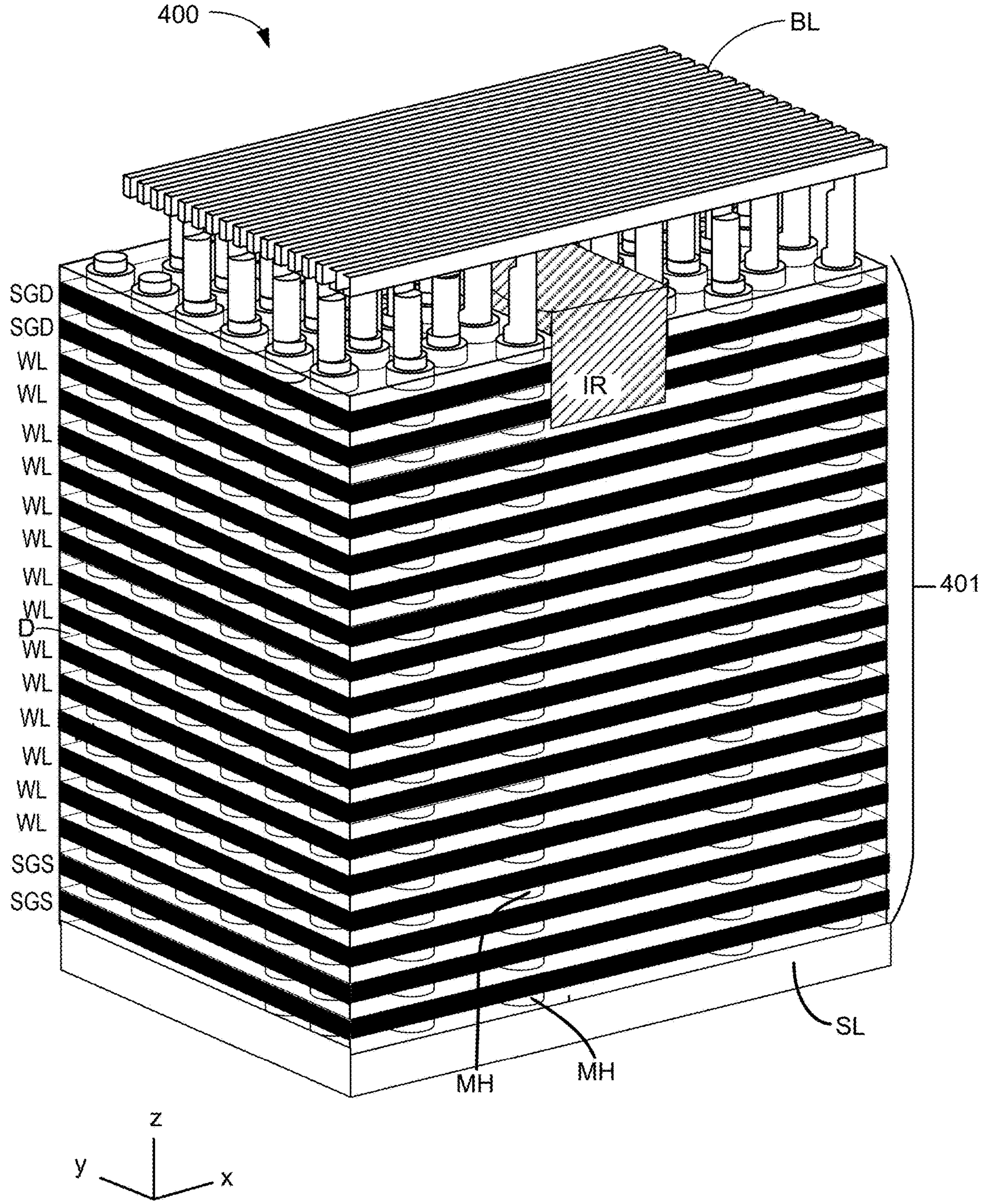
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D. The conductive layers are labeled as one of: SGD, WL, or SGS. An SGD conductive layer serves as drain side select lines. A WL conductive layer serves as a word line. An SGS conductive layer serves as a source side select line. The numbers of each of these conductive layers is limited for ease of illustration. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

In one embodiment the block is operated as a number of "sub-blocks." Each of these "sub-blocks" has many NAND strings. In an embodiment, an isolation region (IR) divides the SGD layers into multiple SGD select lines, each of which is used to select a sub-block (e.g., set of NAND strings). FIG. 4 depicts an example having one IR region and thereby two strings. However, there may be more than one IR region and thereby more than two sub-blocks. Optionally, the IR region can extend down through all of the alternating dielectric layers and conductive layers.

Figure 4A:
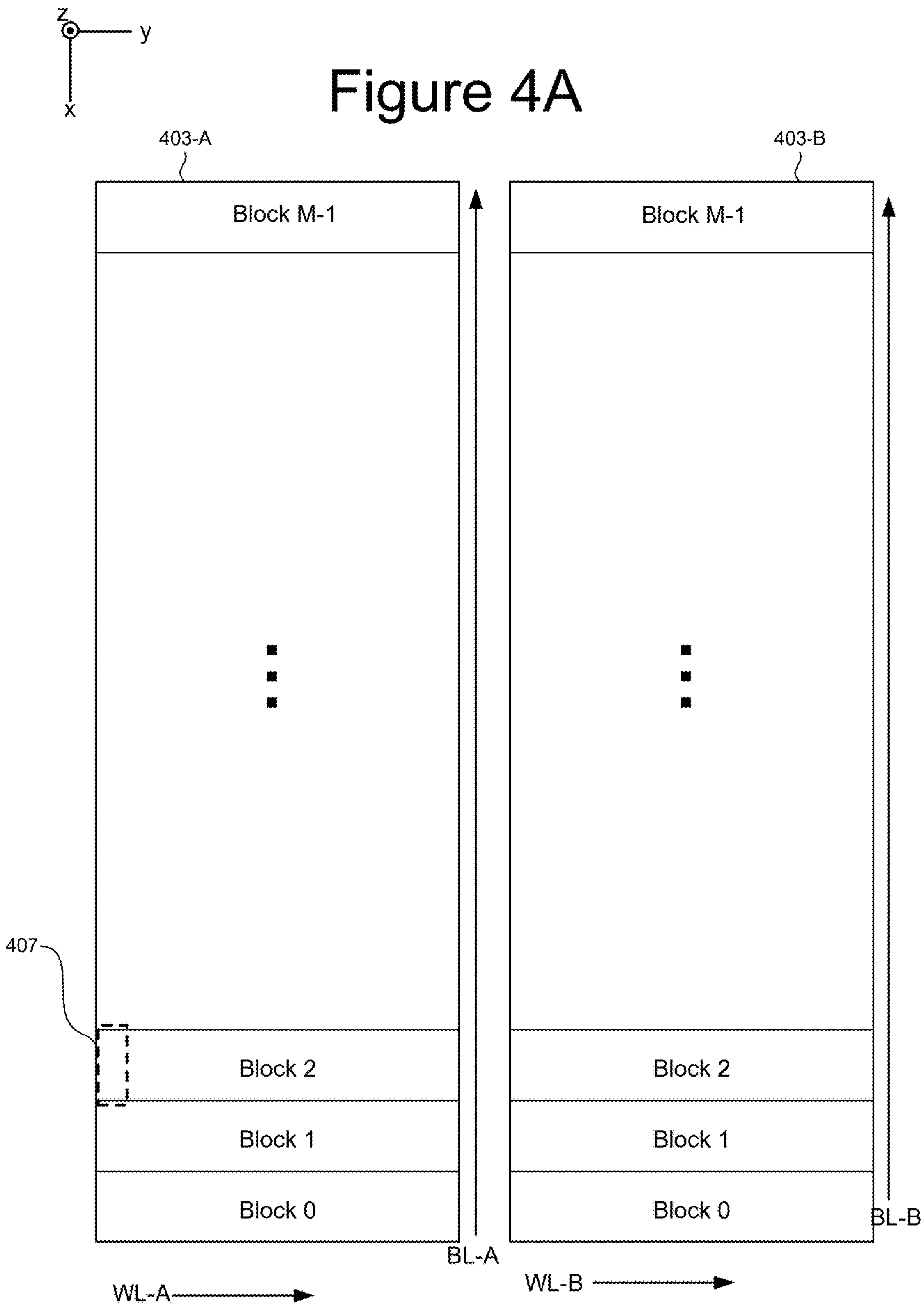
FIG. 4A is a block diagram of one embodiment of a memory structure having two planes.

FIG. 4A is a block diagram explaining one example organization of memory structure 202, which is divided into two planes 403-A and 403-B. Each plane 403 is then divided into M physical blocks. In one example, each plane has about 2000 physical blocks (or more briefly "blocks"). However, different numbers of blocks and planes can also be used. In one "full-block" embodiment, a block of memory cells is a unit of erase. That is, all memory cells of a block are erased together. In a "sub-block mode" embodiment, blocks are divided into sub-blocks and the sub-blocks are the unit of erase. In an embodiment, a block contains a number of word lines with each sub-block containing a unique set of the data word lines. In an embodiment, each plane 403-A, 403-B has a set of bit lines that extend across all of the blocks in that plane. In an embodiment, one block per plane is selected at a time. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403-A, 403-B more or fewer than two planes can be implemented. In some embodiments, memory structure 202 includes four planes. In some embodiments, memory structure 202 includes eight planes. In some embodiments, programming can be performed in parallel in a first selected block in plane 403-A and a second selected block in plane 403-B.

Figure 4B:
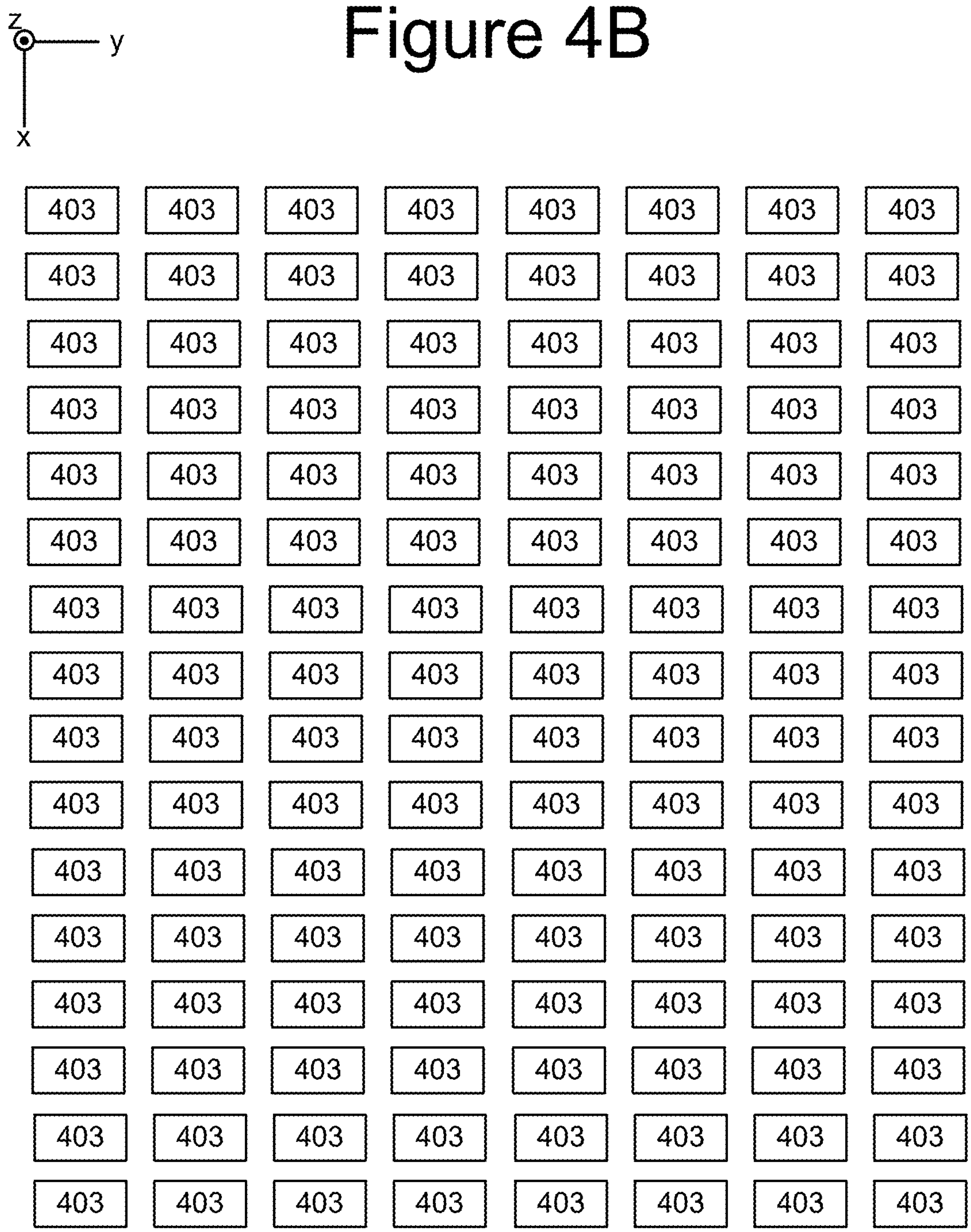
FIG. 4B is a block diagram of one embodiment of a memory structure having a large number of planes.

FIG. 4B depicts another architecture of a memory die having a large number of planes 403. In this example, there are 16 planes in the x-direction (bit line direction) and 8 planes 403 in the y-direction (word line direction). Each plane 403 has a number of blocks, such as in FIG. 4A. However, in the architecture in FIG. 4B there may be fewer blocks per plane 403 than in the architecture in FIG. 4A. Also, note that in an embodiment the bit lines only extend in the x-direction across a single plane 403. Therefore, the architecture depicted in FIG. 4B provides for shorter bit lines than the architecture depicted in FIG. 4A. Also, note that in an embodiment the word lines only extend in the y-direction across a single plane 403. Therefore, the architecture depicted in FIG. 4B provides for shorter word lines than the architecture depicted in FIG. 4A.

Figure 4C:
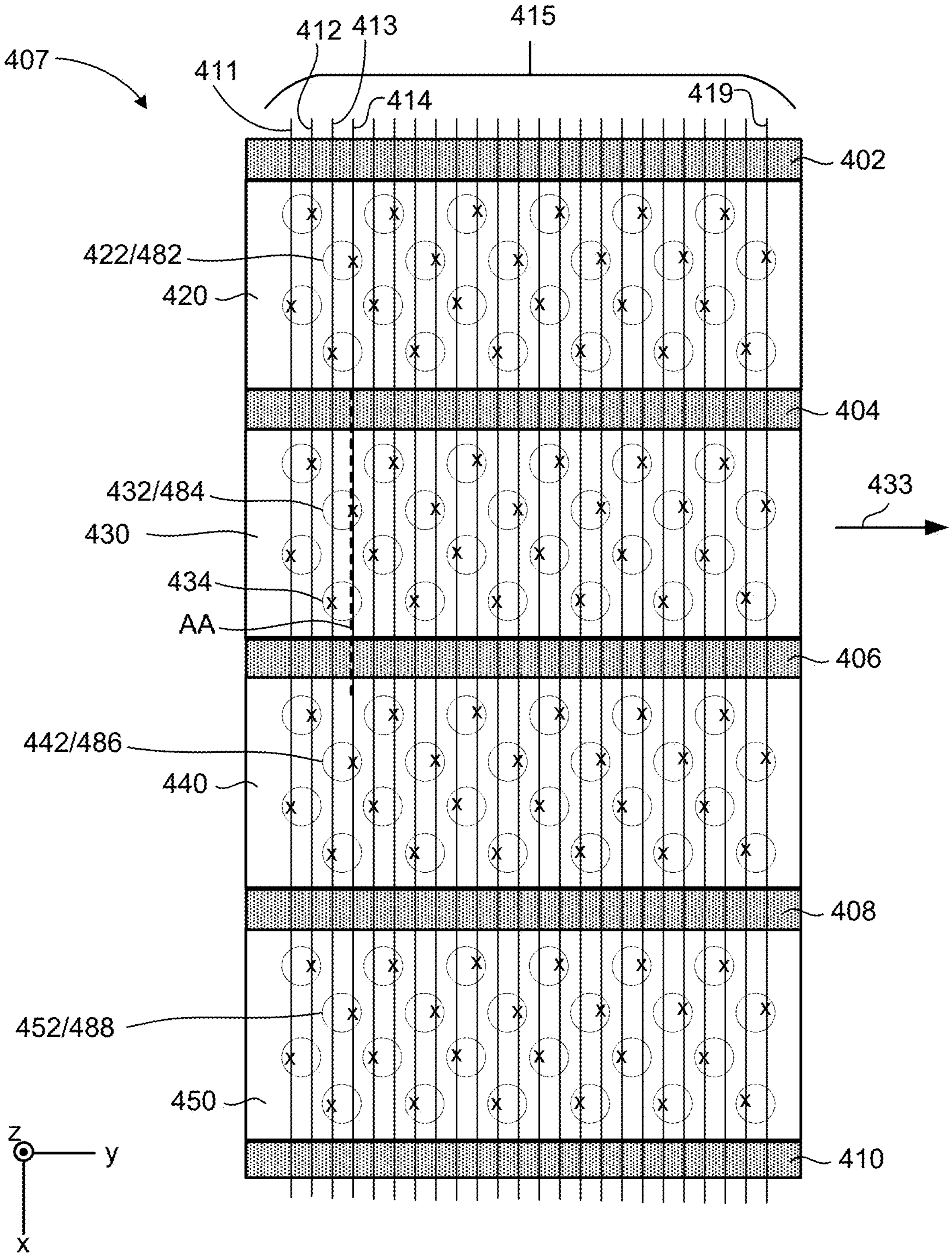
FIG. 4C is a block diagram depicting a top view of a portion of block of memory cells.

FIGS. 4C-4F depict an example three dimensional ("3D") NAND structure that corresponds to the structure of FIG. 4 and can be used to implement memory structure 202 of FIGS. 2A and 2B. FIG. 4C is a diagram depicting a top view of a portion 407 of Block 2. As can be seen from FIG. 4C, the physical block depicted in FIG. 4C extends in the direction of arrow 433. In one embodiment, the memory array has many layers; however, FIG. 4C only shows the top layer.

FIG. 4C depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4C depicts vertical columns 422, 432, 442, and 452. Vertical column 422 implements NAND string 482. Vertical column 432 implements NAND string 484. Vertical column 442 implements NAND string 486. Vertical column 452 implements NAND string 488. More details of the vertical columns are provided below. Since the physical block depicted in FIG. 4B extends in the direction of arrow 433, the physical block includes more vertical columns than depicted in FIG. 4B.

FIG. 4C also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452. The bit lines 415 may also extend over other blocks in the plane.

The physical block depicted in FIG. 4C includes a set of isolation regions 402, 404, 406, 408, and 410, which are formed of $SiO_2$; however, other dielectric materials can also be used. Isolation regions 402, 404, 406, 408, and 410 serve to divide the top layers of the physical block into four regions; for example, the top layer depicted in FIG. 4C is divided into regions 420, 430, 440, and 450, which are referred to herein as "sub-blocks." Each sub-block contains a large number of NAND strings. In one embodiment, isolation regions 402 and 410 separate the physical block 407 from adjacent physical blocks. Thus, isolation regions 402 and 410 may extend down to the substrate. In one embodiment, the isolation regions 404, 406, and 408 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, and 450. In that implementation, each physical block has sixteen rows of active columns and each bit line connects to four NAND strings in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4C shows each region (420, 430, 440, 450) having four rows of vertical columns, four regions (420, 430, 440, 450) and sixteen rows of vertical columns in a block, those exact numbers are an example implementation. Other embodiments may include more or fewer regions (420, 430, 440, 450) per block, more or fewer rows of vertical columns per region and more or fewer rows of vertical columns per block. FIG. 4C also shows the vertical columns being staggered. In other embodiments, different patterns of staggering can be used. In some embodiments, the vertical columns are not staggered.

Figure 4D:
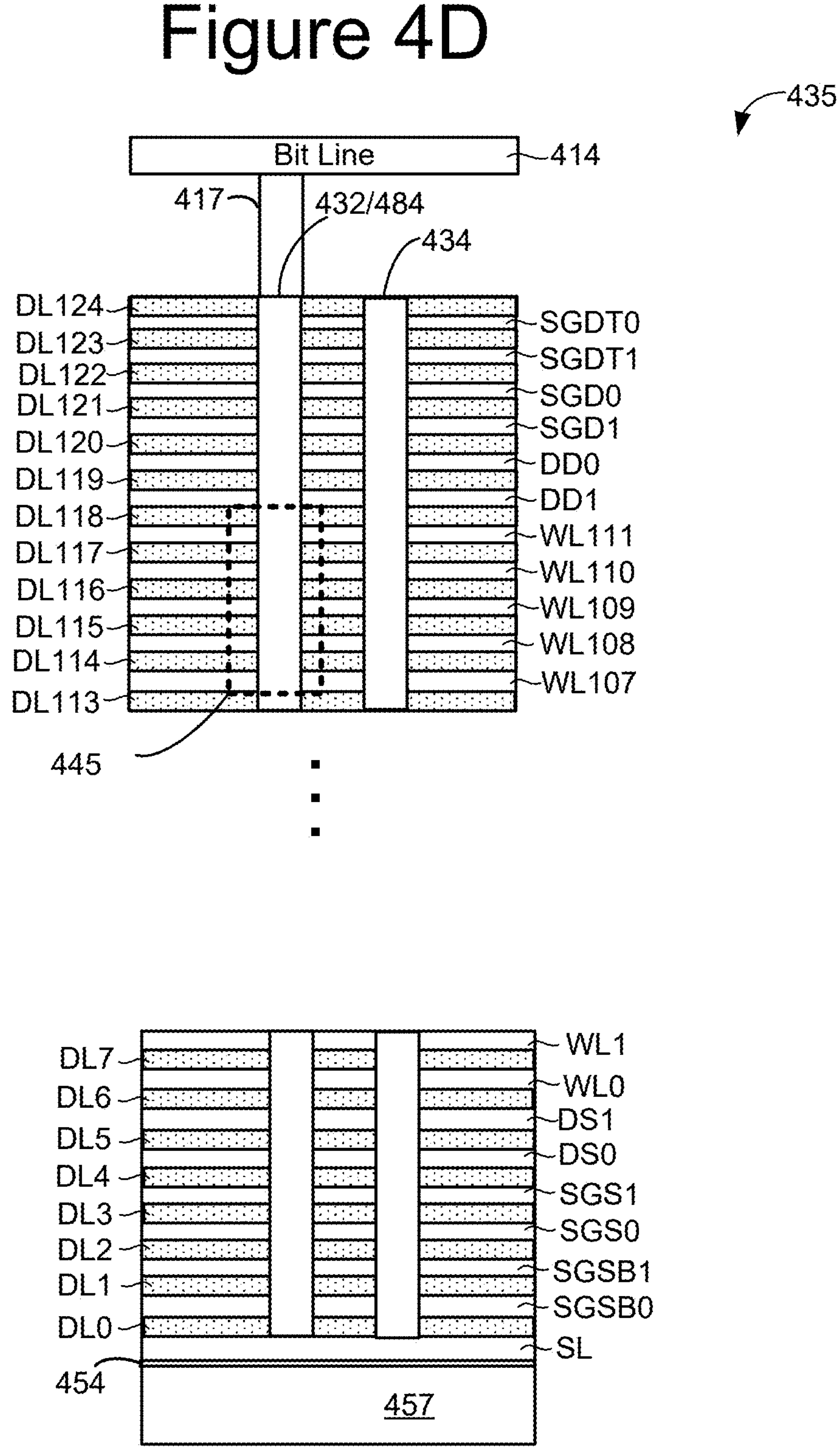
FIG. 4D depicts an embodiment of a stack showing a cross-sectional view along line AA of FIG. 4C.

FIG. 4D depicts an example of a stack 435 showing a cross-sectional view along line AA of FIG. 4C. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have the same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

In some embodiments, the stack 435 is divided into two or more tiers. A two or other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines. In some embodiments, the tiers are erased independent of one another. Hence, data may be maintained in the upper tier after the lower tiers is erased. Likewise, data may be maintained in the lower tier after the upper tier is erased.

Figure 4E:
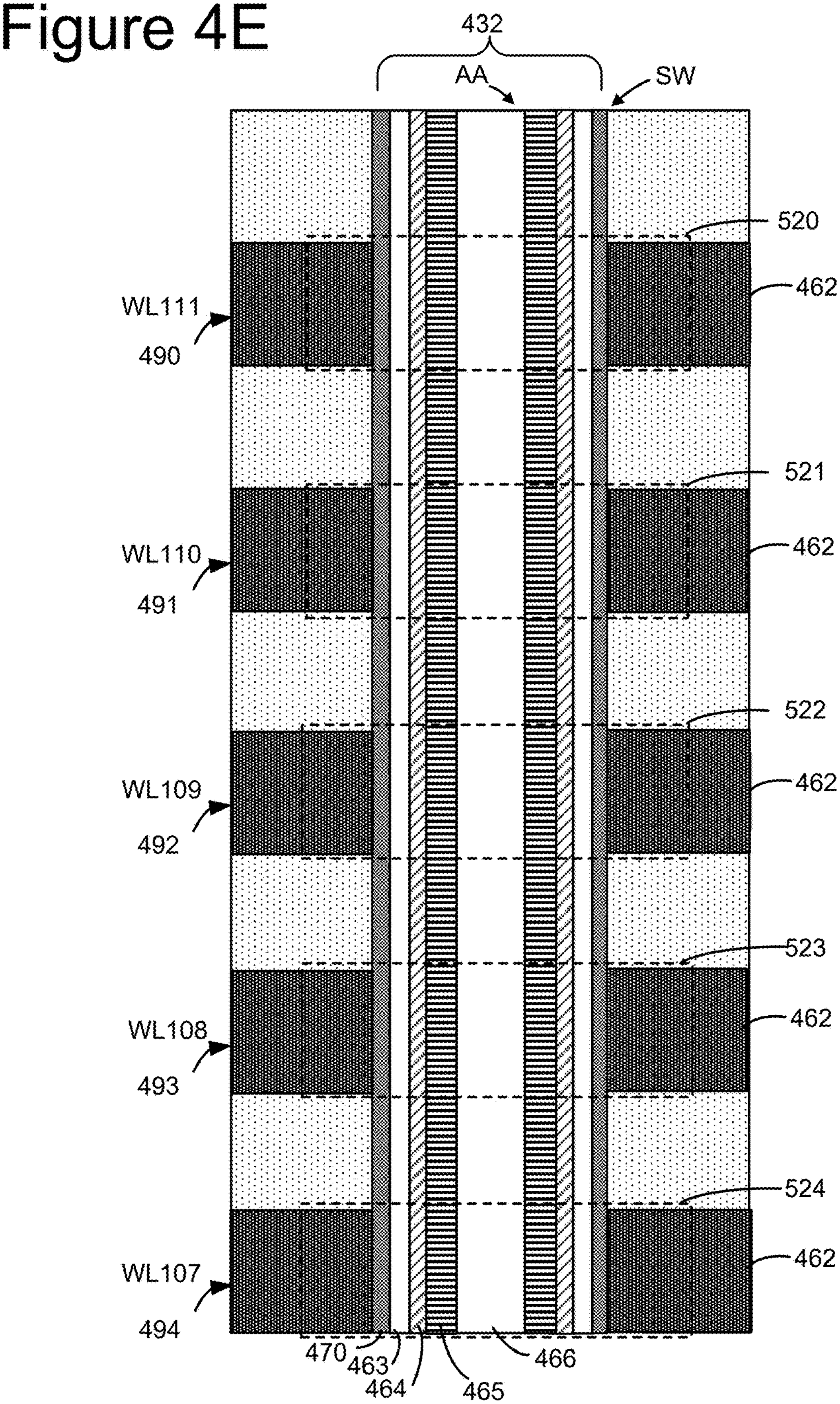
FIG. 4E depicts a view of the region 445 of FIG. 4D.

FIG. 4E depicts a view of the region 445 of FIG. 4D. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
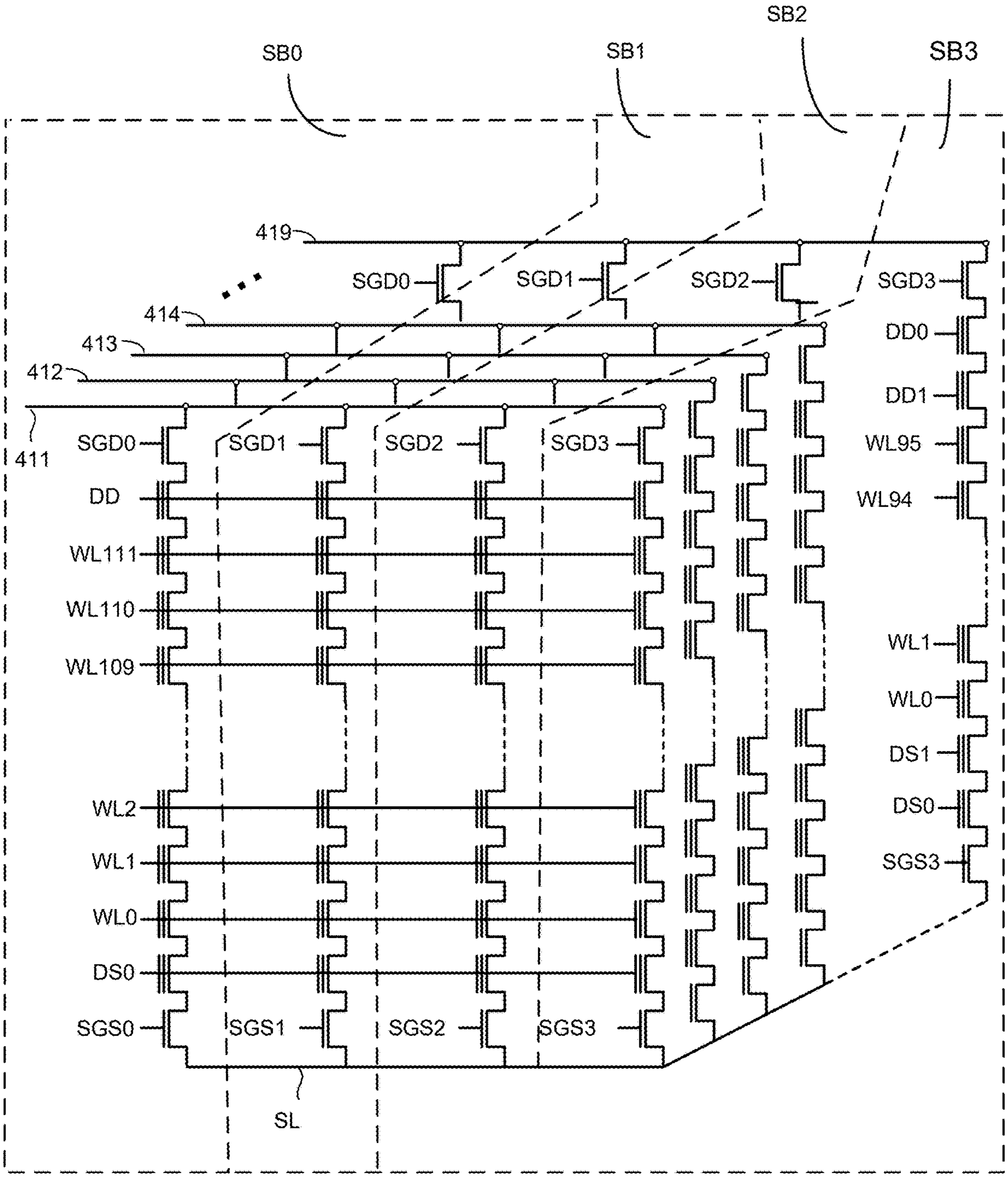
FIG. 4F is a schematic diagram of a portion of one embodiment of a block, depicting several NAND strings.

FIG. 4F is a schematic diagram of a portion of the memory array 202. FIG. 4F shows physical data word lines WL0-WL111 running across the entire block. The structure of FIG. 4F corresponds to a portion 407 in Block 2 of FIG. 4A, including bit lines 411, 412, 413, 414, . . . 419. Within the physical block, in one embodiment, each bit line is connected to four NAND strings. Thus, FIG. 4F shows bit line 411 connected to four NAND strings NS0, NAND string NS1, NAND string NS2, and NAND string NS3.

FIG. 4F shows an example in which there are four drain side select lines in the physical block. For example, drain side select line SGD0 may be used to select SB0, drain side select line SGD1 may be used to select SB1, drain side select line SGD2 may be used to select SB2, and drain side select line SGD3 may be used to select SB3. Although only drain side select line SGD0 is depicted per SB, there may be more than one drain side select line per SB. Each set drain side select lines connects to a group of NAND strings in the SB.

Although the example memories of FIGS. 4-4F are three dimensional memory structure that includes vertical NAND strings with charge-trapping material, other 3D memory structures can also be used with the technology described herein.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate.

Figure 5:
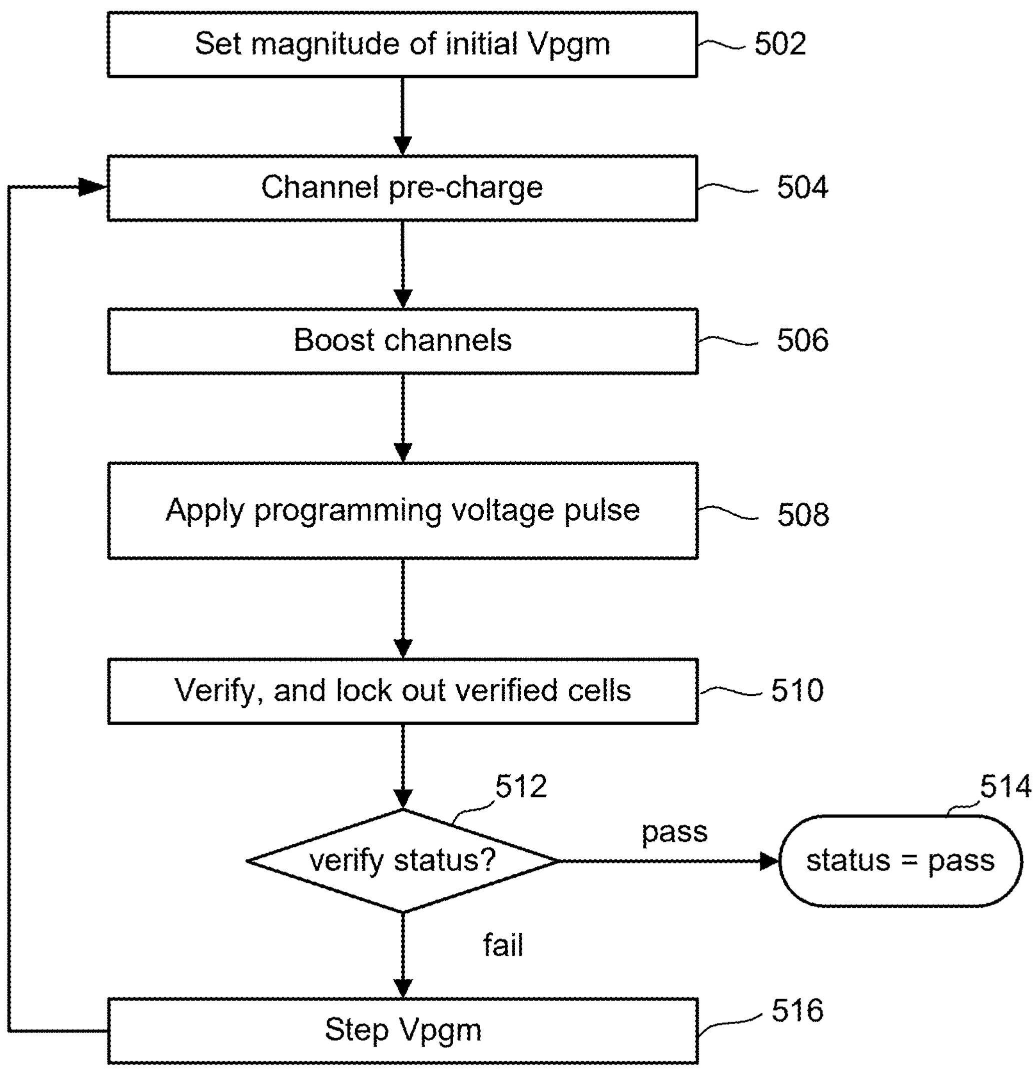
FIG. 5 is a flowchart describing one embodiment of a process for programming memory cells connected to a selected word line.

FIG. 5 is a flowchart describing one embodiment of a process for programming memory cells connected to a selected word line. Programming memory cells connected to a word line is referred to herein as programming the word line. For purposes of this document, the term program and programming are synonymous with write and writing. The process includes multiple loops, each of which includes a program phase and a verify phase. In an embodiment, the process is used to program weights of an AI model into the memory cells. The weights correspond to Vts, wherein a memory cell is programmed to a target Vt that represents the weight.

In one example embodiment, the process in FIG. 5 is performed for memory structure 202 using the one or more control circuits (e.g., system control logic 260, column control circuitry 210, row control circuitry 220) discussed above. Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 502 of FIG. 5, the programming voltage signal (Vpgm) is initialized to the starting magnitude (e.g., ~12-16V or another suitable level). Optionally a program counter PC may be maintained by state machine 262 and initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target Vt, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 504 the system will pre-charge channels of NAND strings that include memory cells connected to the selected word line that are to be inhibited from programming. In step 506, NAND strings that include memory cells connected to the selected word line that are to be inhibited from programming have their channels boosted to inhibit programming. Such NAND strings are referred to herein as "unselected NAND strings." In one embodiment, at least some unselected word lines receive one or more boosting voltages (e.g., ~7-11 volts) to perform boosting schemes. A program inhibit voltage is applied to the bit lines coupled the unselected NAND string.

In step 508, a program voltage pulse of the programming voltage signal Vpgm is applied to the selected word line (the word line selected for programming). If a memory cell on a NAND string should be programmed, then the corresponding bit line is biased at a program enable voltage. In step 508, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 510, program verify is performed and memory cells that have reached their target states are locked out from further programming by the control die. Step 510 includes performing verification of programming by sensing at one or more verify reference levels. In one embodiment, the verification process is performed by testing whether the threshold voltages of the memory cells selected for programming have reached the appropriate verify reference voltage. In step 510, a memory cell may be locked out after the memory cell has been verified (by a test of the Vt) that the memory cell has reached its target Vt. For example, a memory cell may be locked out if it reaches a verify reference voltage.

If, in step 512, it is determined that all of the memory cells have reached their target threshold voltages (pass), the programming process is complete and successful because all selected memory cells were programmed and verified to their target states. A status of "PASS" is reported in step 514. Otherwise if, in step 512, it is determined that not all of the memory cells have reached their target threshold voltages (fail), then the programming process continues to step 516.

At step 516 the programming voltage signal Vpgm is stepped up to the next magnitude. For example, the next pulse will have a magnitude greater than the previous pulse by a step size ΔVpgm (e.g., a step size of 0.1-1.0 volts). After step 516, the process loops back to step 504 and another program pulse is applied to the selected word line so that another iteration (steps 504-516) of the programming process of FIG. 5 is performed.

Figure 6A:
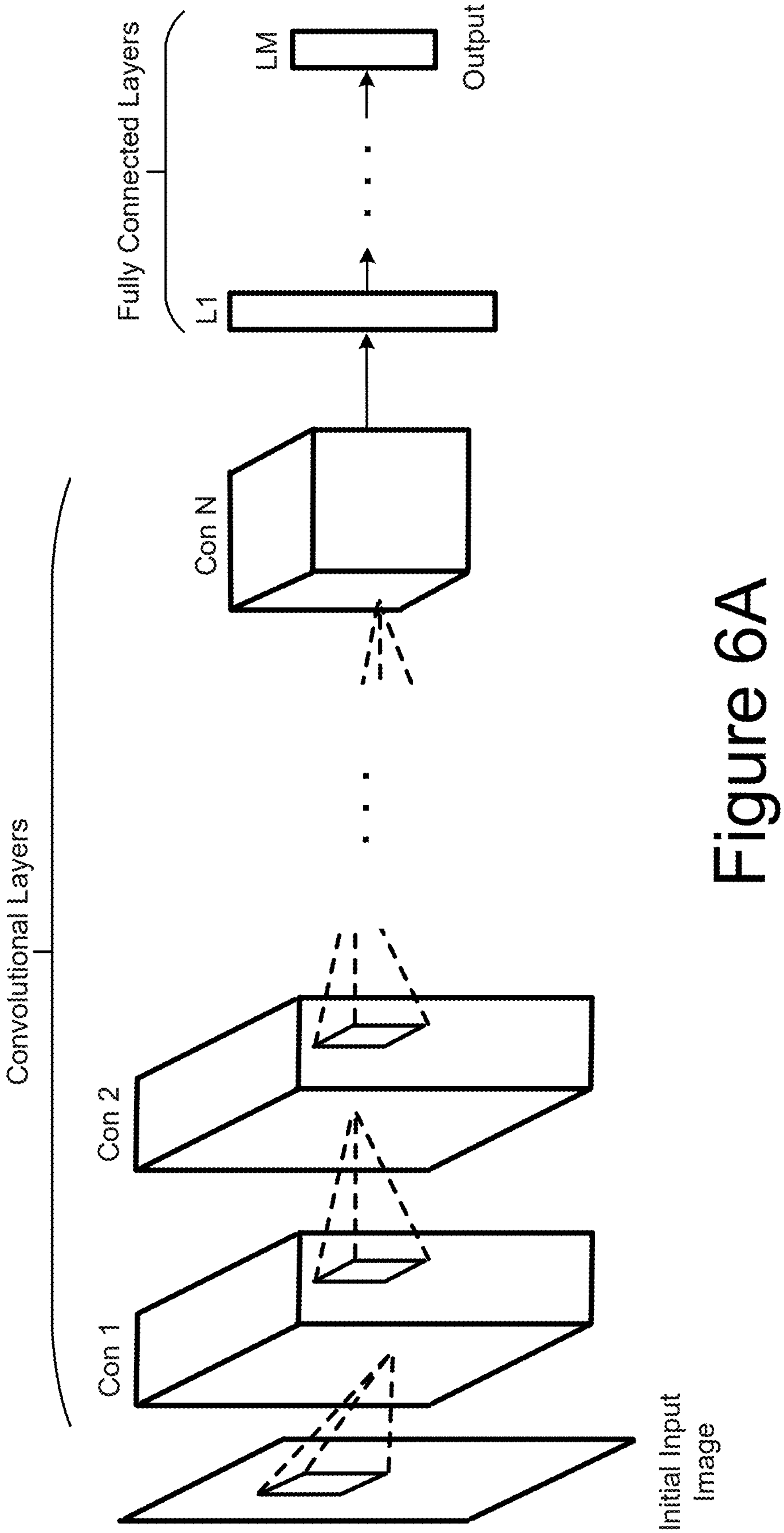
FIG. 6A illustrates a simple example of a convolutional neural network (CNN).

FIG. 6A is a schematic representation of an example of a convolutional neural network (CNN). FIG. 6A illustrates an initial input image of an array of pixel values, followed by a number of convolutional layers that are in turn followed by a number of fully connected layers, the last of which provides the output. Each neuron in the first convolutional layer (Con 1) takes as input data from an n×n pixel subregion of the input image. The neuron's learned weights, which are collectively referred to as its convolution filter, determine the neuron's single-valued output in response to the input. In the convolutional layers, a neuron's filter is applied to the input image by sliding the input region along the image's x and y dimensions to generate the values of the convolutional layer. In practice, the equivalent convolution is normally implemented by statically identical copies of the neuron to different input regions. The process is repeated through each of the convolutional layers (Con1 to Con N) using each layer's learned weights, after which it is propagated through the fully connected layers (L1 to LM) using their learned weights.

Figure 6B:
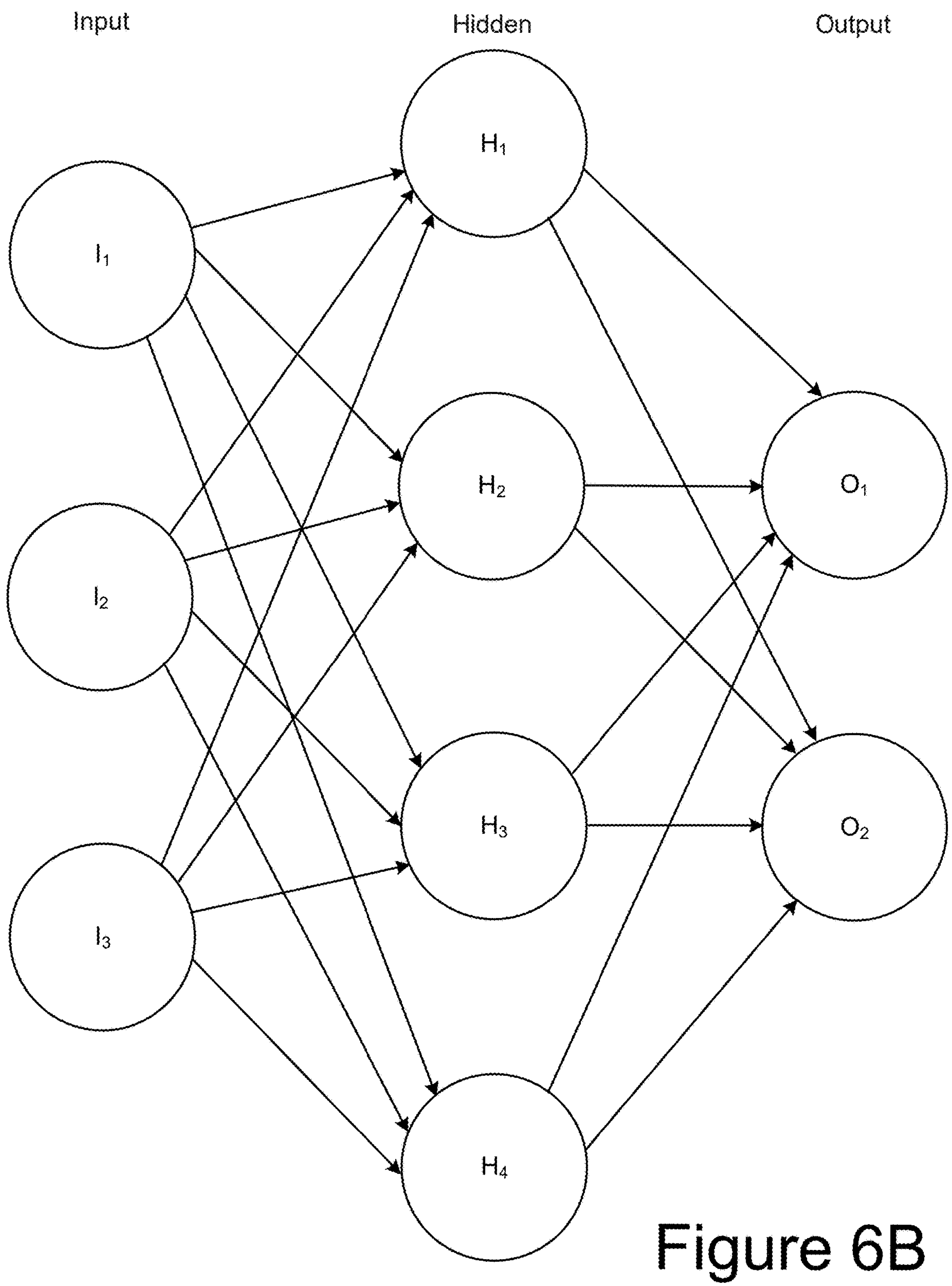
FIG. 6B illustrates a simple example of fully connected layers in an artificial neural network.

FIG. 6B represents several fully connected layers of a neural network in more detail. In FIG. 6B the shown three layers of the artificial neural network are represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 6A shows only a single intermediate or hidden layer, a complex deep neural network (DNN) can have many such intermediate layers.

Figure 7A:
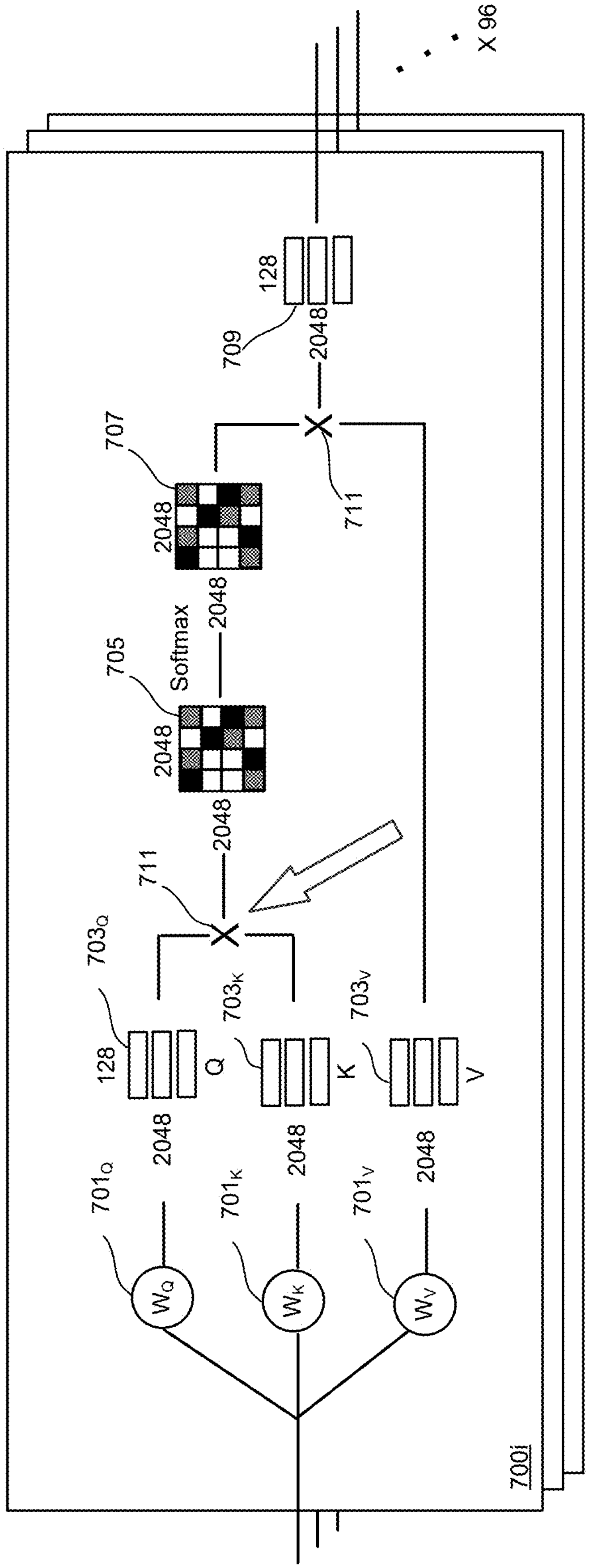
FIGS. 7A and 7B illustrates some elements of an example of a transformer model of deep neural network (DNN).
Figure 7B:
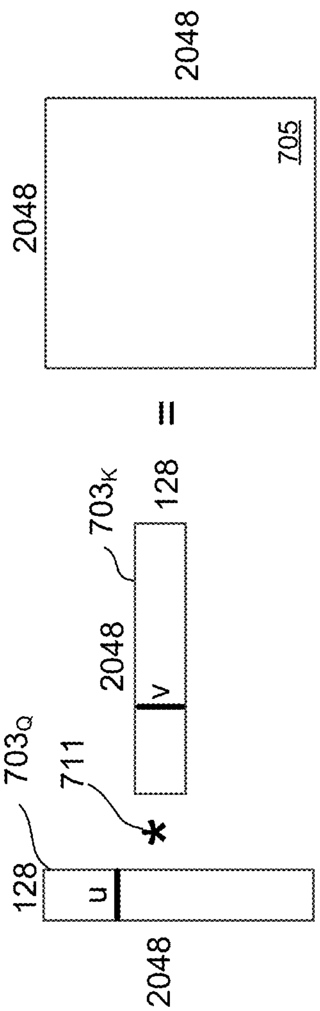

Embodiments of MAC disclosed herein may be used in a Large Language Model (LLM). Embodiments of MAC disclosed herein may be used in a Generative Pre-trained Transformer (GPT) models of deep neural networks. Some embodiments of MAC operations disclosed herein are used in a transformer model of a deep neural network. FIGS. 7A and 7B illustrate some elements of an example of a transformer model of a deep neural network. FIG. 7A shows some of the elements of a layer 700*i* of the transformer model, where there can be a large number of these layers, such 96 layers for example. The layer receives as inputs three sets of weights $W_Q$ $\mathbf{701}_Q$, $W_K$ $\mathbf{701}_K$, and $W_V$ $\mathbf{701}_V$, corresponding to Query, Keys and Value matrices of weight values at $\mathbf{703}_Q$, $\mathbf{703}_K$, and $\mathbf{703}_V$. In this example the size of the matrices in 128*x*2048, which, as represented schematically, can be broken down into vectors. The Query and Key matrices are multiplied at 711 to generate the 2048×2048 matrix 705, where all of the sizes here are examples and other embodiments may have different sizes. Various neural network operations, such as Softmax, can be performed on the matrix 705 to generate the matrix 707. The output matrix 709 for the layer is then generated by a multiplication of matrices 707 and 703*v*. FIG. 7B illustrates an embodiment of how the techniques disclosed herein can be applied to the matrix multiplications of FIG. 7A, such as multiplication 711 indicated by the arrow.

In FIG. 7A, the multiplication of Query, Keys and Value matrices involves values that change for each new computation. FIG. 7B illustrates the multiplication 711 of the Query matrix $\mathbf{703}_Q$ and Keys matrix $\mathbf{703}_K$. The Query values are broken down into the u vectors and Keys values broken down into v vectors. The example size of 128 is smaller than the number of NAND word line layers, so that it fits the u vector. As the multiplication identity 1 or other matrix M is only programmed into the NAND array once with either 1 or 0 values, so that there is essentially no wear on the array.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 8B:
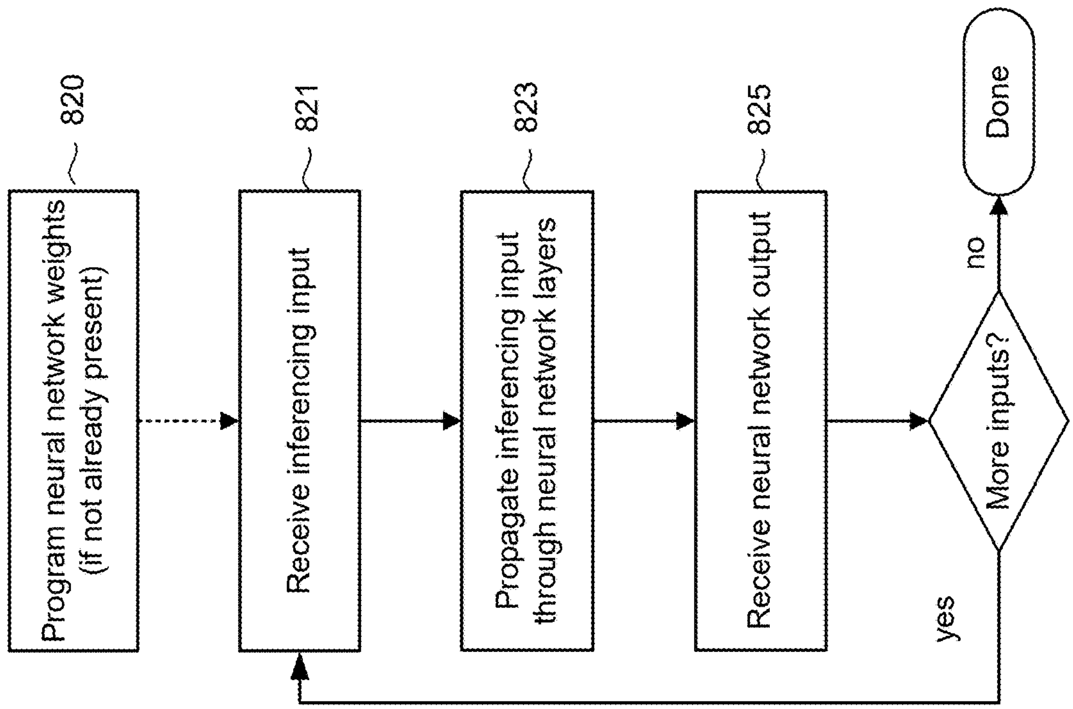
FIG. 8B is a flowchart describing one embodiment of a process for inference using a neural network.
Figure 8A:
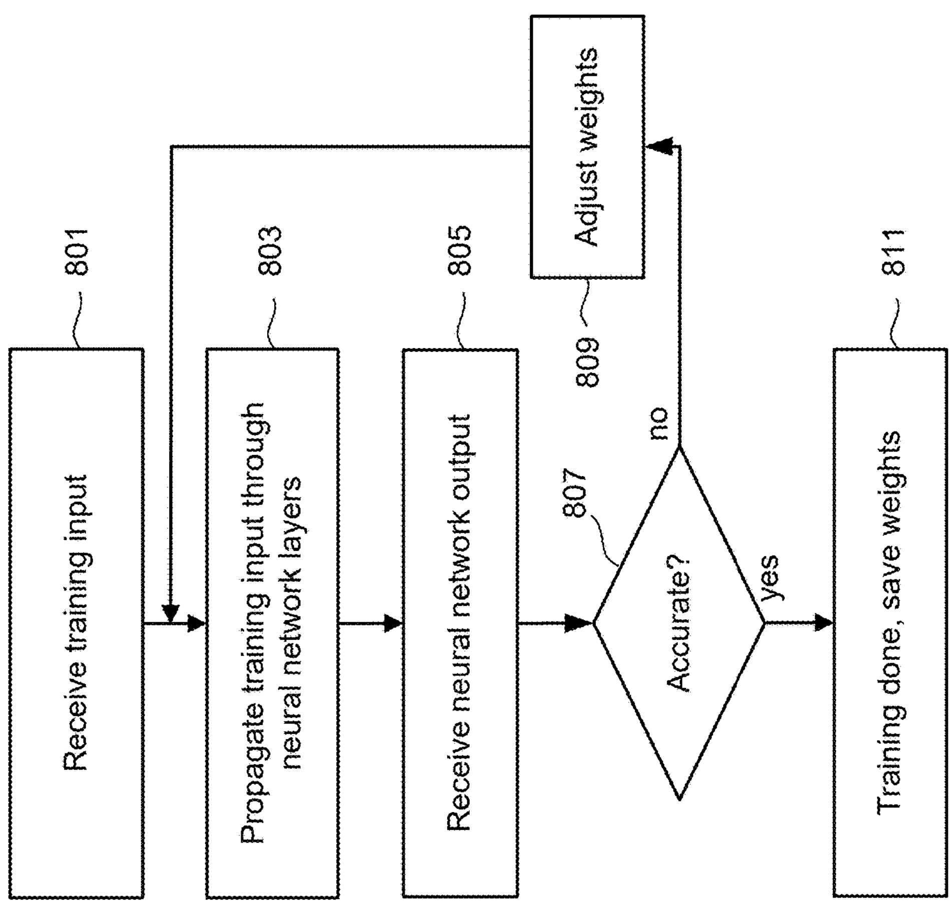
FIG. 8A is a flowchart describing one embodiment of a process for training a neural network to generate a set of weights.

FIG. 8A is a flowchart describing one embodiment of a process for training a neural network to generate a set of weights. The training process is often performed in the cloud, allowing additional or more powerful processing to be accessed. At step 801, the input, such as a set of images, is received (e.g., the image input in FIG. 6A). At step 803 the input is propagated through the layers connecting the input to the next layer (e.g., CON1 in FIG. 6A) using the current filter, or set of weights. The neural network's output is then received at the next layer (e.g., CON2 in FIG. 6A) in step 805, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 805. A user can then review the results at step 807 to select which probabilities the neural network should return and decide whether the current set of weights supply a sufficiently accurate labelling and, if so, the training is complete (step 811). If the result is not sufficiently accurate, the neural network adjusts the weights at step 809 based on the probabilities the user selected, followed by looping back to step 803 to run the input data again with the adjusted weights. Once the neural network's set of weights have been determined, they can be used to "inference," which is the process of using the determined weights to generate an output result from data input into the neural network. Once the weights are determined at step 811, they can then be stored in non-volatile memory for later use, where the storage of these weights in non-volatile memory is discussed in further detail below.

FIG. 8B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. For example, a considerable portion of the computations of the inference phase may be performed by embodiments of in-memory compute. For example, memory system 100 may perform in-memory compute to perform VMM. In an embodiment, NAND memory is used for the in-memory compute. Step 820 includes programming neural network weights (if not already present). In an embodiment the neural network weights are programmed into NAND (e.g., 3D NAND). In one embodiment, the host 102 provides the weights to the memory controller 120, which instructs the system control logic 260 to program the neural network weights into storage 130 (e.g., 3D NAND). Note that the inference phase may be performed many times with these neural network weights. Therefore, in many cases the neural network weights will already be programmed when the inference phase begins.

At step 821, the input is received, such as the image of a dog in the example used above. As an example, the host 102 may receive the input. At step 823, the input data is then propagated through the neural network's layers. Step 823 will be similar to step 803 of FIG. 8A, but now using the weights established at the end of the training process at step 811. Step 823 may include performing in-memory compute to perform, for example, VMM. In an embodiment, the in-memory compute is performed in NAND memory. The memory controller 120 may provide results of the in-memory compute to the host 102. In an embodiment, the host 102 controls the propagation of the data through the neural network's layers. The host 102 may provide input vectors to the memory controller 120, with the memory controller 120 instructing the storage 130 to perform VMM. After propagating the input through the intermediate layers, the output is then provided at step 825.

Figure 9:
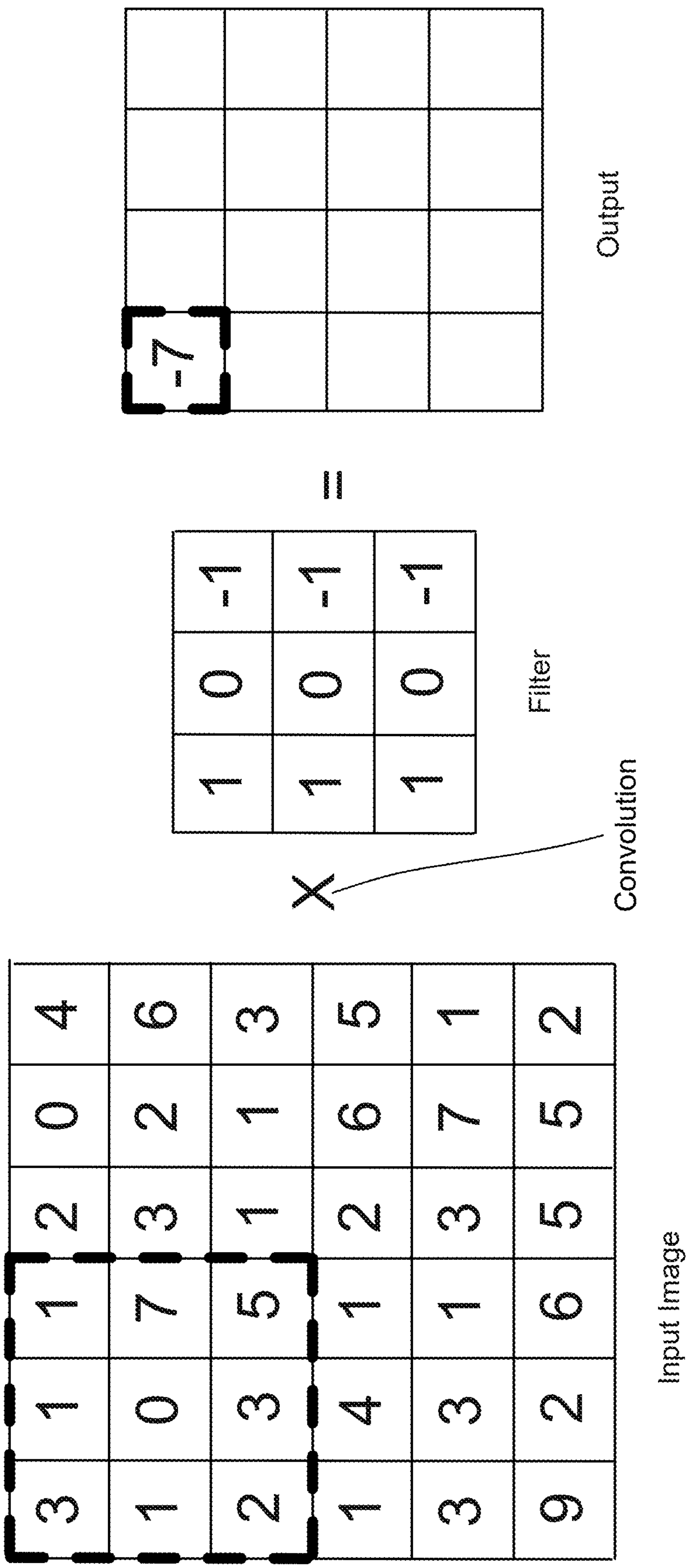
FIG. 9 is a schematic representation of a convolution operation in a convolutional neural network.

FIG. 9 is a schematic representation of a convolution operation between an input image and filter, or set of weights. In this example, the input image is a 6×6 array of pixel values and the filter is a 3×3 array of weights. The convolution operation is performed by a matrix multiplication of the 3×3 filter with 3×3 blocks of the input image. For example, the multiplication of the upper-left most 3×3 block of the image with the filter results in the top left value of the output matrix. The filter can then be slid across by one pixel on the image to generate the next entry of the output, and so on to generate a top row of 4 elements for the output. By repeating this by sliding the filter down a pixel at a time, the 4×4 output matrix is generated. Similar operations are performed for each of the layers. In a real CNN, the size of the data sets and the number of convolutions performed mean that extremely large numbers of such operations are performed involving very large amounts of data.

Figure 10:
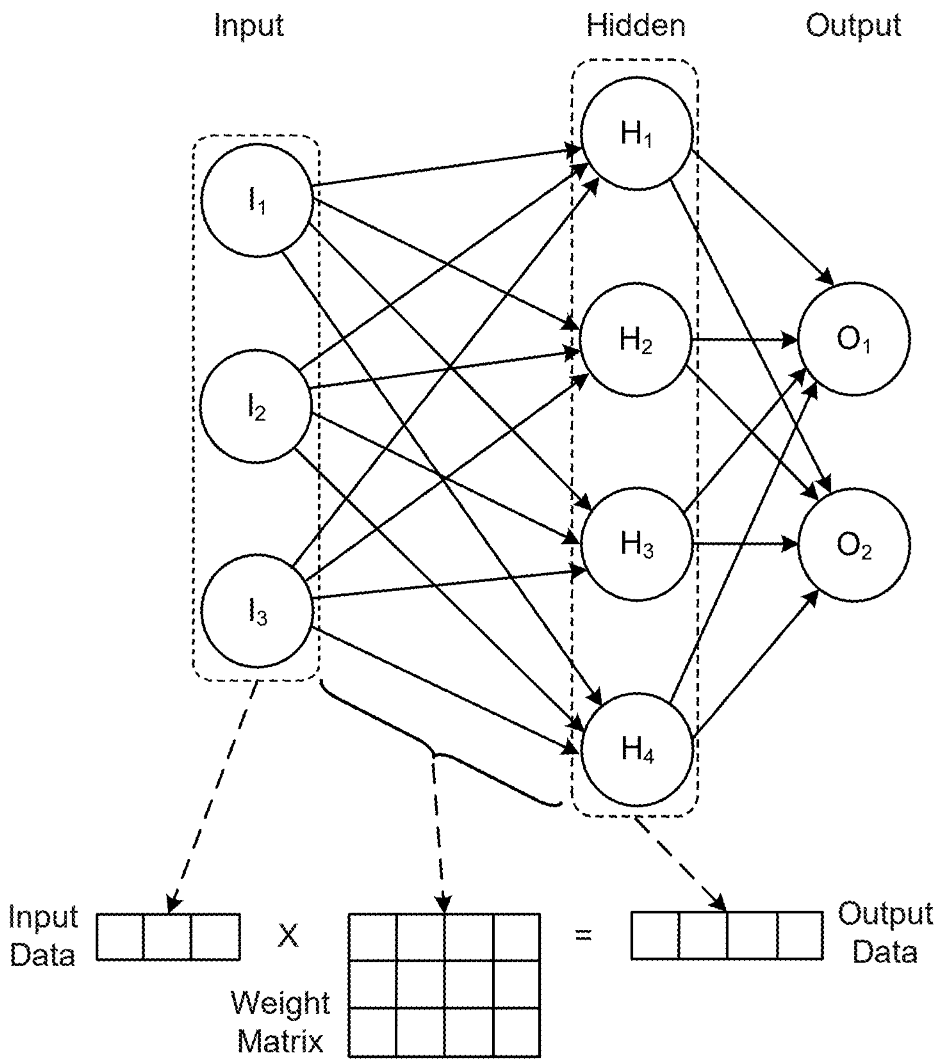
FIG. 10 is a schematic representation of the use of matrix multiplication in a fully connected layer of an artificial neural network.

FIG. 10 is a schematic representation of the use of matrix multiplication in a fully connected layer of a neural network. Matrix multiplication, or MatMul, is a commonly used approach in both the training and inference phases for neural networks and is used in kernel methods for machine learning. FIG. 10 at the top is similar to FIG. 6B, where only a single hidden layer is shown between the input layer and the output layer. The input data is represented as a vector of a length corresponding to the number of input nodes. The weights are represented in a weight matrix, where the number of columns corresponds to the number of intermediate nodes in the hidden layer and the number of rows corresponds to the number of input nodes. The output is determined by a matrix multiplication of the input vector and the weight matrix, where each element of the output vector is a dot product of the vector of the input data with a column of the weight matrix.

A common technique for executing the matrix multiplications is by use of a multiplier-accumulator (MAC, or MAC unit). However, this has a number of issues. Referring back to FIG. 8B, the inference phase loads (or programs) the neural network weights at step 820 before the matrix multiplications are performed by the propagation at step 823. However, as the amount of data involved can be extremely large, use of a multiplier-accumulator for inferencing has several issues related to the loading of weights. One of these issues is high energy dissipation due to having to use large MAC arrays with the required bit-width. Another issue is high energy dissipation due to the limited size of MAC arrays, resulting in high data movement between logic and memory and an energy dissipation that can be much higher than used in the logic computations themselves.

To help avoid these limitations, the use of a multiplier-accumulator array can be replaced with other memory technologies. For example, the matrix multiplication can be computed within a memory array by leveraging the characteristics of NAND memory and Storage Class Memory (SCM), such as those based on ReRAM, PCM, FeRAM or MRAM based memory cells. This allows for the neural network inputs to be provided via read commands and the neural weights to be preloaded for inferencing. By use of in-memory computing, this can remove the need for logic to perform the matrix multiplication in the MAC array and the need to move data between the memory and the MAC array.

Inferencing in deep neural networks (DNNs) requires large amount of memory and computations, where the computations are usually real number multiplication and accumulations (MACs). Deep neural networks (DNNs), including large language models such as the transformer models are largely linear algebra engines built out of vector-matrix multipliers. Traditional DNNs are inferred on GPU devices, where the large size of DNN models require the GPUs to have a large memories and transfer large amounts of data, with a corresponding high cost. The process-in-memory techniques disclosed herein enable the computations to be implemented using the memory array. Although presented here primarily in the context of a 3D NAND memory, in other embodiments the non-volatile memory can be implemented in other memory technologies, such as ReRAM, MRAM, or PCM. A memory array will have a dynamic range (i.e., the max/min voltage/current it can represent) based on its design and the memory technology used, where a larger dynamic range has better precision and more tolerance to noise.

Figure 11:
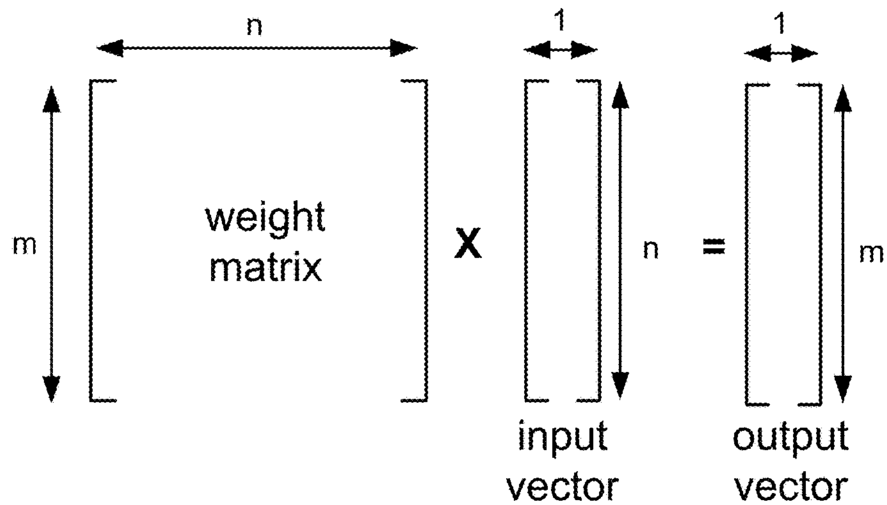
FIGS. 11 and 12 schematically illustrate vector-matrix multiplications, which are a basic computation unit of a deep neural network (DNN).
Figure 12:
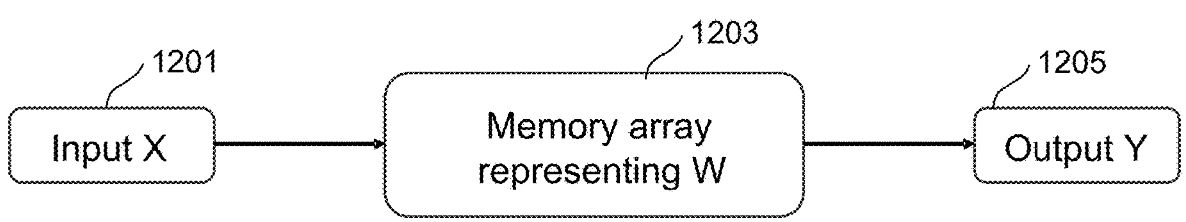

FIGS. 11 and 12 schematically illustrate vector-matrix multiplications, which are a basic computation unit of a DNN, and its implementation using a non-volatile memory array. More specifically, FIG. 11 illustrates the basic idea of a vector-matrix multiplication (VMM). The weight matrix is multiplied by an input vector to generate an output vector. If the input vector X is of size n×1 with components $x_i$, where i runs from 1 to n, and the weight matrix W is of size m×n with components $$W_j^i,$$

where j runs from 1 to m, then the output vector Y is of size m×1 with components given by $$y_j = \Sigma_i W_j^i x_i.$$

When implemented through an in-memory computation as illustrated in FIG. 12, the input X 1201 is applied to a set of weights W 1203 to programmed into a memory array to generate an output vector Y 1205. In an analog implementation, input vector X and output vector Y will be analog valued, with the weight values programmed as either analog values or multi-bit digital values. For example, in NAND memory devices multi-bit programming techniques are better developed so that weights might be written in a 6- or 8-bit per cell format, for example.

Figure 13:
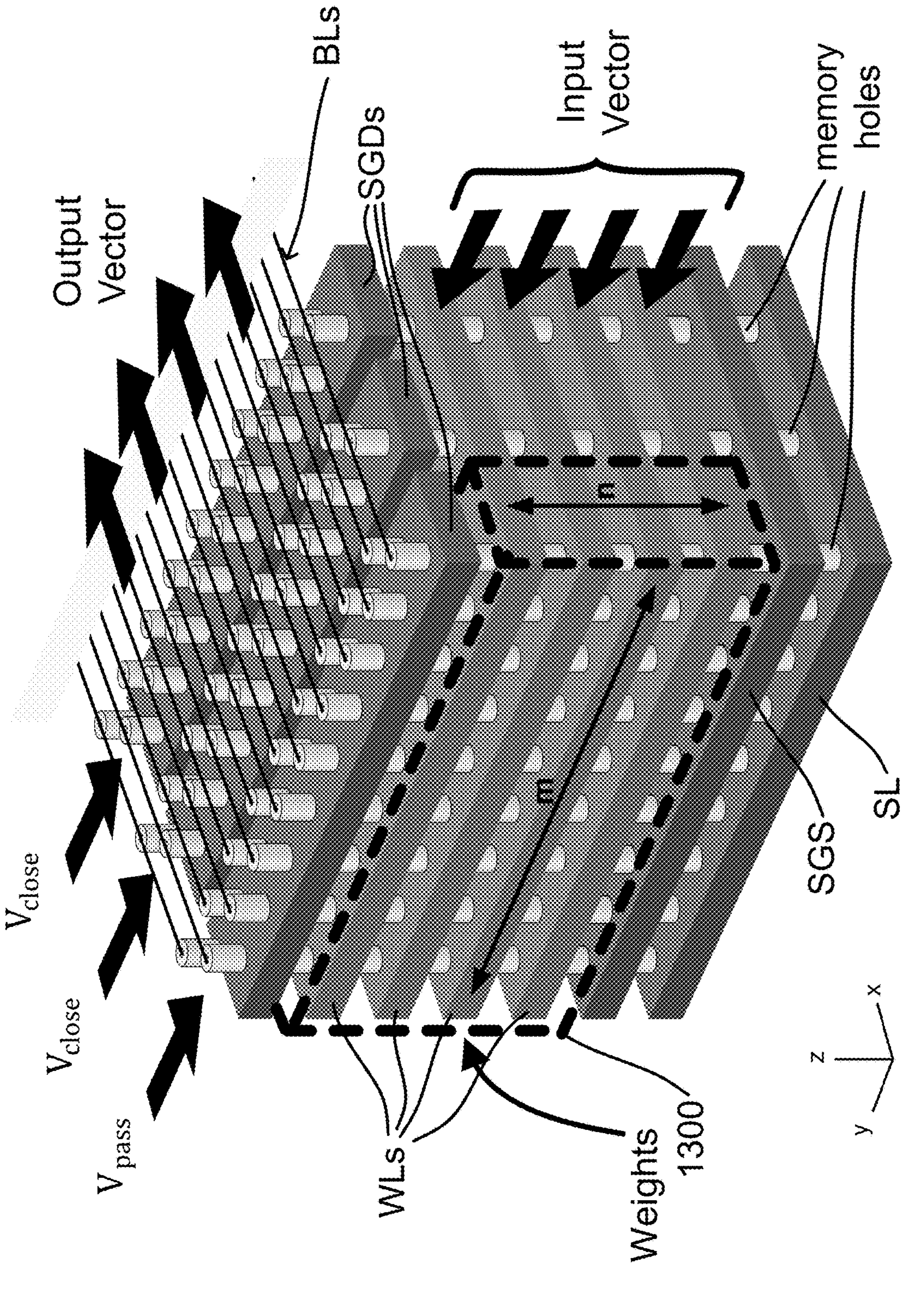
FIG. 13 illustrates an embodiment for the multiplication of a vector and a matrix using a 3D NAND structure in which the input vector is applied to the word lines.

FIG. 13 illustrates an embodiment for the multiplication of a vector and a matrix using a 3D NAND structure in which the input vector is applied to the word lines. FIG. 13 shows an abbreviated version of the 3D NAND structure presented above with respect to FIGS. 4-4F, showing four word lines WLs between a lower source side select gate SGS and three drain side select gates SGDs. At the bottom of the 3D NAND structure is a source line (SL). Each SGD may be used to select one sub-block with each sub-block containing a large number of NAND strings. There may be more or fewer than three SGDs per block. For example, FIGS. 4C and 4F depict an example with four SGDs per block. The portion of the 3D NAND structure shown in FIG. 13 may reside within one block. The memory holes run vertically through the horizontal layers and are each connected to a corresponding bit line BL through drain side select gates (SGD). To select a sub-block 1300, the corresponding drain side select gate SGD is biased at $V_{pass}$ to turn these gates on, while for the other, non-selected blocks, the SGDs are biased at the off voltage of $V_{close}$. Note that each bit line connects to one memory hole (NAND string) in each sub-block.

To realize the multiplication of a vector and a matrix (e.g., a set of weights for a neural network), the matrix values (e.g., weights) are programmed into memory cells of a NAND memory, such as sub-block 1300. Programming a weight into a NAND memory cell means that the memory cell is programmed to a target Vt that represents the weight. An embodiment of the memory system 100 converts the weights to Vts. The memory system 100 may store a table that maps from the weights to the Vts. Alternatively, the memory system 100 may perform a calculation to map from the weights to the Vts. FIG. 13 shows how the memory cells in sub-block 1300 may be programmed to represent an m×n matrix. With some techniques one entry in the weight matrix is represented in a group of two or more cells. In one technique the one entry in the weight matrix is represented by two cells on a first NAND string and two cells on a second NAND string. Thus, the m and n in FIG. 13 refer to the entries in the weight matrix, which is not necessarily the same as the number of cells that are programmed to represent the weight matrix. As one example, n may be about 100 and m may be about 64K. FIG. 13 shows a simplified example with only four cells on each NAND string, but typically there will be many more memory cells on each NAND string. For example, 3D NAND memory can be fabricated to have more than 100 NAND memory cells on a NAND string. It is not required that all memory cells on the NAND string be used to store the weights. FIG. 13 shows 18 NAND strings in the depicted portion of sub-block 1300; however, 3D NAND memory can be fabricated with thousands of NAND strings in a sub-block. As an example, m may be 64K. In one implementation, m NAND strings may be used for the m dimension. In one implementation, 2*m NAND strings may be used for the m dimension. 3D NAND memory can be fabricated to have at least 128K NAND strings in a sub-block. The weights, or other matrix entries, are static and are changed rarely (if at all) in order not to compromise endurance of the NAND memory. The drain side select gate for the selected sub-block (1300 in this example) receives the select gate on voltage $V_{pass}$, while the drain side select gates for unselected blocks are biased at select gate off, or non-select voltage, $V_{close}$. The input vector, which is dynamic and can change for every new operation, is applied on the word lines of the block. In an embodiment, the memory system 100 converts the values in the input vector to voltages to apply to the word lines. The output vector, corresponding to the product of the input vector and the stored matrix, is then determined based on the signals (e.g., current) on the bit lines. In one technique the difference in current between two bit lines is used to determine a dot product of the input vector and a column of the weight matrix.

Figure 14:
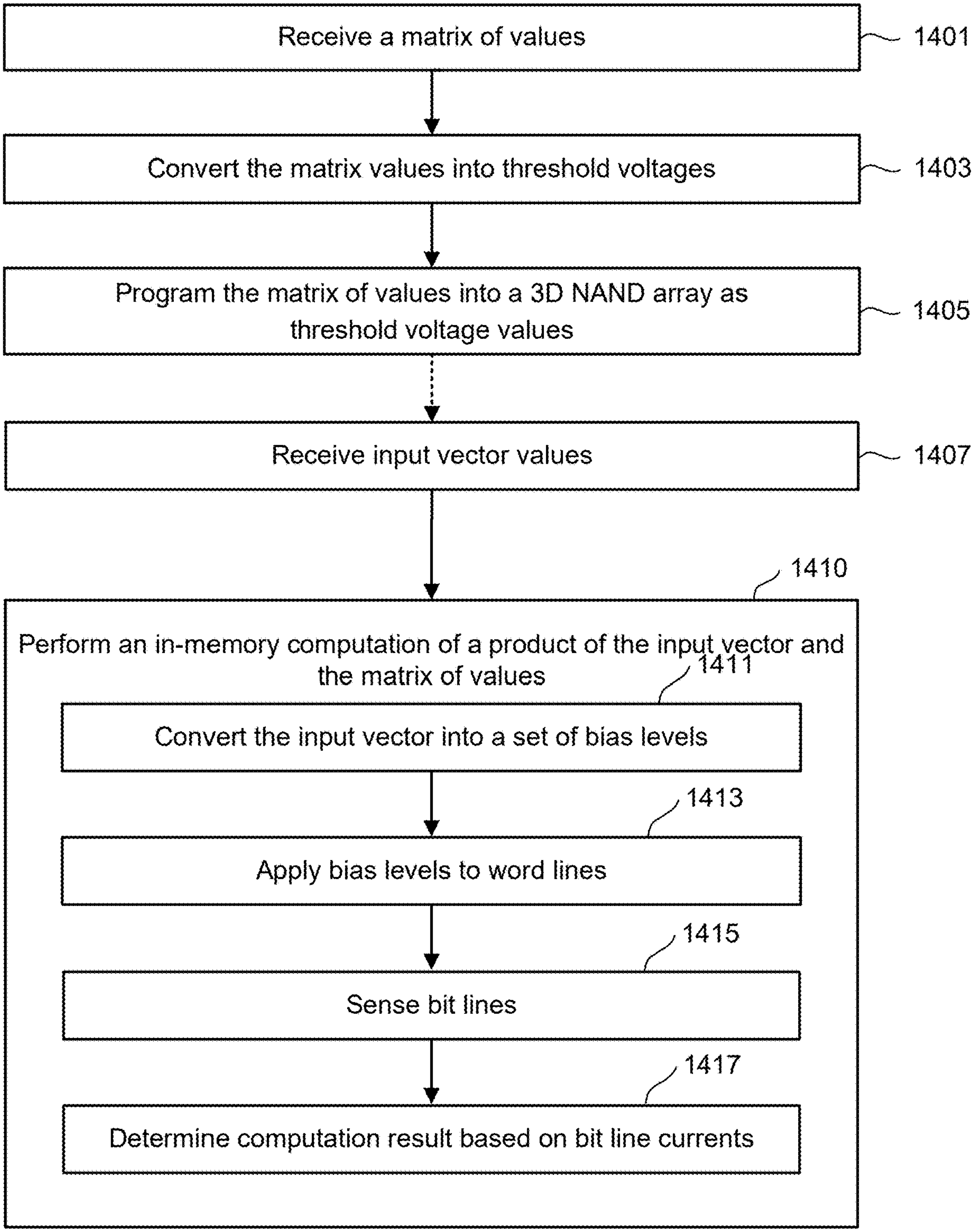
FIG. 14 is a flowchart for an embodiment of operating a 3D NAND multiply and accumulate engine.

FIG. 14 is a flowchart for an embodiment of operating a 3D NAND multiply and accumulate engine. The process may be performed by a combination of memory controller 120 and/or control circuitry (e.g., system control logic 260, column control circuitry 210, row control circuitry 220) of memory die 200 or control die 211. Beginning at step 1401, a matrix of values is received. The matrix is received, for example, at the memory controller 120 from the host 102. At step 1403, the matrix values are converted to threshold voltages (Vt) for NAND memory cells. An embodiment of the memory controller 120 converts the weights to Vts. The memory system 100 may store a table that maps from the weights to the Vts. Alternatively, the memory controller 120 may perform a calculation to map from the weights to the Vts. In one embodiment, the system control logic 260 converts the weights to Vts. At step 1405 the matrix of values are programmed into the 3D memory array as threshold voltage values. The programming may be performed by the control circuitry of memory die 200 or control die 211 in response to an instruction from the memory controller 120. Thus, the memory die control circuitry can then program the matrix into the memory array 202 in step 1405. In some embodiments, the matrix can be pre-programed into the memory array before the memory device shipped to the user.

At step 1407 input vectors are received. In an embodiment, the memory controller 120 receives the input vectors from the host 102. The in-memory multiplication (e.g., VMM) is then performed for an input vector and the matrix of values at step 1410. In step 1411 the input vector (x) is converted into a set of bias levels. In one embodiment, the memory controller 120 converts the input vector to bias levels. In one embodiment, the system control logic 260 and/or row decoder 222 converts the input vector values into a corresponding set of bias levels. At step 1413 the bias levels are applied by the array drivers 224 to the word lines. Also in step 1413, a voltage is applied to the SGD of the selected sub-block to turn on this "selected SGD" and a voltage is applied to the SGDs of the unselected sub-block to turn off the "unselected SGDs". Thus, the NAND channels in the selected sub-block are connected to the bit lines, whereas the NAND channels in the unselected sub-block are cut off from the bit lines Furthermore, the source line may be grounded and a bit line sensing voltage is applied to the bit lines. Additionally, the SGS in the selected block has a voltage applied thereto to turn on this SGS to connect the NAND channels to the source line. At step 1415 the bit line currents are sensed. At step 1417 a computation result is determined based on the bit line currents.

In the case of Vector-Matrix Multipliers (VMMs), such as when a matrix of values (e.g., weight of a neural network) are programmed into the memory cells of a memory array, the weights can be programmed as analog or multi-bit (e.g., 6- or 8-bit) values. The inputs are then applied as analog voltage level vertical input vectors on word lines (as in FIG. 13).

Figure 15A:
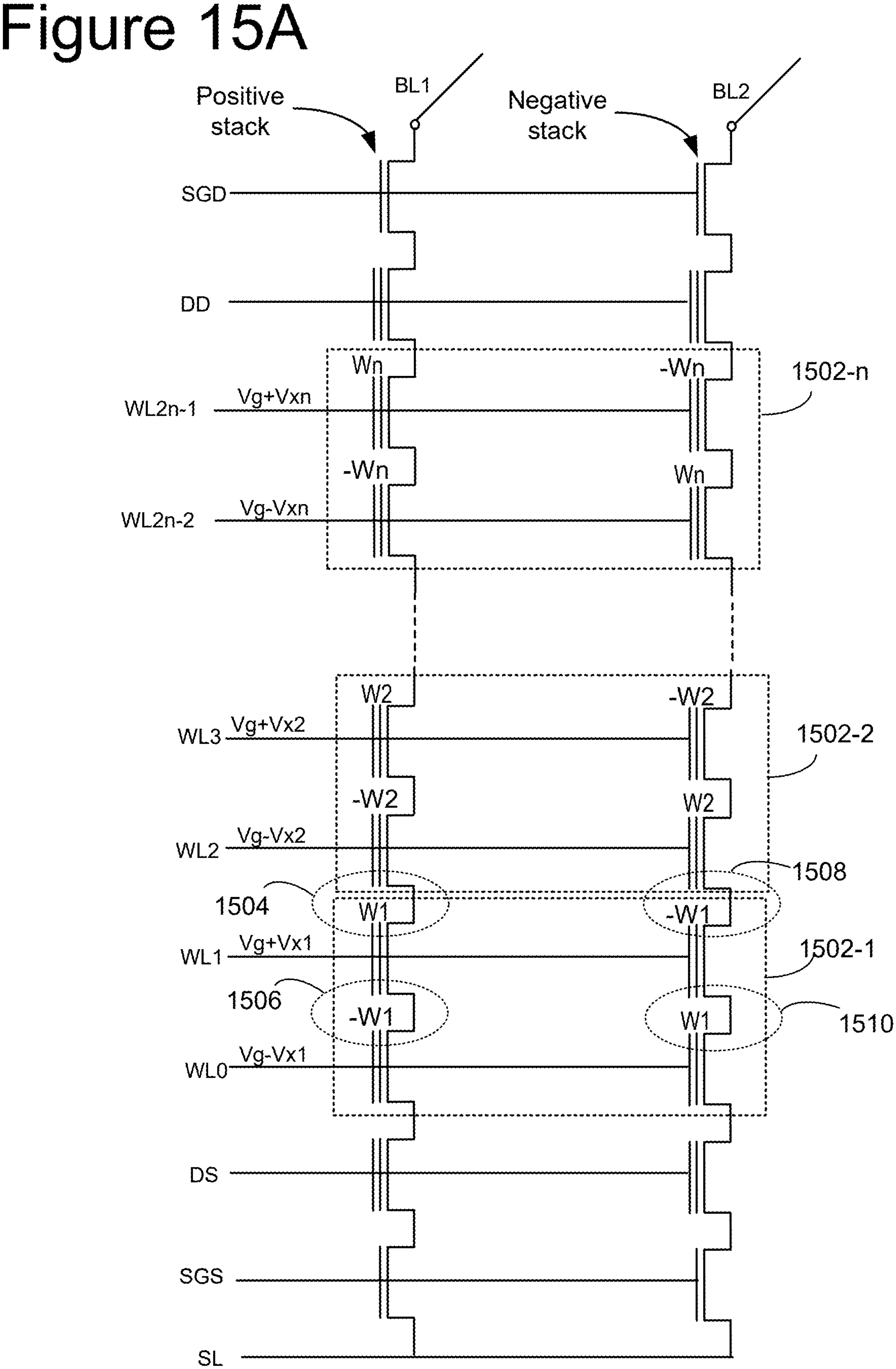
FIG. 15A depicts an example of how memory cells on two NAND strings may be used to store weights in calculation cell units.

FIG. 15A depicts an example of how memory cells on two NAND strings may be used to store weights in units referred to herein as "calculation cell units." One NAND string will be referred to as the "positive stack" and the other NAND string will be referred to as the "negative stack." Each calculation cell unit 1502 has two memory cells on the positive stack and two memory cells on the negative stack. FIG. 15A shows an example in which a weight vector is programmed into the memory cells. That is, the weights of one column of the weight matrix are programmed into the two NAND strings. Other pairs of NAND strings will be used to program the weights of other columns of the weight matrix. The memory cells in calculation cell unit 1502-1 are programmed with Vts to represent W1. The weight is labeled as either W1 or −W1, where W is a positive value and −W is a negative value having the same absolute value as W. Specifically, NAND cell 1504 is programmed with a Vt to represent W1, NAND cell 1506 is programmed with a Vt to represent −W1, NAND cell 1508 is programmed with a Vt to represent W1, and NAND cell 1510 is programmed with a Vt to represent −W1. Calculation cell unit 1502-2 is programmed in a similar manner to represent W2 and calculation cell unit 1502-*n* is programmed in a similar manner to represent Wn. Calculation cell units 1502 for W3 to Wn−1 are not depicted in FIG. 15A.

FIG. 15A also shows voltages that are applied to the word lines (and hence control gates of NAND memory cells) to represent the input vector X. The word line voltages are each an offset to a base gate voltage Vg. There is a positive offset for one word line connected to a particular calculation cell unit 1502 and a negative offset for the other word line connected to the particular calculation cell unit 1502. For example, Vg−x1 is applied to WL0 and Vg+1 is applied to WL1. Similarly, Vg−x2 is applied to WL2 and Vg+x2 is applied to WL3. Also, Vg−xn is applied to WL2$n$−2 and Vg+x2 is applied to WL2$n$−1.

Each calculation cell unit 1502 may be used to calculate $w_i \times x_i$. For example, calculation cell unit 1502-1 may be used to calculate $w_1 \times x_1$, calculation cell unit 1502-2 may be used to calculate $w_2 \times x_2$ . . . and calculation cell unit 1502-*n* may be used to calculate $w_n \times x_n$. Moreover, collectively the calculation cell units 1502-1 . . . 1502-*n* may be used for a multiply and accumulate to calculate the product of the input vector and the weight vector. Two resistances may be expressed for each calculation cell unit 1502. Resistance "$R^+$" refers to the positive stack portion of the calculation cell unit 1502 (see Eq. 1). Resistance "$R^-$" refers to the negative stack portion of the calculation cell unit 1502 (se Eq. 2).

$$R^+ = h(V_g + V_x + V_w) + h(V_g - V_x - V_w) \quad \text{Eq. 1}$$

$$R^- = h(V_g + V_x - V_w) + h(V_g - V_x + V_w) \quad \text{Eq. 2}$$

In Equations 1 and 2, Vg is a base gate voltage and Vx is an offset that is added or subtracted from the base gate voltage. Also, Vw is the threshold voltage that is used to represent the weight. The $R^+$ resistance of each memory cell in the positive stack is in series and the $R^-$ resistance of each memory cell in the negative stack is in series. Therefore, the series resistances may be used in a MAC. In practice, the current in each bit in may be analyzed instead of a direct resistance measurement. Equation 3 shows an expression for the multiplication performed by one calculation unit.

$$x \times w = \frac{f(ax, bw)}{a \times b \times c} \quad \text{Eq. 3}$$

The numerator in Equation 3 may be expressed as the difference between the current ($I^+$) in the positive stack and the current ($I^-$) in the negative stack (see Eq. 4).

$$f(ax, bw) = I^{+}(ax, bw) - I^{-}(ax, bw) \quad \text{Eq. 4}$$

The "a" represents a scale factor or function for the translation from the values in the input vector X and the voltages Vx1, Vx2, . . . Vxn, as shown in Equation 5.

$$Vx = ax \quad \text{Eq. 5}$$

The "b" represents a scale factor or function for the translation from the values in the weight vector to the threshold voltages (Vw) to which the memory cells are programmed (in order to program the weights into the memory cells), as shown in Equation 6.

$$Vw = bw \quad \text{Eq. 6}$$

A scale factor or function c may be used to convert from the current to the resistance. However, another technique is to use a function g(f(ax,bw)) instead of the scale factor c.

Figure 15B:
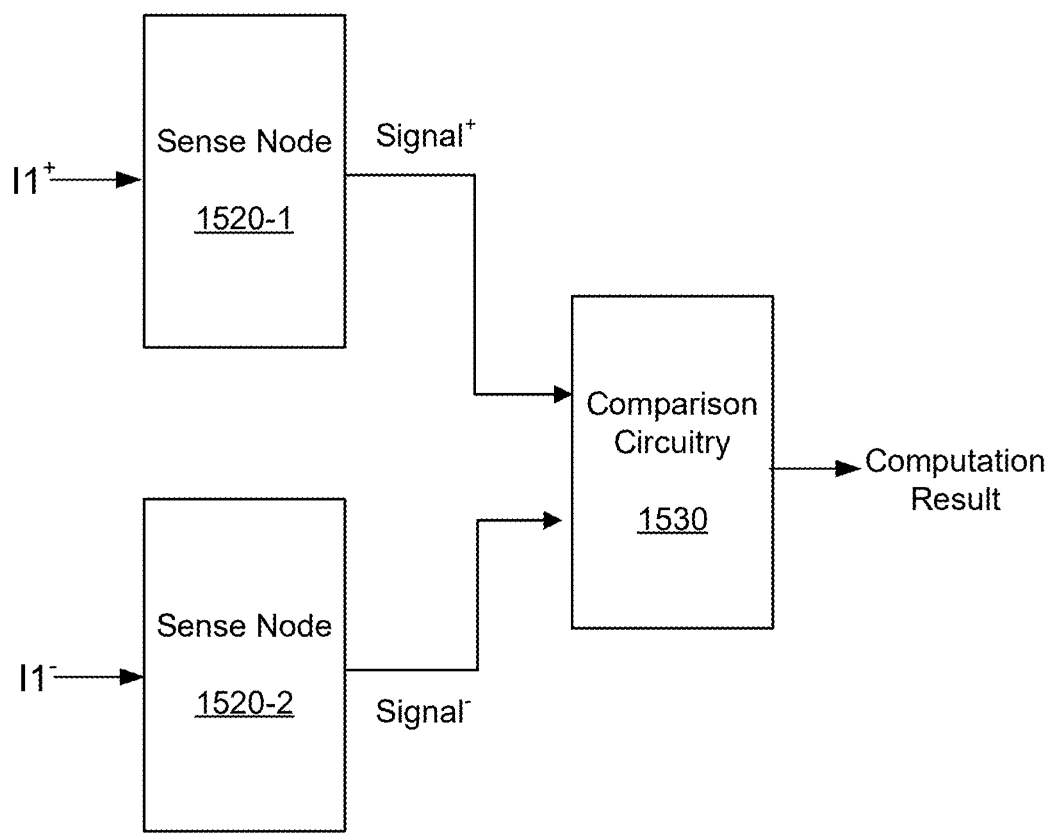
FIG. 15B is a block level diagram showing components for comparing the currents from the bit lines in FIG. 15A.

FIG. 15B is a block level diagram showing components for comparing the currents from the bit lines in FIG. 15A. Sense node 1520-1 receives current $I^{+}$ from BL1. Sense node 1520-2 receives current $I^{-}$ from BL2. Sense node 1520-1 may have a first sense capacitor and sense node 1520-2 may have a second sense capacitor. Each sense capacitor may be pre-charged to a target voltage prior to discharging the sense capacitor with the currents. An output of the first sense node 1520-1 is Signal$^{+}$. An output of the second sense node 1520-1 is Signal$^{-}$. These signals may be the respective voltages on the sense capacitors. Therefore, these signals may change as the sense node is discharged by the bit line current (or alternatively charged with the bit line current). The positive signal$^{+}$ and the negative signal$^{-}$ are input to the comparison circuitry 1530, which outputs a computation result. The computation result may be a MAC (e.g., inner product of a weight vector and an input vector). Note that other techniques may be used to determine a computation results based on the difference between the two currents in FIG. 15A.

One technical challenge when performing MAC in NAND is the precision needed in the gate-to-source voltage of the memory cell transistors. The drain to source current ($I_{DS}$) depends on the gate-to-source voltage ($V_{GS}$) of the memory cell transistor (as well as other factors). In-memory compute may sense the drain-to-source current of NAND MOSFET memory cell transistors. In some embodiments, the NAND memory cell transistors are NMOS transistors that may be operated in the linear (triode) region for in-memory compute. The drain-to-source current ($I_{DS}$) of an NMOS MOSFET NAND memory cell transistor operated in the linear (triode) region may be expressed as in Equation 7.

$$I_{DS} = \frac{W}{L}\mu_n C_{ox}\left[(V_{GS} - V_t)V_{DS} - \frac{1}{2}V_{DS}^2\right] \quad \text{Eq. 7}$$

The $I_{SD}$ for a PMOS transistor is similar, wherein the current of a PMOS transistor will also depend on the difference between the gate voltage and the source voltage. In an embodiment, the memory cell transistors are NMOS transistors; therefore, examples of NMOS transistors will be discussed. However, the Vgs ladder techniques disclosed herein are not limited to NMOS technology. During an embodiment of in-memory compute the bit lines are at a higher voltage than the source line. Therefore, the end of the NAND strings connected to the bit lines may be referred to as the drain end of the NAND strings and the end of the NAND strings connected to the source line may be referred to as the source ends. Therefore, for this mode of operation the terminal of the NAND memory cell transistor closest to the bit line may be referred to as the drain terminal and the terminal of the NAND memory cell transistor closest to the source line may be referred to as the source terminal. During in-memory computations the source terminal voltages of the respective NAND memory cell transistors on a NAND string may thus be different from each other. Although these differences can be relatively small, these differences can impact accuracy of the MAC.

Figure 16:
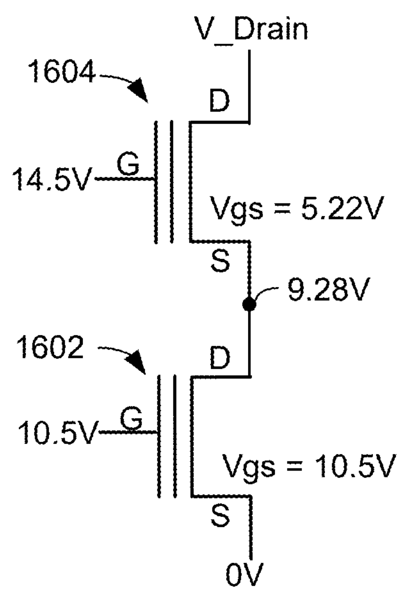
FIG. 16 shows an example of two memory cells in series to illustrate how differences in source terminal voltages can impact accuracy of MAC operations.

FIG. 16 shows an example of two NAND memory cell transistors in series to illustrate how differences in source terminal voltages can impact accuracy of the MAC (e.g., VMM). Two NAND memory cell transistors 1602, 1604 are depicted. These are two of the many NAND memory cell transistors on a NAND string. The source (S), drain (D) and gate (G) terminals for each transistor are labeled. For the sake of example, the target $V_{GS}$ for lower NAND memory cell transistor 1602 is 10.5V and the target $V_{GS}$ for upper NAND memory cell transistor 1604 is 14.5V. In an embodiment, the target $V_{GS}$ corresponds to a value of the input vector X that is to be multiplied by the weight represented by the Vt of the NAND memory cell transistor. In this example, the target $V_{GS}$ of 10.5V is applied to the gate of lower NAND memory cell transistor 1602 and the target $V_{GS}$ of 14.5V is applied to the gate of upper NAND memory cell transistor 1604. Lower NAND memory cell transistor 1602 has 0V at its source (S) terminal thereby resulting in a $V_{GS}$ of 10.5V. Upper NAND memory cell transistor 1604 has 9.28V at its source (S) terminal thereby resulting in a $V_{GS}$ of 5.22V. Therefore, the actual $V_{GS}$ for upper NAND memory cell transistor 1604 is less than the target $V_{GS}$. This example has a relatively large difference (9.28V) between the target $V_{GS}$ and the actual $V_{GS}$ for upper NAND memory cell transistor 1604. However, even much smaller differences between the target $V_{GS}$ and the actual $V_{GS}$ can negatively impact the accuracy of VMM.

Figure 17:
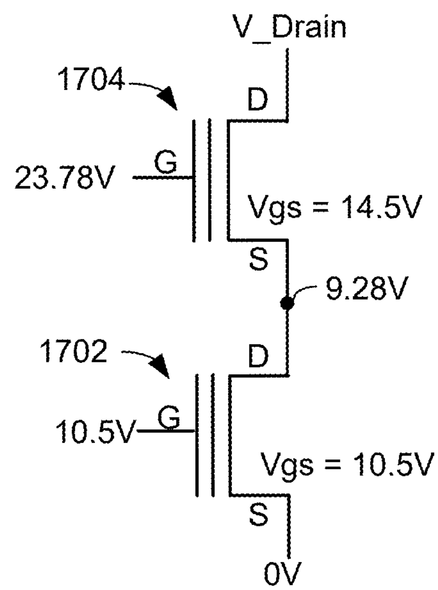
FIG. 17 shows an example of two memory cells in series to illustrate how a $V_{GS}$ ladder may be used to improve accuracy of MAC operations.

An embodiment includes a $V_{GS}$ ladder in which the expected (or estimated) voltage at the source terminal of a particular NAND memory cell transistor is factored into the determination of the voltage to apply to the gate. In an embodiment, an estimate is made of what voltage will be at the source terminal of each NAND memory cell transistor during in-memory compute. The voltage to apply to the gate of the NAND memory cell transistor may then be determined by adding the estimated source terminal voltage to the target $V_{GS}$. FIG. 17 shows an example of two NAND memory cell transistors in series to illustrate how a $V_{GS}$ ladder may be used to improve accuracy of MAC (e.g., VMM). Two NAND memory cell transistors 1702, 1704 are depicted. These are two of the many NAND memory cell transistors on a NAND string. The source (S), drain (D) and gate (G) terminals for each transistor are labeled. For the sake of example, the target $V_{GS}$ for lower NAND memory cell transistor 1702 is 10.5V and the target $V_{GS}$ for upper NAND memory cell transistor 1704 is 14.5V. In an embodiment, the target $V_{GS}$ corresponds to a value of the input vector X that is to be multiplied by the weight represented by the Vt of the NAND memory cell transistor. In this example, the target $V_{GS}$ of 10.5V is applied to the gate of lower NAND memory cell transistor 1702. However, rather than applying the target $V_{GS}$ of 14.5V to the gate of upper NAND memory cell transistor 1704 a voltage 23.78V is applied to the gate of upper NAND memory cell transistor 1704. Lower NAND memory cell transistor 1702 has 0V at its source (S) terminal thereby resulting in a $V_{GS}$ of 10.5V. Upper NAND memory cell transistor 1704 has 9.28V at its source (S) terminal thereby resulting in a $V_{GS}$ of 14.5V. Therefore, the actual $V_{GS}$ for upper NAND memory cell transistor 1704 equal to the target $V_{GS}$.

Figure 18A:
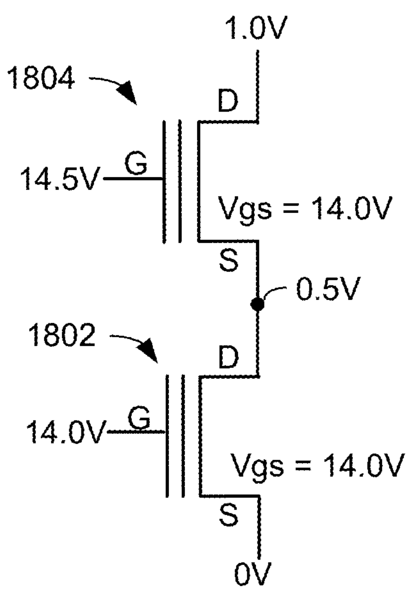
FIG. 18A shows an example how to estimate source terminal voltages for an embodiment a $V_{GS}$ ladder to improve accuracy of MAC operations.

FIG. 18A shows an example how to estimate source terminal voltages for an embodiment of a $V_{GS}$ ladder to improve accuracy of MAC (e.g., VMM). Two NAND memory cell transistors 1802, 1804 are depicted. In this embodiment, the same $V_{DS}$ is assumed for each NAND memory cell transistor in the NAND string. In this simplified example, 1.0V is at the drain (D) of upper NAND memory cell transistor 1804 and 0V is at the source (S) of lower NAND memory cell transistor 1802. Therefore, the $V_{DS}$ of each memory cell transistor is estimated at 0.5V. As such the source voltage of upper NAND memory cell transistor 1804 is 0.5V. Assuming a target $V_{GS}$ of 14.0V for upper NAND memory cell transistor 1804, the gate voltage is 14.5V thereby resulting in the actual $V_{GS}$ being equal to the target $V_{GS}$ of 14.0V. The same principle may be applied to a larger number of NAND memory cell transistors. A NAND string will also have some MOSFET transistors, such as the select transistors on each end of the NAND string, which are not memory cell transistors. One option is to divide the difference between the bit line voltage and the source line voltage evenly across all MOSFET transistors on the NAND string.

Figure 18B:
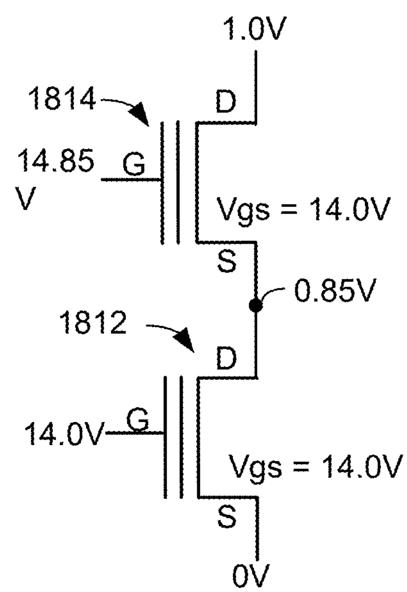
FIG. 18B shows an example in which an estimate of source terminal voltages does not assume the same $V_{DS}$ is for each memory cell transistor in the NAND string.

However, it is not required that it be assumed that the estimated $V_{DS}$ be the same for each NAND memory cell transistor. In one embodiment, a simulation is performed with typical conditions during in-memory computing using a NAND string. As an example the simulation is for a median Vt for each memory cell transistor on the NAND string, the normal bit line voltage, the normal source line voltage, and median gate voltages. As an example median Vt can be the Vt when the weight is 0. As an example median gate voltage may be the base Vg (see Vg in FIG. 15A). The source terminal voltage of each NAND memory cell transistor is then obtained from the simulation results. FIG. 18B shows an example in which an estimate of source terminal voltages does not assume the same $V_{DS}$ is for each memory cell transistor on the NAND string. The example in FIG. 18B is consistent with the aforementioned simulation technique, although the source terminal voltages may be estimated by a technique other than a simulation. Two NAND memory cell transistors 1812, 1814 are depicted. In this embodiment, the same $V_{DS}$ is not assumed for each memory cell transistor in the NAND string. In this simplified example, 1.0V is at the drain (D) of upper NAND memory cell transistor 1814 and 0.85V is at the source (S) of upper NAND memory cell transistor 1814 for a $V_{DS}$ of 0.15V. Furthermore, 0.85V is at the drain (D) of lower NAND memory cell transistor 1812 and 0V is at the source (S) of lower NAND memory cell transistor 1812 for a $V_{DS}$ of 0.85V. Assuming a target $V_{GS}$ of 14.0V for upper NAND memory cell transistor 1814, the gate voltage is 14.85V thereby resulting in the actual $V_{GS}$ being equal to the target $V_{GS}$ of 14.0V. The same principle may be applied to a larger number of memory cell transistors on the NAND string. Although FIGS. 17, 18A, and 18B depict NMOS transistors, these principles may also be applied to PMOS transistors.

Figure 19:
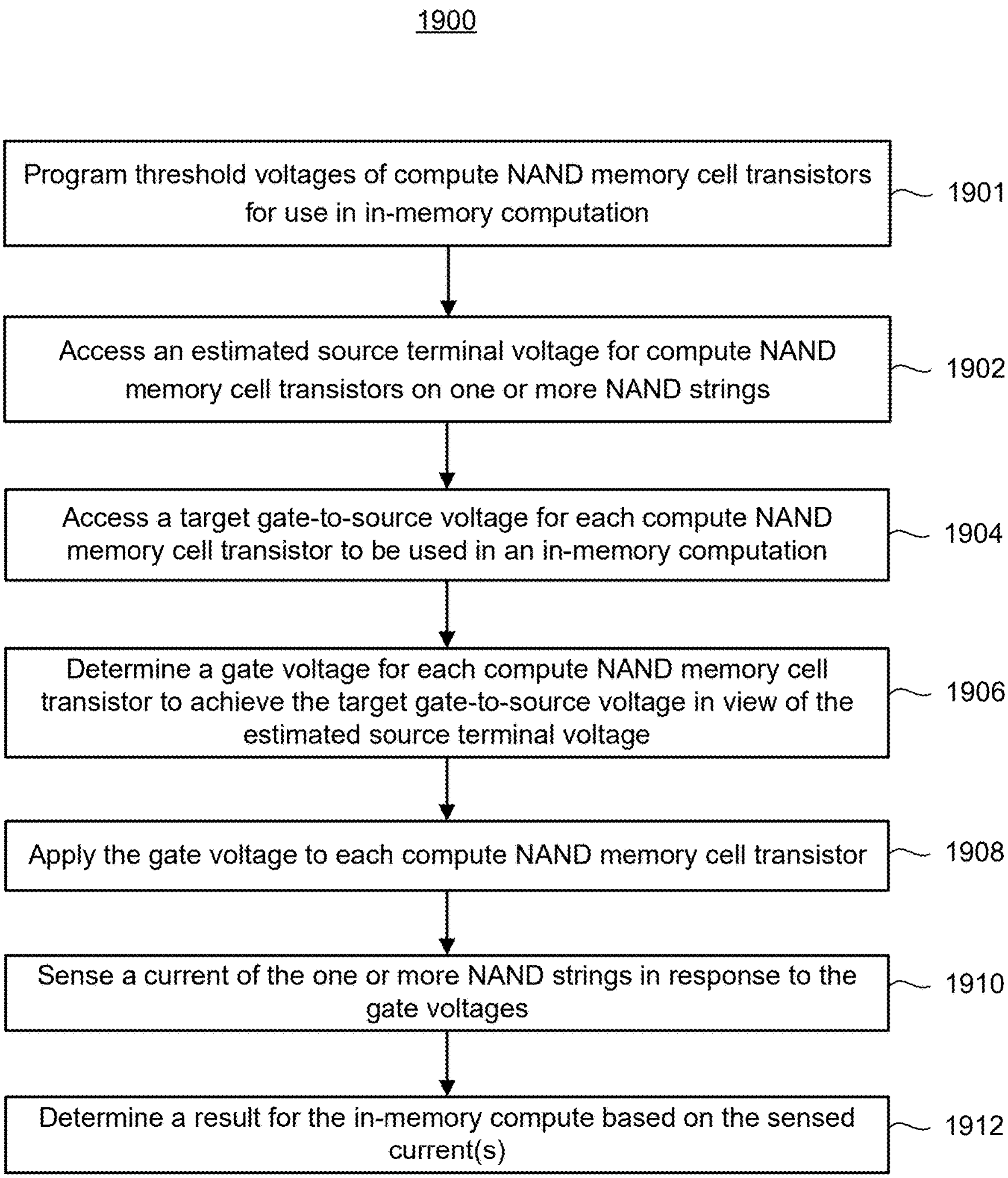
FIG. 19 is a flowchart of one embodiment of a process of in-memory compute using a $V_{GS}$ ladder technique.

FIG. 19 is a flowchart of one embodiment of a process 1900 of in-memory compute having a $V_{GS}$ ladder technique. In an embodiment, process 1900 is performed during an inferencing phase of an artificial neural network. The process 1900 may be performed by a combination of memory controller 120 and/or control circuitry (e.g., system control logic 260, column control circuitry 210, row control circuitry 220) of memory die 200 or control die 211. Step 1901 includes programming NAND memory cell transistors for use in in-memory computation. As one example, at least some of the memory cells on the one or more NAND strings may have their Vts programmed to represent values in a weight matrix. The weight matrix includes a number of columns, which are referred to as weight vectors. The process 1900 may be used for a technique in which a weight vector is stored in a pair of NAND strings such as the example in FIG. 15A. However, the process 1900 may be also used for a technique in which the weight vector is stored in a single NAND string. The NAND memory cell transistors that are used in the in-memory compute are referred to herein as "compute NAND memory cell transistors."

Step 1902 includes accessing an estimated source terminal voltage for the compute NAND memory cell transistors on one or more NAND strings. The estimate includes those compute NAND memory cell transistors that will be used for an in-memory compute and need not include all of the NAND memory cell transistors on the one or more NAND strings. However, the other NAND memory cell transistors not used in the computation may impact the source terminal voltage of those compute NAND memory cell transistors used in the computation. Also, select transistors (e.g., SGD, SGS) may also impact the source terminal voltage of the compute NAND memory cell transistors. The estimate may be based in part on a string voltage that is applied across the NAND strings during the in-memory computation. A portion of this string voltage may be allocated to each compute NAND memory cell transistor (as an estimated $V_{DS}$). Note that some of the string voltage may be allocated to transistors on the NAND string that are not compute NAND memory cell transistors (e.g., SGD, SGD, memory cells not programmed with a weight). In one embodiment, the memory system 100 allocates an equal portion of the string voltage from drain to source of each compute NAND memory cell transistor (see FIG. 18A, for example). In one embodiment, the memory system 100 allocates a different voltage from drain to source of different compute NAND memory cell transistor (see FIG. 18B, for example).

Step 1904 includes accessing a target gate-to-source voltage for each compute NAND memory cell transistor. The target gate-to-source voltage for each respective compute NAND memory cell transistor will be used to represent a value from an input vector. In an embodiment, each target gate voltage has a base gate voltage and an offset that depends on the value of the input vector (see FIG. 15A). In an embodiment, the compute NAND memory cell transistors are in four unit computation cells with two cells on each NAND string of a pair of NAND string (see FIG. 15A). In an embodiment, the target gate-to-source voltage is determined based on a transformation from X vector values to Vgs values such as shown above in Equation 5.

Step 1906 includes determining a gate voltage for each compute NAND memory cell transistor to achieve the target gate-to-source voltage in view of the estimated source terminal voltage. Step 1906 may be used to achieve actual gate voltages as shown and described above with respect to FIGS. 17, 18A, and 18B. However, step 1906 is not limited to those examples.

Step 1908 includes applying the gate voltage to each compute NAND memory cell transistor used for the in-memory computation on the one or more NAND strings. Step 1908 may also include applying a voltage to the bit lines connected to the one or more NAND strings and a voltage to a source line connected to the one or more NAND strings. The difference between the bit line voltage and the source line voltage will be referred to as a string voltage between a first end of the one or more NAND string and a second end of the one or more NAND strings.

Step 1910 includes sensing a current of each NAND string in response to the gate voltages. Step 1910 may include using the current to charge or discharge a sense node (e.g., capacitor). The sense node may be pre-charged to a target voltage prior to providing the current to the sense node.

Step 1912 includes determining a result for the in-memory computation based on the sensed current(s). In an embodiment, the result is based on a difference between a first current in one NAND string and a second current in another NAND string. For example, the in-memory compute may be an inner product of a weight vector and the input vector, where the weight vector is programmed into a positive stack and a negative stack (see FIG. 15A). In an embodiment, the computation is a VMM. The circuitry depicted in FIG. 15B may be used in step 1912; however, step 1912 is not limited to the circuitry depicted in FIG. 15B.

Another technical challenge of implementing MAC in NAND are signal-to-noise issues. Signal to noise issues may be especially problematic with vector dot product computation based on a difference between two currents. For example, a technique based on the positive stack and the negative stack (see FIG. 15A) analyzes a difference between the current ($I^+$) in the positive stack a current ($I^-$) in the negative stack to determine a result for an in memory compute (e.g., MAC). The difference in magnitude between these two currents may be referred to as a difference current or a difference signal. Moreover, the difference in magnitude between these two currents may be relatively small. For example, the current ($I^+$) and the current ($I^-$) may each individually be about 100 nA. However, the difference current ($I^+-I^-$) might be about 10 nA.

Figure 20A:
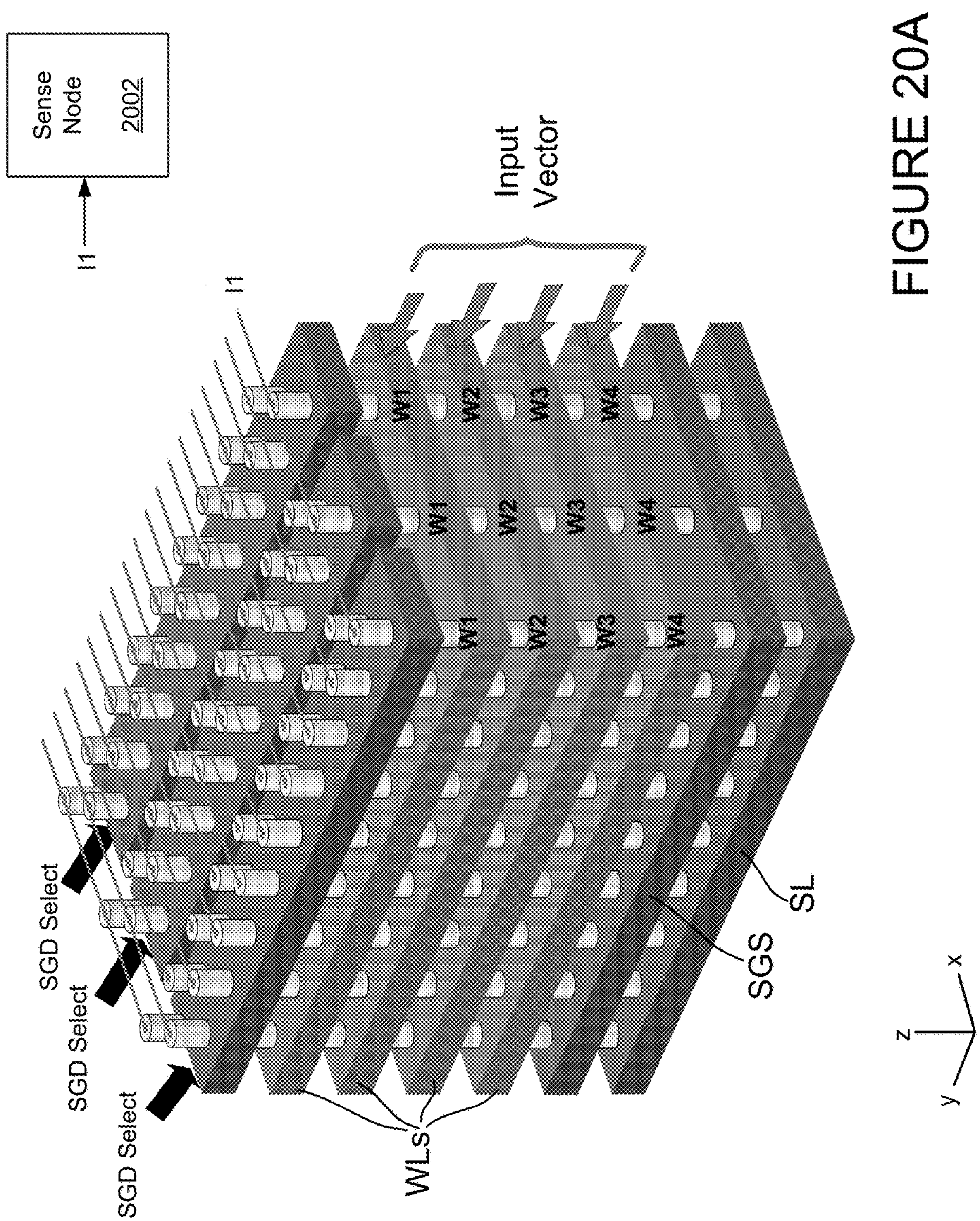
FIG. 20A illustrates a portion of a 3D NAND memory structure to illustrate an accumulated current embodiment of performing in-memory compute in which a copy of weights are programmed into multiple NAND strings.

In an embodiment, the currents from multiple bit lines are accumulated in order to improve the signal-to-noise ratio to thereby improve accuracy for in-memory compute using NAND. FIG. 20A illustrates a portion of a 3D NAND memory structure to illustrate an embodiment of performing in-memory compute. The 3D NAND memory structure in FIG. 20A is similar to the 3D NAND memory structure in FIG. 13 and thus similar elements will not be discussed again. FIG. 20A shows how signal-to-noise may be improved by programming a copy of weights into multiple NAND strings and then accumulating the currents from each of those NAND strings. A simplified example in which the weight vector contains four weights (W1, W2, W3, W4) will be discussed. FIG. 20A shows that a copy of the weight vector is programmed into three NAND strings. The three NAND strings are all connected to the same bit line. Each NAND string is in a different sub-block, with each sub-block selected by one of the SGD lines.

As noted above, programming a weight into a NAND memory cells means to program the Vt of the NAND memory cell to represent the value of the weight. Thus, the four weights (W1, W2, W3, W4) will be understood to be four different Vts that represent the corresponding weight. Furthermore, this simplified example uses a single memory cell as the basic calculation unit. However, multiple memory cells may be used in a calculation unit such as in the example of FIG. 15A. The in-memory compute being illustrated in FIG. 20A is for a multiplication of the weight vector by the input vector (e.g., dot product of weight vector and input vector). The input vector is applied by applying suitable voltages to the four word lines (WLs). The three NAND string currents will flow in the bit line connected to the three NAND strings as labeled as I1. This current I1 is provided to the sense node 2002, which therefore accumulates the three NAND string currents and forms an accumulated signal based on the three NAND string currents. Note that current may be accumulated from more or fewer than three NAND strings. Although the example in FIG. 20A is for vector-vector multiply, this concept can be extended to VMM. In one embodiment, each sub-block in a block is programmed with a copy of a weight matrix. In the memory structure depicted in FIG. 20A, each of the three sub-blocks may be programmed with its own copy of the weight matrix.

In an embodiment, the sense node 2002 comprises a capacitor. In an embodiment, the capacitor is pre-charged to a target voltage prior to discharging the capacitor with the NAND string currents. However, depending on the direction of current flow the capacitor could also be charged by the currents. In one embodiment, the voltage on the capacitor is monitored for an amount of time it takes to discharge to a reference voltage. In one embodiment, the voltage on the capacitor is allowed to discharge for a pre-determined time.

Figure 20B:
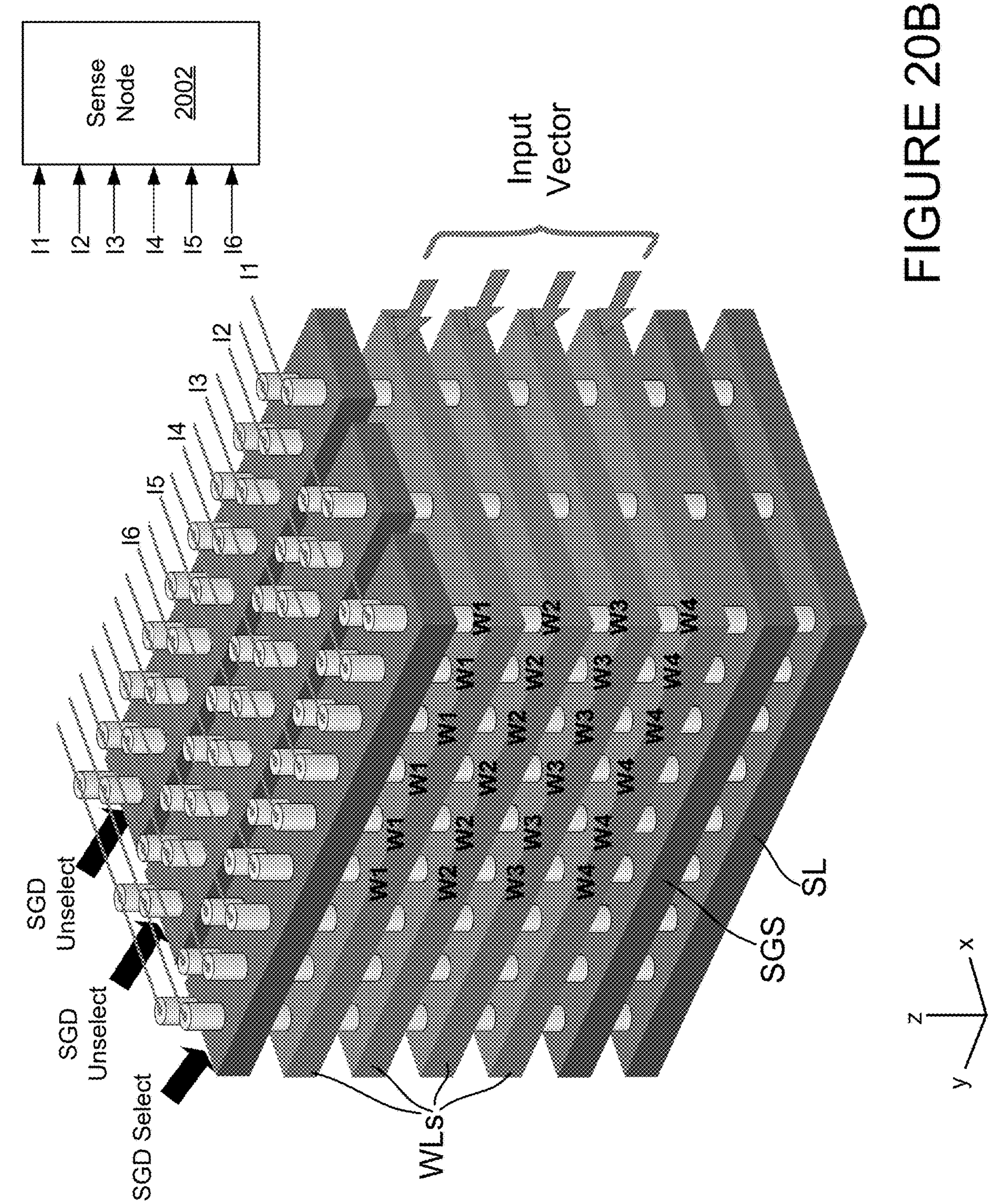
FIG. 20B illustrates a portion of a 3D NAND memory structure to illustrate an alternative to the accumulated current embodiment of FIG. 20A.

FIG. 20B illustrates another way that NAND string current may be combined for in-memory compute. The 3D NAND memory structure in FIG. 20B is similar to the 3D NAND memory structure in FIG. 20A. FIG. 20B shows how signal-to-noise may be improved by programming a copy of weights into multiple NAND strings and then accumulating the currents from each of those NAND strings. FIG. 20B shows that a copy of the weight vector is programmed into six NAND strings. The in-memory compute being illustrated in FIG. 20B is for a multiplication (e.g., vector dot product) of the weight vector by the input vector. The input vector is applied by applying suitable voltages to the four word lines (WLs). The six currents that flow in the corresponding six bit lines connected to the six NAND strings programmed with the six copies of the weight vector are labeled as I1, I2, I3, I4, I5, and I6. Those six currents are provided to the sense node 2002, which accumulates the six currents and forms an accumulated signal based on the currents. Note that current may be accumulated from more or fewer than six NAND strings. In an embodiment, the sense node 2002 comprises a capacitor. In an embodiment, the capacitor is pre-charged to a target voltage prior to discharging the capacitor with the currents. However, depending on the direction of current flow the capacitor could also be charged by the currents. In one embodiment, the voltage on the capacitor is monitored for an amount of time it takes to discharge to a reference voltage. In one embodiment, the voltage on the capacitor is allowed to discharge for a pre-determined time.

Figure 21A:
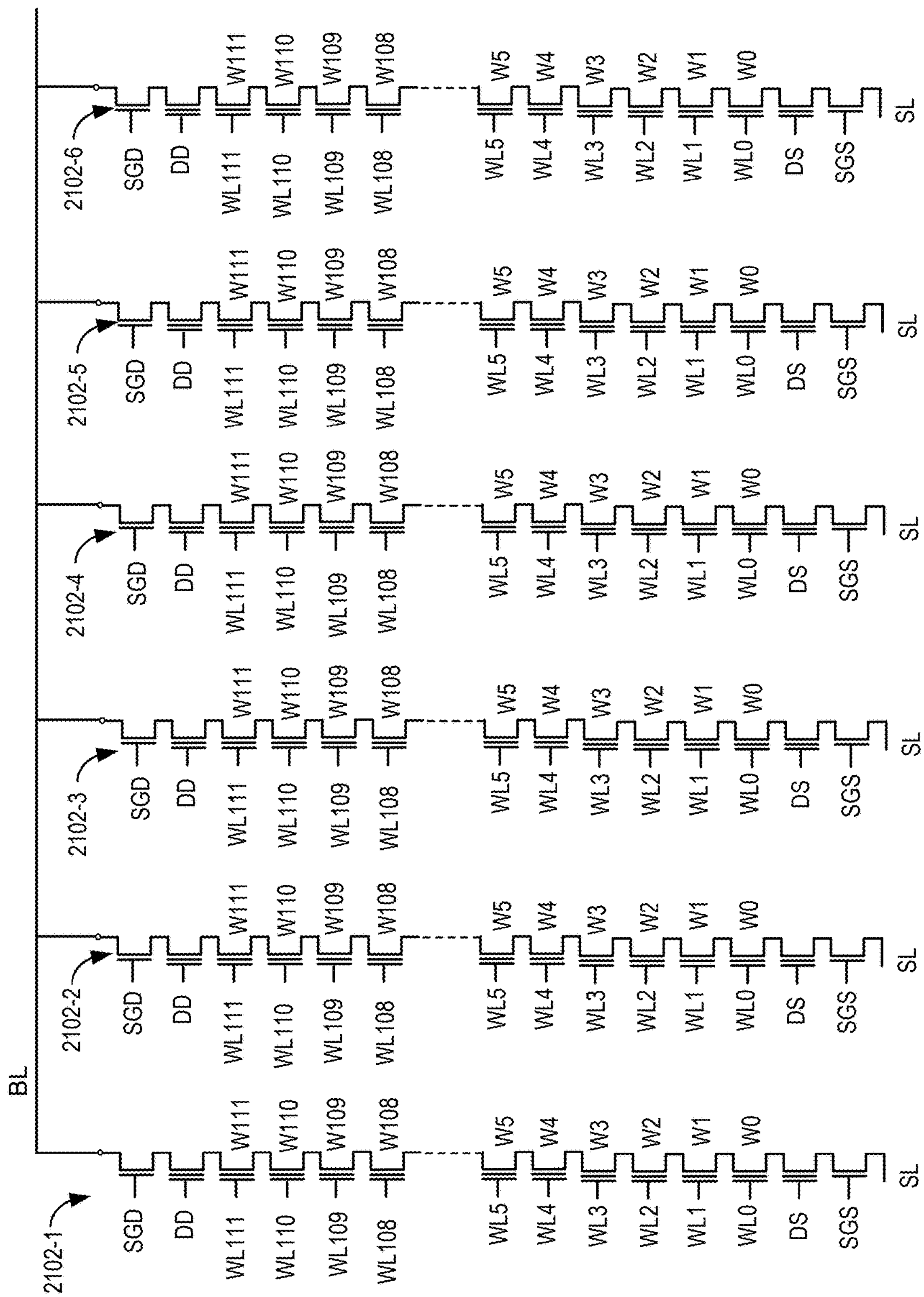
FIG. 21A shows a number of NAND strings to illustrate an embodiment of how NAND strings may be programmed for accumulated currents during an in-memory compute.

FIG. 21A shows a number of NAND strings to illustrate how NAND strings may be programmed for an embodiment of accumulating currents during an in-memory compute. Six NAND strings 2102-1, 2102-2, 2102-3, 2102-4, 2102-5, and 2102-6 are each programmed with the same set of weights (W0, W1, W2, W3, W4, W5, . . . W108, W109, WHO, W111). The NAND strings may be in the same block, but that is not a requirement. The NAND memory cells of each NAND string may be connected to the same set of word lines (WL0, WL1, WL2, WL3, WL4, WL5, . . . WL108, WL109, WL110, WL110). These word lines may be in the same block. Alternatively the word lines could be in different blocks in order to allow current from more NAND strings to be combined. The input vector will be applied to the word lines to perform the same MAC on each NAND string 2102. The memory system 100 accumulates the currents from the NAND strings onto the bit line BL. In a MAC embodiment, the magnitude of the current in a NAND string is inversely proportional to the resistance across the NAND string. Hence, measuring the magnitude of one NAND string current may be viewed as a way of measuring the resistance across the NAND string (with a suitable transformation of the sensing results). Accumulating the currents of the NAND strings may be viewed as measuring the currents in parallel or as measuring the parallel resistance of the NAND strings. Since the parallel resistance of the NAND strings will be less than the resistance of the individual NAND strings, measuring in parallel may be viewed as reducing the resistance. Reducing the resistance can reduce errors due to manufacturing tolerances. Also reducing the resistance improves accuracy of the measurement.

Figure 21B:
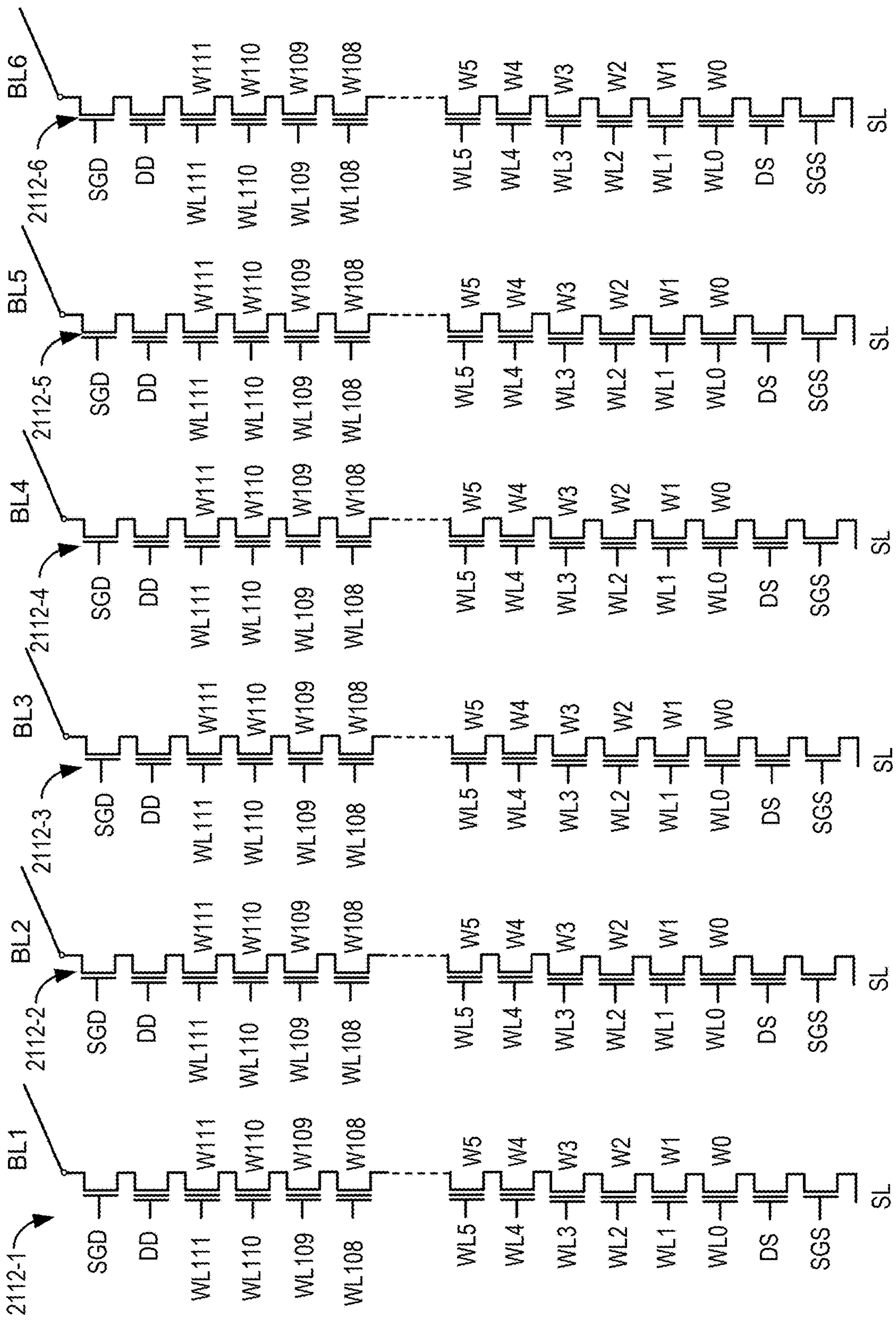
FIG. 21B shows a number of NAND strings to illustrate an alternative to the accumulated current embodiment of FIG. 21A.

FIG. 21B shows an alternative to FIG. 21A in which different bit line are used to combine the currents of NAND strings. A number of NAND strings to illustrate how NAND strings may be programmed for an embodiment of accumulating currents during an in-memory compute. Six NAND strings 2112-1, 2112-2, 2112-3, 2112-4, 2112-5, and 2112-6 are each programmed with the same set of weights (W0, W1, W2, W3, W4, W5, . . . W108, W109, W110, W111). Each NAND string is connected to a different bit line. The NAND strings may be in the same block. The NAND memory cells of each NAND string may be connected to the same set of word lines (WL0, WL1, WL2, WL3, WL4, WL5, . . . WL108, WL109, WL110, WL110). These word lines may be in the same block. The input vector will be applied to the word lines to perform the same MAC on each NAND string 2102. The memory system 100 accumulates the currents from the NAND strings onto the bit line BL.

Figure 22A:
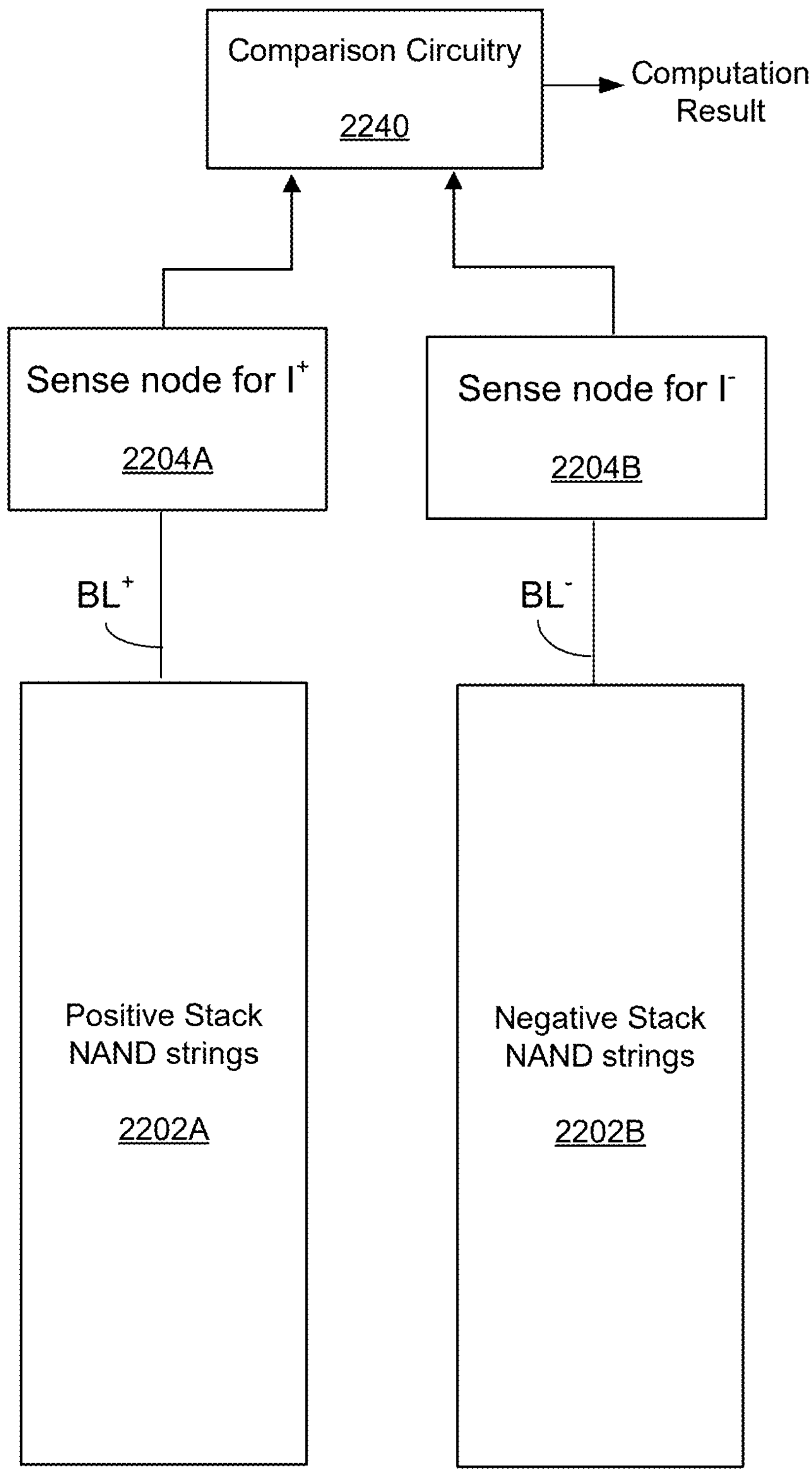
FIG. 22A depicts an embodiment of how the NAND string current may be accumulated with a technique that uses multiple positive NAND stacks and multiple negative NAND stacks.

In an embodiment, the NAND string current accumulation is performed with a technique that uses a positive NAND stack and a negative NAND stack, such as depicted in FIG. 15A. FIG. 22A depicts an embodiment of how the NAND string currents may be accumulated with a technique that uses multiple positive NAND stacks and multiple negative NAND stacks. The positive stack NAND strings 2202A contain two or more NAND strings that are programmed with the same Vts to represent the same weight vector. Referring back to FIG. 15A, each NAND string in the positive stack NAND strings 2202A corresponds to the positive stack. Thus, each NAND string in the positive stack NAND strings 2202A has two NAND memory cell transistors for each calculation cell unit 1502. The negative stack NAND strings 2202B contain two or more NAND strings that are programmed with the same Vts to represent the same weight vector. Referring back to FIG. 15A, each NAND string in the negative stack NAND strings 2202B corresponds to the negative stack. Thus, each NAND string in the negative stack NAND strings 2202A has the other two NAND memory cell transistors for each calculation cell unit 1502. Each NAND string in the positive stack NAND strings 2202A is connected to the same bit line $BL^+$. The bit line $BL^+$ is connected to the sense node for the $I^+$. Each NAND string in the negative stack NAND strings 2202B is connected to the same bit line ($BL^-$). The bit line ($BL^-$) is connected to a sense node for $I^-$ 2204B. The comparison circuitry 2240 is connected to the sense nodes to compare the difference between $I^+$ and $I^-$ to produce a computation result.

Figure 22B:
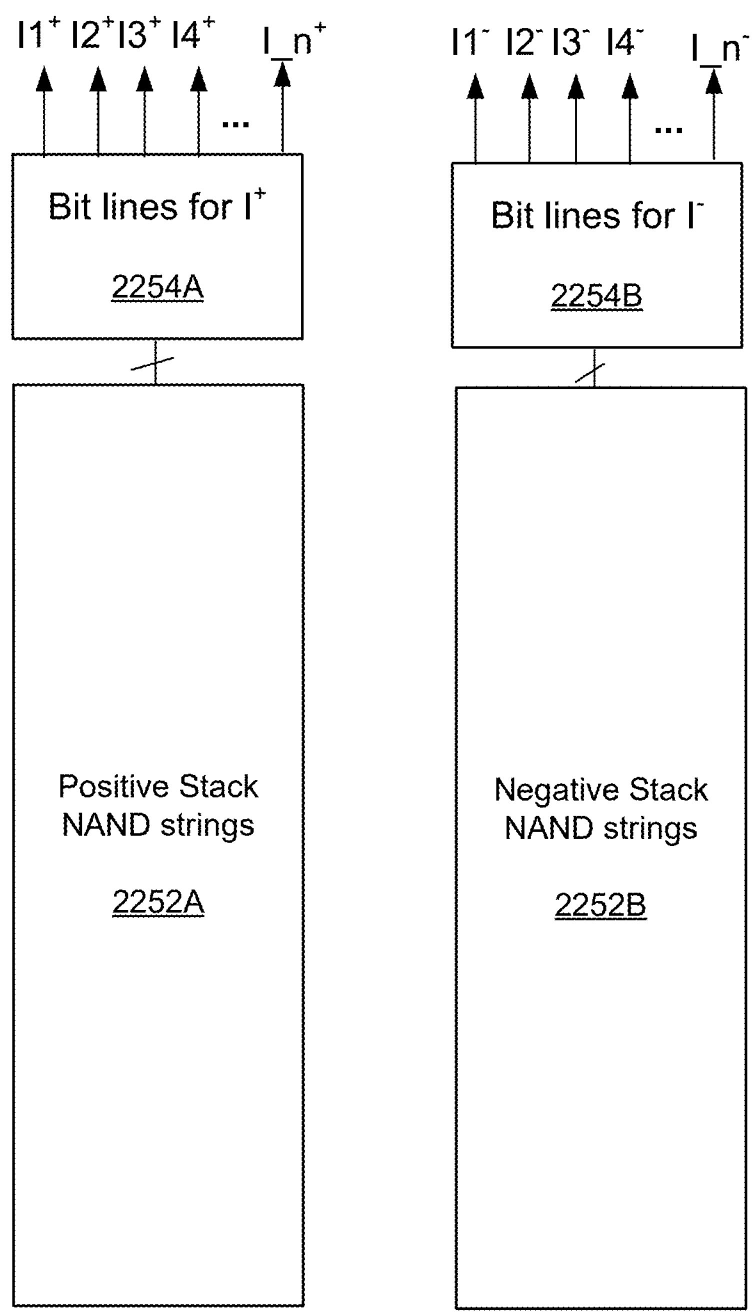
FIG. 22B depicts an embodiment of how the NAND string current may be accumulated as an alternative to the embodiment of FIG. 22A.

FIG. 22B depicts an alternative to the embodiment in FIG. 22A. The positive stack NAND strings 2252A contain two or more NAND strings that are programmed with the same Vts to represent the same weight vector. Referring back to FIG. 15A, each NAND string in the positive stack NAND strings 2252A corresponds to the positive stack. Thus, each NAND string in the positive stack NAND strings 2252A has two NAND memory cell transistors for each calculation cell unit 1502. The negative stack NAND strings 2252B contain two or more NAND strings that are programmed with the same Vts to represent the same weight vector. Referring back to FIG. 15A, each NAND string in the negative stack NAND strings 2252B corresponds to the negative stack. Thus, each NAND string in the negative stack NAND strings 2252A has the other two NAND memory cell transistors for each calculation cell unit 1502. Each NAND string in the positive stack NAND strings 2252A is connected to one bit line in the bit lines for $I^+$ 2254A. Each NAND string in the negative stack NAND strings 2252B is connected to one bit line in the bit lines for $I^-$ 2254B.

Figure 23:
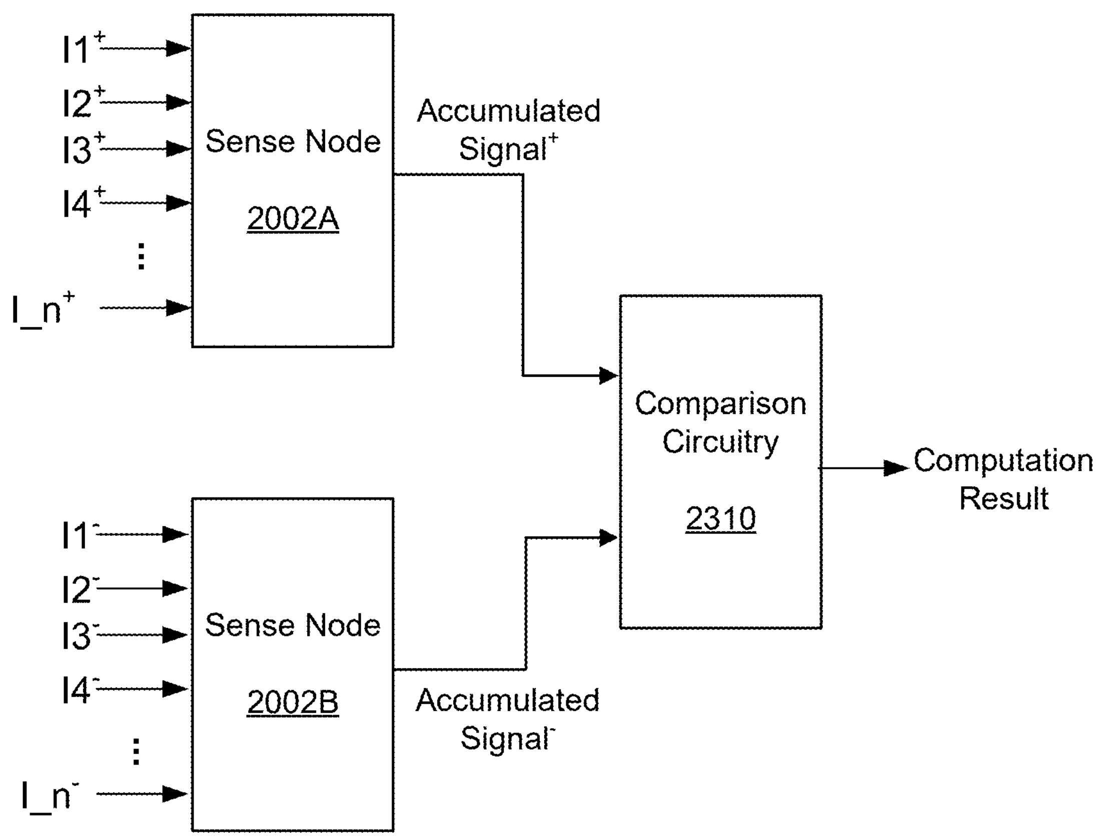
FIG. 23 is a block level diagram showing components for accumulating the currents from the bit lines in FIG. 22.

FIG. 23 is a block level diagram showing components for accumulating the currents from the bit lines in FIG. 22B. Sense node 2002A is connected to bit lines for $I^+$ 2204A to receive currents $I1^+$, $I2^+$, $I3^+$, $I4^+$, . . . $I\_n^+$. Sense node 2002B is connected to bit lines for $I^-$ 2204B to receive currents $I1^-$, $I2^-$, $I3^-$, $I4^-$, . . . $I\_n^-$. In an embodiment, sense node 2002A has a sense capacitor and sense node 2002B has a sense capacitor. In an embodiment, each sense capacitor is pre-charged to a target voltage prior to discharging the sense capacitor with the currents. However, depending on the direction of the current flow the currents could alternatively be used to charge the sense capacitors. Sense node 2002A produces what is referred to as the positive accumulated $signal^+$. Sense node 2002B produces what is referred to as the negative accumulated $signal^-$. In an embodiment, each accumulated signal is the voltage on the sense capacitor in the corresponding sense node. The difference between the positive accumulated $signal^+$ and the negative accumulated $signal^-$ is a function of how many NAND strings are used for the accumulated currents. The signal-to-noise ratio of the difference between the positive accumulated $signal^+$ and the negative accumulated $signal^-$ is improved by accumulating the currents. Each accumulated signal is input to the comparison circuitry 2310, which outputs a computation result. In an embodiment, the computation result is a MAC (e.g., dot product of a weight vector and an input vector).

Figure 24A:
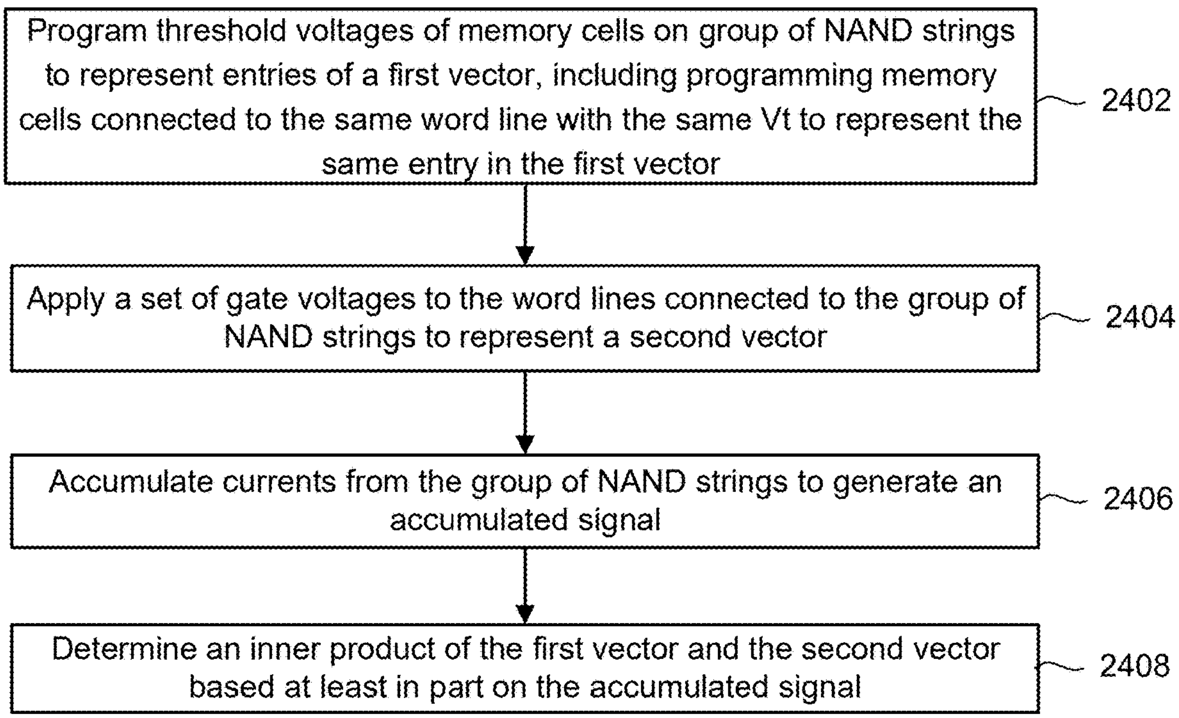
FIG. 24A is a flowchart of one embodiment of a process of performing in-memory compute in NAND that accumulates currents from bit lines.

FIG. 24A is a flowchart of one embodiment of a process 2400 of performing in-memory compute in NAND that accumulates currents from bit lines. In an embodiment, process 2400 is performed during an inferencing phase of an artificial neural network. Process 2400 improves accuracy of in-memory compute. The process 2400 may be performed by a combination of memory controller 120 and/or control circuitry (e.g., system control logic 260, column control circuitry 210, row control circuitry 220) of memory die 200 or control die 211.

Step 2402 includes programming threshold voltages of the compute NAND memory cells of a number of NAND strings to represent entries of a first vector. In one embodiment each NAND string is in a different sub-block (see FIG. 20A). In one embodiment each NAND string is in the same sub-block (see FIG. 20B). Step 2402 includes programming the NAND memory cells connected to the same word line with the same threshold voltage to represent the same entry in the first vector. For example, with respect to FIG. 21A or 21B each memory cell connected to WL2 is programmed with W2 of the first vector, where W2 is represented by a Vt that corresponds to W2.

Step 2404 includes applying a set of gate voltages to the word lines connected to the compute NAND memory cells of the NAND strings to represent a second vector. For example, each entry in the second vector is mapped to a gate voltage (also referred to as a word line voltage). Then, the gate voltage is applied to the appropriate word line. Step 2404 also includes selecting the appropriate sub-blocks. If the NAND strings were programmed as in FIG. 20A, then each sub-block gets selected in step 2404. The sub-blocks may be selected by applying a select voltage to the SGD (SGD Select). If the NAND strings were programmed as in FIG. 20B, then only on sub-block gets selected in step 2404.

Step 2406 includes accumulating a current from each NAND string that results from applying the set of gate voltages to the word lines to form an accumulated signal. For example, referring to FIG. 20A the currents from each NAND string flow into the bit line BL, which is input to the sense node 2002. Referring to FIG. 20B the currents from each bit line (I1, I2, I3, I4, I5, and I6) are each input to the sense node 2002. In an embodiment, the sense node contains a capacitor that may be discharged (or optionally charged) using the bit line currents.

Step 2408 includes determining an inner product (e.g., dot product) of the first vector and the second vector based at least in part on the accumulated signal.

Figure 24B:
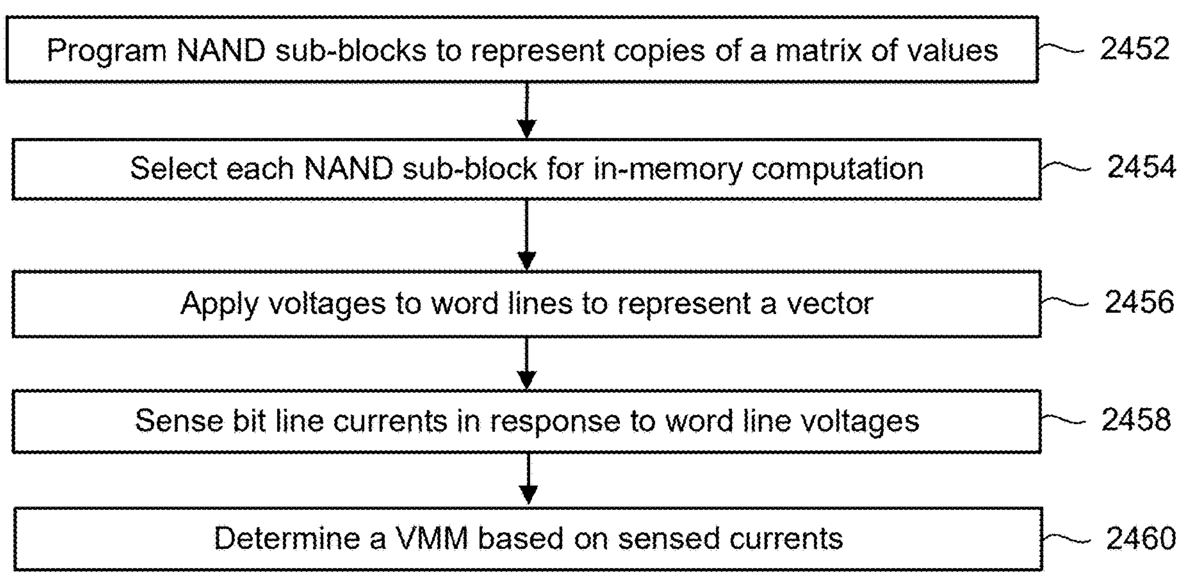
FIG. 24B is a flowchart of one embodiment of a process of performing in-memory compute in NAND that programs multiple sub-blocks with the same matrix.

FIG. 24B is a flowchart of one embodiment of a process 2450 of performing in-memory compute in NAND that programs multiple sub-blocks with the same matrix. In an embodiment, process 2450 is performed during an inferencing phase of an artificial neural network. Process 2450 improves accuracy of in-memory compute. The process 2450 may be performed by a combination of memory controller 120 and/or control circuitry (e.g., system control logic 260, column control circuitry 210, row control circuitry 220) of memory die 200 or control die 211.

Step 2452 includes programming NAND sub-blocks to represent copies of a matrix of values. That is, the matrix is programmed into a first NAND sub-block, a second NAND sub-block, etc. The process 2450 is similar to programming the same vector into different sub-blocks as depicted FIG. 20A. However, multipole vectors are programmed into each sub-block. Note that step 2452 may include programming pairs of NAND strings within the same sub-block such that the pair of NAND strings represents a weight vector (see FIG. 15A).

Step 2454 includes selecting each NAND sub-block for in-memory computation. The sub-blocks may be selected by applying a select voltage to the SGD (SGD Select).

Step 2456 includes applying a set of gate voltages to the word lines connected to the sub-blocks to represent a vector. For example, each entry in the vector is mapped to a gate voltage (also referred to as a word line voltage). Then, the gate voltage is applied to the appropriate word line.

Step 2458 includes sending bit line currents in response to the word line voltage. Step 2458 has the effect of accumulating in a particular bit line the current from each NAND string connected the particular bit line. The bit line current may then be provided to a sense node.

Step 2460 includes determining a VMM based on the sensed currents. Step 2460 may include comparing the currents in bit line pairs, but that is not a requirement.

Figure 25:
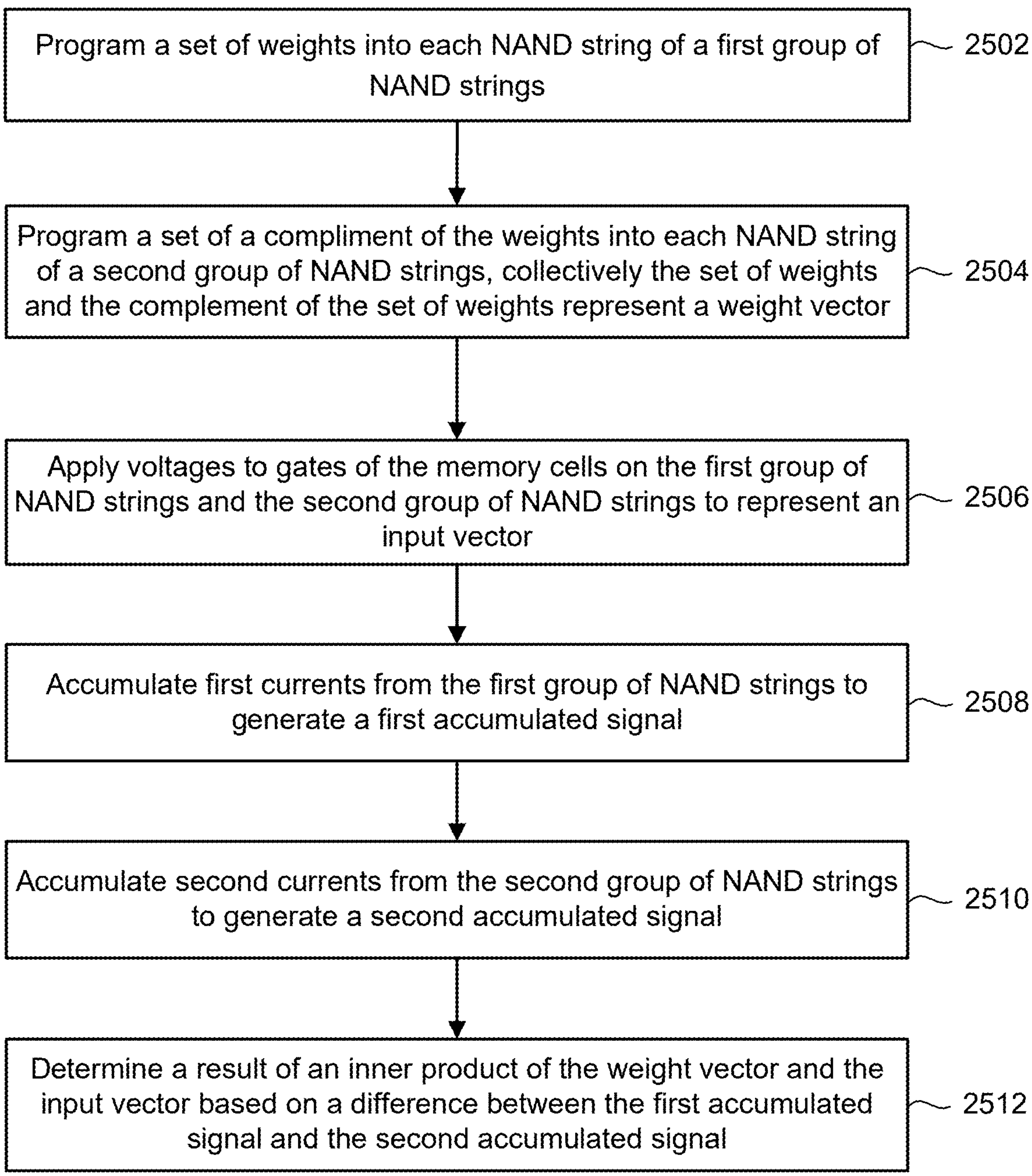
FIG. 25 is a flowchart of one embodiment of a process of performing in-memory compute in NAND that accumulates currents from pairs of bit lines.

FIG. 25 is a flowchart of one embodiment of a process 2500 of performing in-memory compute in NAND that accumulates currents from pairs of bit lines. In an embodiment, process 2500 is performed during an inferencing phase of an artificial neural network. The process 2500 may be used for a techniques that compares two bit line voltages such as the example depicted in FIGS. 15A and 15B, but is not limited thereto. The process 2500 may be performed by a combination of memory controller 120 and/or control circuitry (e.g., system control logic 260, column control circuitry 210, row control circuitry 220) of memory die 200 or control die 211.

Step 2502 includes programming a set of weights into each NAND string of a first group of NAND strings. The first group of NAND strings may be connected to the same bit line (e.g., each NAND string is in a different sub-block). Alternatively, each NAND string in the first group of NAND strings may be connected to a different bit line (e.g., each NAND string is in the same sub-block). In an embodiment the first group of NAND strings are what is referred to herein as a positive stack (see FIG. 15A).

Step 2504 includes programming a set of a compliment of the weights into each NAND string of a second group of NAND strings. The second group of NAND strings may be connected to the same bit line. Alternatively, each NAND string in the second group of NAND strings may be connected to a different bit line. In an embodiment the second group of NAND strings are what is referred to herein as a negative stack NAND strings. Collectively the set of weights and the complement of the set of weights represent a weight vector. The phrase "compliment of the weights" means that for each positive valued weight in one stack there is corresponding negative valued weight in the same position in the other stack. For example, referring to FIG. 15A, memory cell 1506 has −W1 and memory cell 1510 has W1; also memory cell 1504 has W1 and memory cell 1508 has −W1. In an embodiment, steps 2502 and 2504 together result in programming each weight into a number of calculation units. For example, referred to FIG. 15A, the weight W1 is programmed into calculation unit 1502-1. However, in process 2500 the weight W1 would be programmed into a number of calculation cell units 1502-1, with each calculation cell unit 1502-1 being on a different pair of NAND strings.

Step 2506 includes applying voltages to gates of the memory cells on the first group of NAND strings and the second group of NAND strings to represent an input vector. In embodiment, each entry of the input vector is represented by two voltages (see FIG. 15A).

Step 2508 includes accumulating first currents from the first group of NAND strings to generate a first accumulated signal. For example, with reference to FIG. 22A, the currents from the positive NAND string stack 2202A are provided to the $BL^+$, which is connected to the sense node for $I^+$ 2204A. As an alternative, with reference to FIG. 23, currents $I1^+$, $I2^+$, $I3^+$, $I4^+$, . . . $I\_n^+$ are input to sense node 2002A. Sense node 2002A may contain a capacitor that is charged or discharged by the currents $I1^+$, $I2^+$, $I3^+$, $I4^+$, . . . $I\_n^+$.

Step 2510 includes accumulating second currents from the second group of NAND strings to generate a second accumulated signal. For example, with reference to FIG. 22A, the currents from the negative NAND string stack 2202B are provided to the $BL^-$, which is connected to the sense node for $I^-$ 2204B. As an alternative, with reference to FIG. 23, currents $I1^-$, $I2^-$, $I3^-$, $I4^-$, . . . $I\_n^-$ are input to sense node 2002B. Sense node 2002B may contain a capacitor that is charged or discharged by the currents $I1^-$, $I2^-$, $I3^-$, $I4^-$, . . . $I\_n^-$.

Step 2512 includes computing a result of an inner product (e.g., dot product) of the weight vector and the input vector based on a difference between the first accumulated signal and the second accumulated signal. For example, with reference to FIG. 22A comparison circuitry 2240 outputs the computation result. As an alternative, with reference to FIG. 23 the first accumulated signal$^+$ and the second accumulated signal$^-$ are each input to the comparison circuitry 2310, which outputs the computation result.

Another technical challenge in MAC using NAND memory is that variations between memory cells can result in inaccuracies. For example, variations between memory cells in the same calculation unit can result in inaccuracies. Limitations in the semiconductor fabrication process can lead to such variations between memory cells. These variations are not just wafer-to-wafer and die-to-die but there are also variations within a block of NAND strings. Such variations impact NAND memory cell transistor operation. For example, such variations may impact the $I_{DS}$ of a NAND memory cell transistor.

The NAND memory cell to NAND memory cell variations may be of some physical characteristic. Moreover, this variation in physical characteristic may impact an operational characteristic upon which in-memory compute depends. It is possible that there may be NAND memory cell to NAND memory cell variations between one or more of the physical characteristics of a MOSFET NAND memory cell transistor that impacts the $I_{DS}$. For example, the thickness of the tunnel oxide (see, for example, tunneling layer 464 in FIG. 4D) could vary from NAND memory cell transistor to NAND memory cell transistor. Also, the capacitance of the tunnel oxide could vary from NAND memory cell transistor to NAND memory cell transistor. As another example, the gate width/gate length ratio (W/L) may vary from NAND memory cell transistor to NAND memory cell transistor. the gate width (W) may vary from NAND memory cell transistor to NAND memory cell transistor, and the gate length ratio (L) may vary from cell to cell.

In an embodiment, the calculation units are organized to place NAND memory cell transistors having similar characteristics into the same calculation unit even if this means that the memory cell transistors in one calculation unit will be separated by one or more memory cell transistors in a different calculation unit. In general, the calculation units have at least two NAND memory cell transistors. In one embodiment, each calculation unit has four NAND memory cell transistors (two each on two NAND strings) as in the example of FIG. 15A.

The calculation units can be organized based on one or more physical characteristics of the NAND memory cell transistors and/or one or more operational characteristics of the NAND memory cell transistors. Examples of physical characteristics include, but are not limited to, thickness of the tunnel oxide, capacitance of the tunnel oxide (Cox), gate width (W), and/or gate length ratio (L). An example of an operational characteristic include $I_{DS}$. This may be, for example, $I_{DS}$ the linear (triode) region.

There may be systemic variations that are relatively consistent from die-to-die and block-to-block due to the nature of the fabrication process. Such consistent variations may be handled by organizing calculation units based on offline analysis of 3D NAND memory structures.

There may be random variations that are not consistent from die-to-die or block-to-block. Such random variations may be handled by performing a measurement of one or more characteristics of individual NAND memory cell transistors within a particular 3D NAND memory structure. As an example, an operational characteristic such as $I_{DS}$ may be measured for a given set of one or more operational parameters such as Vgs, Vt and/or Vds.

Figure 26:
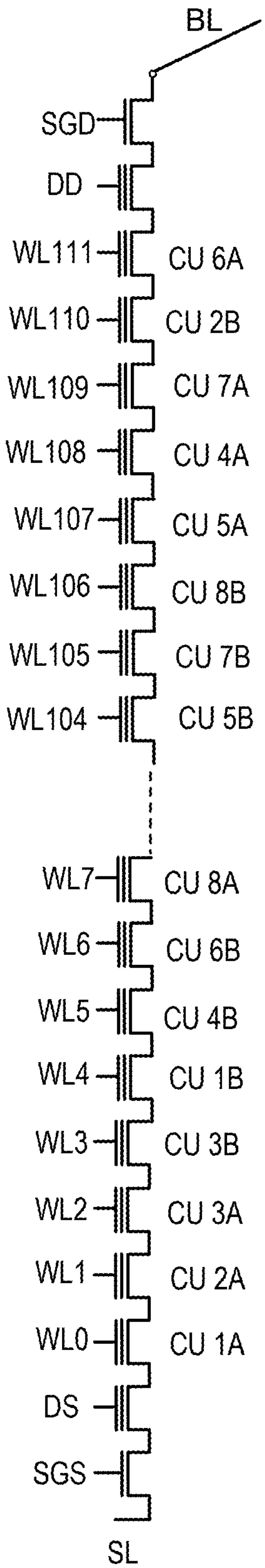
FIG. 26 is schematic diagram of a NAND string in which calculation cell units are organized in accordance with an embodiment.

FIG. 26 is schematic diagram of a NAND string in which calculation cell units are organized in accordance with an embodiment. In this example, each calculation cell unit has two NAND memory cell transistors. A total of 16 NAND memory transistors are depicted, but there will typically be more than 16. The 16 NAND memory transistors are organized into eight calculation cell units. Each of the eight calculation units (CU1, CU2, CU3, CU4, CU5, CU6, CU7, CU8) has an A cell and a B cell. For example, one calculation cell unit is formed from CU1A and CU1B, another calculation cell unit is formed from CU2A and CU2B, etc.

Figure 27:
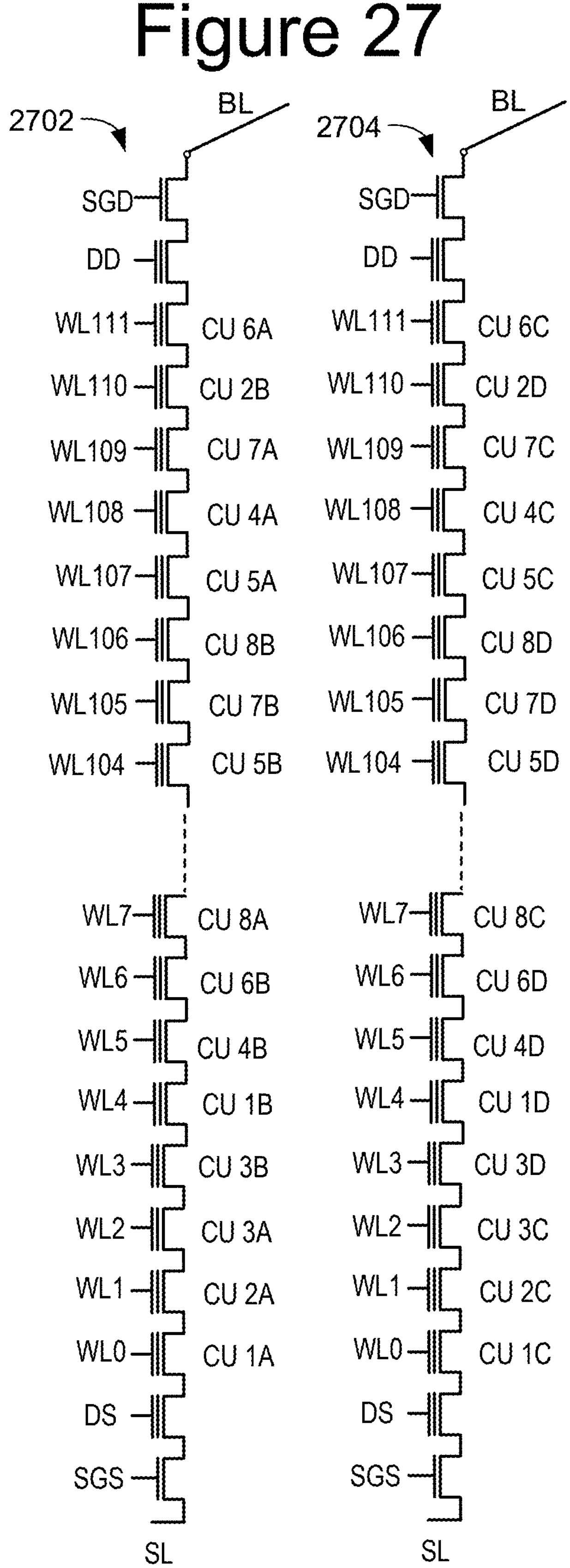
FIG. 27 is schematic diagram of two NAND strings in which calculation cell units are organized in accordance with an embodiment.

FIG. 27 is schematic diagram of two NAND strings in which calculation cell units are organized in accordance with an embodiment. In this example, each calculation cell unit has four NAND memory cell transistors with two cells on each NAND string. A total of 32 NAND memory transistors are depicted on the two NAND strings, but there will typically be more than 32. The 32 NAND memory transistors are organized into eight calculation cell units. Each of the eight calculation cell units (CU1, CU2, CU3, CU4, CU5, CU6, CU7, CU8) has an A cell and a B cell on NAND string 2702 and a C cell and a D cell on NAND string 2704. For example, one calculation cell unit is formed from CU1A, CU1B, CU1C, CU1D; another calculation cell unit is formed from CU2A, CU2B, CU2C, CU2D, etc.

The two NAND strings 2702 and 2704 may be adjacent to each other, by which is it meant that no other NAND string is physically between the two NAND strings 2702 and 2704. However, there may be another NAND string physically between the two NAND strings 2702, 2704. In an embodiment, the two NAND strings 2702 and 2704 are selected such that the memory cells on the two NAND strings are close in one or more physical and/or operational characteristics. In an embodiment, the two NAND strings 2702 and 2704 are connected to the same set of word lines. For example, the two NAND strings in FIG. 15A may be connected to the same set of word lines. In such as configuration the selection of the two NAND strings may be made such that the memory cells in a particular calculation unit 1502 on the positive stack are very close in the one or more physical and/or operational characteristics to the memory cells in the particular calculation unit 1502 on the negative stack.

Figure 28:
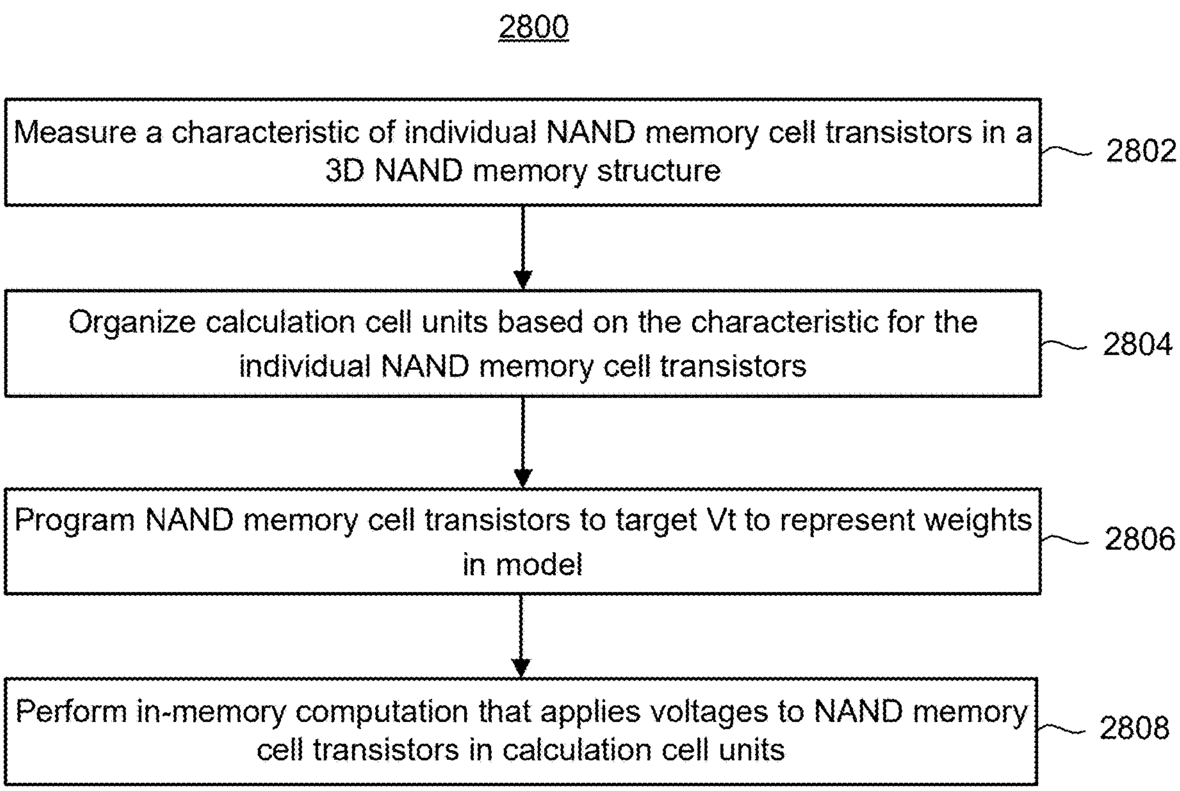
FIG. 28 is a flowchart of one embodiment of a process of organizing NAND memory cell calculation cell units and performing an in-memory computation.

FIG. 28 is a flowchart of one embodiment of a process 2800 of organizing calculation cell units and performing an in-memory compute. In an embodiment, process 2800 is performed during an inferencing phase of an artificial neural network. In one embodiment, the process 2800 is performed by one or more control circuits in the memory system. The process 2800 may be performed by a combination of memory controller 120 and/or control circuitry (e.g., system control logic 260, column control circuitry 210, row control circuitry 220) of memory die 200 or control die 211. Process 2800 may be used for an in-memory compute that compares the difference in current between two NAND strings (see FIGS. 15A, 15B), but is not limited to comparing the difference in current between two NAND strings.

Step 2802 includes measuring a characteristic of individual NAND memory cell transistors in a three-dimensional NAND memory structure. In one embodiment, an operational characteristic of individual NAND memory cell transistors is measured. An example of the operational characteristic is the $I_{DS}$ for some given set of operational parameters. The operational parameters may include, but are not limited to, $V_{GS}$, $V_t$, and $V_{DS}$. In an embodiment, the values for the operational parameters are those that are typical for in-memory compute. When each individual NAND memory cell transistor is under test the same or "equivalent operating parameters" may be applied to the NAND memory cell transistor under test that were applied to other NAND memory cell transistors when they were under test. In an embodiment, the $I_{DS}$ is measured in the linear (triode) region. Step 2802 may include programming the individual NAND memory cell transistors to a target Vt, applying a target gate voltage to a NAND cell under test and measuring the $I_{DS}$. Cells that are very close in $I_{DS}$ may be suitable candidates to place into the same calculation cell unit. For example, calculation units may be formed from memory cell transistors having an $I_{DS}$ (for the operational parameters) that are within a tolerance of each other. The tolerance may be selected in order to achieve in-memory computation accuracy that is suitable for the application.

Step 2804 includes organizing NAND calculation cell units based on the characteristic of the individual NAND memory cell transistors. Each calculation cell unit has at least two NAND memory cell transistors. In an embodiment, the at least two NAND memory cell transistors of at least one calculation cell unit are separated by at least one NAND memory cell transistors of another calculation cell unit (see, for example, FIGS. 26 and 27). In an embodiment, each calculation cell unit contains NAND memory cell transistors that are within a tolerance of each other for the measured characteristic. The tolerance may be selected in order to achieve in-memory computation accuracy that is suitable for the application. Step 2804 may include forming calculation units based on a drain-to-source current of individual NAND memory cell transistors for equivalent operating parameters during an in-memory computation.

Step 2806 includes programming threshold voltages of the NAND memory cell transistors of the NAND calculation cell units to represent a first vector. This first vector may be a vector in an artificial neural network model (e.g., weight vector).

Step 2808 includes performing an in-memory computation that applies voltages to gates of the NAND memory cell transistors in the calculation cell units. Step 2808 may include applying voltages to gates of NAND memory cell transistors of the calculation cell units on at least one selected NAND string to represent a second vector. The second vector may be an input vector used in the artificial neural network. Step 2808 may further include sensing a current for each of the at least one bit lines that results from applying the voltages to the gates of NAND memory cell transistors. Step 2808 may further include determining a result of multiplying the first vector times the second vector based on the current for each of the at least one bit lines. This result may be a scalar that is the dot product of the first vector and second vector.

A technical challenge for in-memory compute is variance in resistances of signal lines such as bit lines. This problem may be especially significant for in-memory compute techniques that compare a first signal on a first signal line with a second signal on a second signal line. For example, this problem may be especially significant for the technique depicted in FIG. 15A that compares the signal on BL1 with the signal on BL2 to perform a MAC (e.g., dot product of two vectors). In an embodiment, signal line pairs used for in-memory compute are organized based on resistance of the signal lines.

Figure 29:
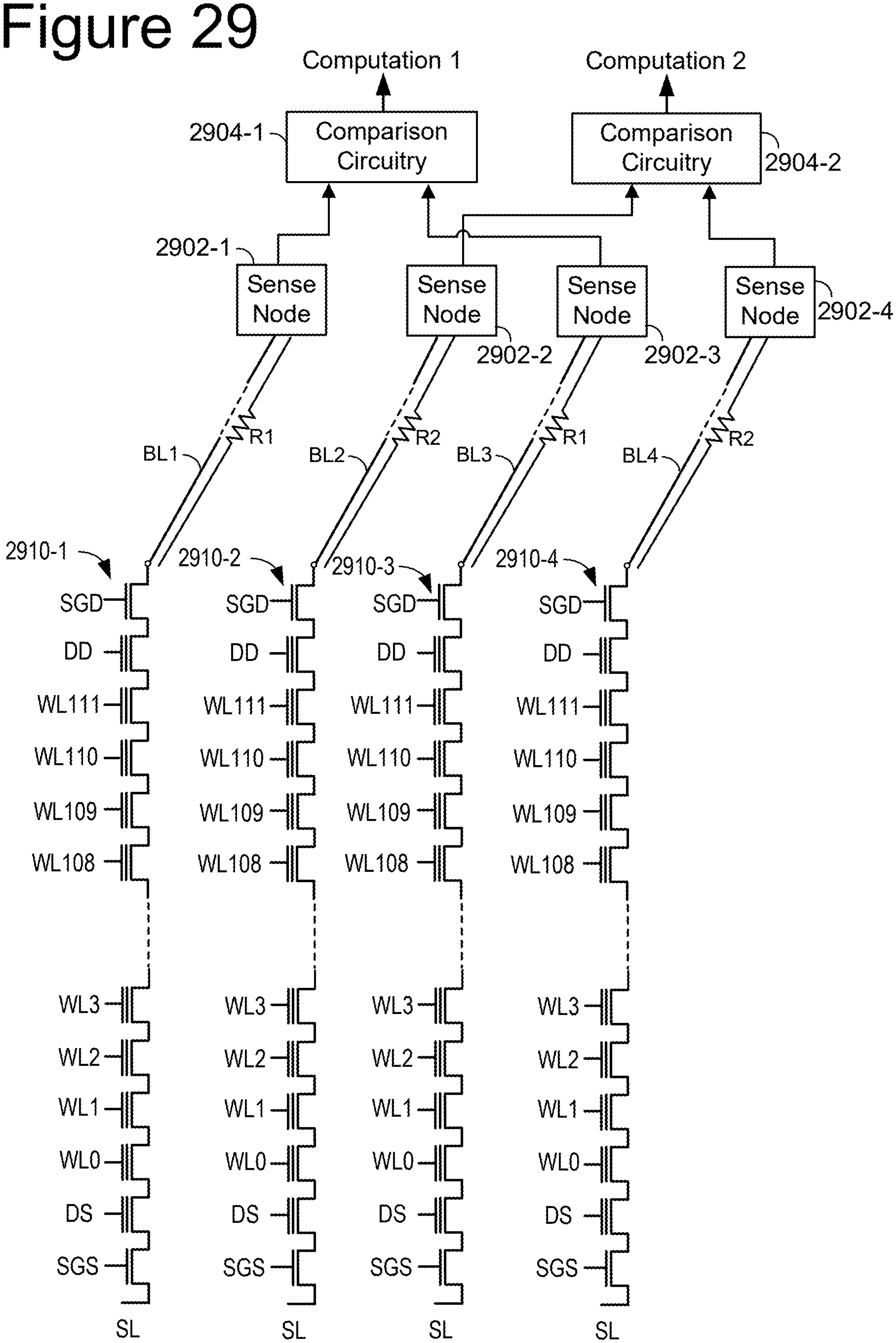
FIG. 29 is a diagram illustrating how bit line pairs may be organized for an embodiment of in-memory compute based on resistances of the bit lines.

FIG. 29 is a diagram illustrating how bit line pairs may be organized for an embodiment of in-memory compute based on resistances of the bit lines. Bit line BL1, having resistance R1, extends between sense node 2902-1 and NAND string 2910-1. Bit line BL2, having resistance R2, extends between sense node 2902-2 and NAND string 2910-2. Bit line BL3, having resistance R1, extends between sense node 2902-3 and NAND string 2910-3. Bit line BL4, having resistance R2, extends between sense node 2902-4 and NAND string 2910-4. The four bit lines are organized into two bit line pairs based on their respective resistances. The bit line pairs define which sense nodes 2902 are used to provide the inputs to the comparison circuitry 2904. In this example sense node 2902-1 and sense node 2902-3 provide their respective sense signals to the first comparison circuitry 2904-1. Sense node 2902-2 and sense node 2902-4 provide their respective sense signals to the second comparison circuitry 2904-2. The sense nodes 2902 may be similar to sense nodes 1520 in FIG. 15B. The comparison circuitry 2904 may be similar to comparison circuitry 1530 in FIG. 15B.

In general, a bit line pair will include two bit lines that have approximately the same resistance. There may be a tolerance for some difference between the resistances of the bit lines in a bit line pair. Therefore, in an embodiment, the bit line pair will include two bit lines having resistances that are within this tolerance of each other. The tolerance may be selected in order to achieve in-memory computation accuracy that is suitable for the application. In the example, BL1 and BL3 have the same resistance (R1) and are thus placed into a first bit line pair. BL2 and BL4 have the same resistance (R2) and are thus placed into a second bit line pair.

A pair of NAND strings that are associated with a bit line pair will be referred to as a "NAND string pair". Due to the NAND architecture, there may be many NAND string pairs (in different sub-blocks or blocks) that are associated with the same bit line pair. FIG. 29 shows a first NAND string pair 2910-1 and 2910-3 that is associated with bit line pair BL1, BL3. FIG. 29 shows a second NAND string pair 2910-2 and 2910-4 that is associated with bit line pair BL2, BL4. The programming of the NAND memory cells will reflect the organization of the bit line pairs. In an embodiment, each NAND string pair is programmed with the technique described in connection to FIG. 15A. For example, NAND string 2910-1 may be a positive stack and NAND string 2910-3 may be a negative stack. Similarly, NAND string 2910-2 may be a positive stack and NAND string 2910-4 may be a negative stack.

In an embodiment, NAND strings 2910-1 and 2910-3 are programmed to represent a first vector, whereas NAND strings 2910-2 and 2910-4 are programmed to represent a second vector. These two vectors could be vectors in a weight matrix. In an embodiment, the voltages applied to the word lines (i.e., gates of NAND memory cells) represent an input vector. Thus, computation 1 output by the first comparison circuitry 2904-1 may be a multiplication of the first vector programmed into NAND strings 2910-1 and 2910-3 and the input vector. Computation 2 output by the second comparison circuitry 2904-2 may be a multiplication (e.g., dot product) of the second vector programmed into NAND strings 2910-2 and 2910-4 and the input vector. Each of these two computations may be negatively impacted if there is a significant difference between the resistance of the two bit lines in the bit line pair. Therefore, the precision of the computations is improved by organizing the bit line pairs based on the resistances of the bit lines.

Figure 30:
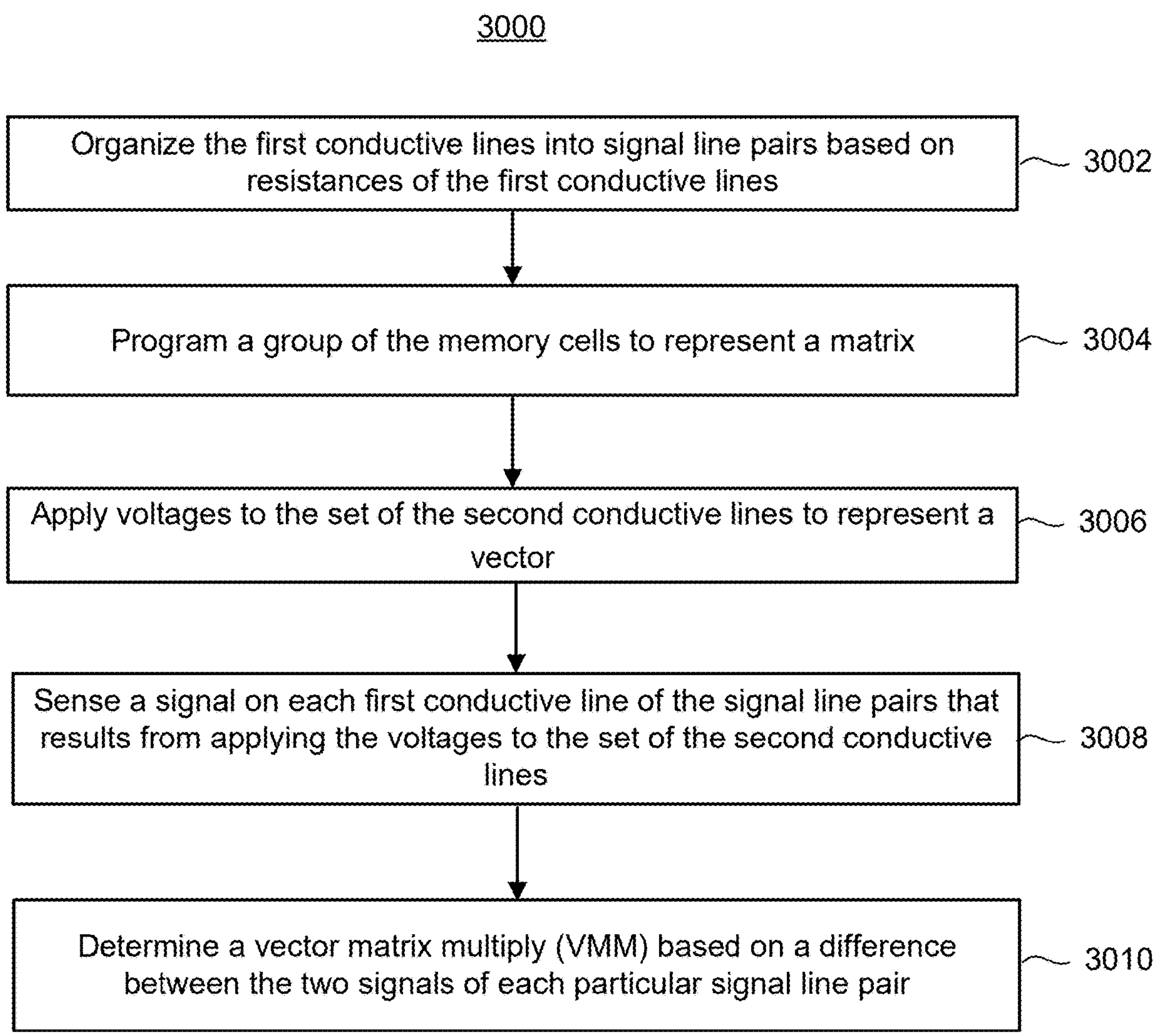
FIG. 30 is a flowchart of one embodiment of a process of performing in-memory compute with signal lines organized based on resistance of the signal lines.

FIG. 30 is a flowchart of one embodiment of a process 3000 of performing in-memory compute with signal lines organized based on resistance of the signal lines. In an embodiment, process 3000 is performed during an inferencing phase of an artificial neural network. The process 3000 may be performed by a combination of memory controller 120 and/or control circuitry (e.g., system control logic 260, column control circuitry 210, row control circuitry 220) of memory die 200 or control die 211. In an embodiment, a 3D NAND memory structure is used for the in-memory compute. However, process 3000 is not limited to 3D NAND. In other embodiments, MRAM, ReRAM, FeRAM, or PCM memory could be used.

Step 3002 includes organizing a first set of conductive lines into signal line pairs based on resistances of the first conductive lines. In an embodiment, the first conductive lines are bit lines in a 3D NAND memory architecture. In an embodiment, the first conductive lines reside in lines in a cross-point array. In a memory array with a cross-point type architecture, one set of conductive lines run across the surface of a substrate and another set of conductive lines are formed above the other set of conductive lines running in an orthogonal direction relative to the initial layer. The memory cells are located at the cross-point junctions of the two sets of conductive lines. Cross-point memory arrays are sometimes referred to as cross-bar memory arrays. The cross-point memory array may have memory cell of technologies such as MRAM, ReRam, PCM (Phase Change Memory), or FeRam.

For the sake of discussion some examples will be discussed in which the signal lines are bit lines in a 3D NAND structure. In an embodiment, one end of the bit line is connected to a sense node. The bit line is also connectable to NAND strings, wherein the connection point on the bit line is different for each NAND string. Therefore, the resistance of the bit line may depend on which NAND string is selected for the in-memory compute (e.g., which block is selected). The resistances of the bit lines may be determined prior to shipping the memory system to the customer or may be determined by the memory system 100 in the field. At least one resistance is determined for each bit line. In an embodiment, multiple resistances are determined to account for the different distances along the bit line from the sense node at one end of the bit line and the NAND string presently selected. Note that the organization of the bit line pairs may depend on what block is selected for the in-memory computation. Referring back to FIG. 4A, in some architectures, the bit lines will extend in the x-direction over a relatively long distance (e.g., a large number of blocks). In such an architecture a number of resistances may be determined for each bit line, depending on what block is being used for the in-memory computation. Referring back to FIG. 4B, in some architectures, the bit lines will extend in the x-direction over much smaller distance (e.g., smaller number of blocks). In such an architecture, as few as a single resistance might be determined for each bit line. Furthermore note that in some embodiments the sense nodes are on a different semiconductor die than the memory cells (see, for example, FIG. 2B). Furthermore, the sense nodes (and associated read/write circuitry) may occupy a large area (whether on the control die 211 or memory die 200—see FIG. 2A), which has implications of routing the bit lines from the sense nodes to the memory structure 202. Consequently, there can be considerable variances in the resistances of the bit lines between the sense nodes and the memory structure 202.

Step 3004 includes programming a group of the memory cells to represent a matrix of values. The matrix may be weights in an artificial neural network model. In an embodiment, calculation cell units are programmed (see FIG. 15A, for example). Thus step 3004 may include programming NAND string pairs, with each NAND string pair associated with a bit line pair.

Step 3006 includes applying voltages to a second set of conductive lines to represent a vector. In an embodiment, the second set of conductive lines are word lines in a 3D NAND memory structure.

Step 3008 includes sensing a signal on each conductive line of the signal line pairs that results from applying the voltages to the set of the second set of conductive lines. In an embodiment, currents in bit lines connected to NAND strings are sensed. Step 3008 may include sense nodes 2902 (see FIG. 29) sensing signals on the bit lines. This sensing may include discharging or charging a capacitor in the sense node 2902.

Step 3010 incudes determining a result for a vector matrix multiply (VMM) based on a difference between the two signals of each particular signal line pair. Step 1010 may include comparison circuitry 2904 (see FIG. 29) comparing the signals from two sense nodes 2902 and outputting the computation result. The computation result of the VMM may be a vector.

Figure 31:
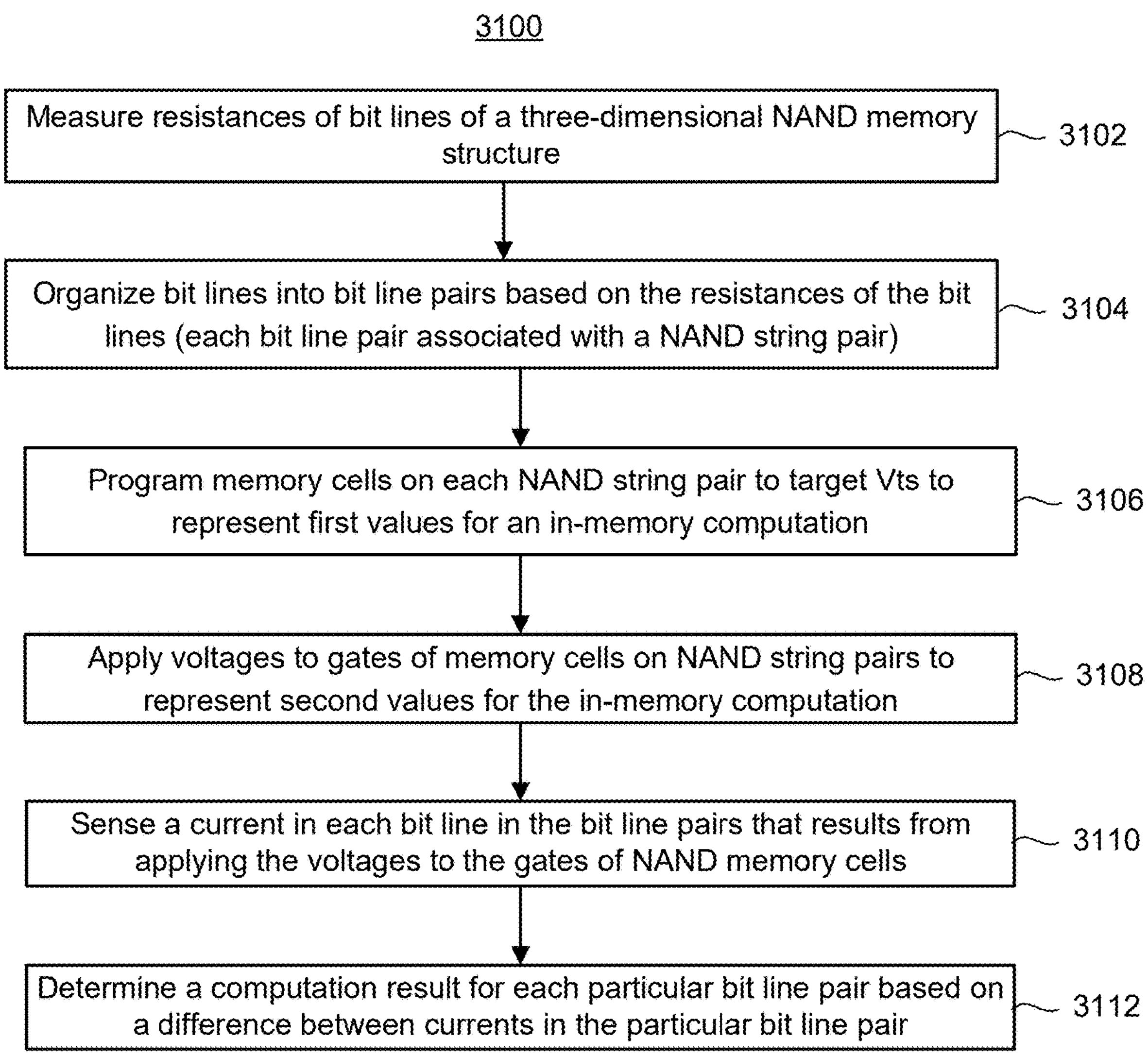
FIG. 31 is a flowchart of one embodiment of a process of performing in-memory compute with bit lines organized based on resistance of the bit lines.

FIG. 31 is a flowchart of one embodiment of a process 3100 of performing in-memory computation with bit lines organized based on resistance of the bit lines. In an embodiment, process 3100 is performed during an inferencing phase of an artificial neural network. The process 3100 may be performed by a combination of memory controller 120 and/or control circuitry (e.g., system control logic 260, column control circuitry 210, row control circuitry 220) of memory die 200 or control die 211.

Step 3102 includes measuring resistances of bit lines in a three-dimensional NAND memory structure, the three-dimensional NAND memory structure having NAND strings with each NAND string associated with one of the bit lines. In one embodiment, the measurement is performed offline, prior to shipping the memory system 100 to the customer. In one embodiment, the memory system 100 measures the resistances. The resistance of a bit line may depend on what block is to be selected for the in-memory computation.

Step 3104 includes organizing bit lines into bit line pairs based on the resistances of the bit lines, wherein at least one bit line pair contains two bit lines that are separated by a bit line of another bit line pair. Step 3104 may include identifying bit lines having resistances that are within a tolerance of each other and forming bit line pairs from pairs of bit lines having resistances that are within a tolerance of each other.

Step 3106 includes programming memory cells on each NAND string pair to target Vts to represent first values in the in-memory computation. In an embodiment, each NAND string pair is programmed to represent a different vector in a weight matrix of an artificial neural network.

Step 3108 includes applying voltages to gates of NAND memory cells in the NAND string pairs that are connected to the bit line pairs. These gate voltages represent second values in the in-memory computation and may represent a vector (e.g., input vector for the artificial neural network).

Step 3110 includes sensing a current in each bit line in the bit line pairs that results from applying the voltages to the gates of NAND memory cells on the NAND string pairs. Step 3108 may include sense nodes 2902 sensing the currents.

Step 3112 includes determining a computation result for each particular bit line pair based on a difference between currents in the particular bit line pair. Step 3112 may include comparison circuitry 2904 (see FIG. 29) comparing the signals from two sense nodes 2902 and outputting the computation result. The computation result for each particular bit line pair may be a MAC (e.g., vector-vector multiply). Collectively, the computation result for all of the bit line pairs may be a VMM (e.g., multiplication of input vector by weight matrix).

In view of the foregoing, an embodiment includes an apparatus comprising one or more control circuits configured to connect to a three-dimensional (3D) NAND memory structure. The 3D NAND memory structure has bit lines and NAND strings associated with the bit lines. The one or more control circuits are configured to organize calculation units based on a characteristic of individual NAND memory cell transistors. Each calculation unit comprises at least two NAND memory cell transistors. The at least two NAND memory cell transistors of at least one calculation unit are separated by at least one NAND memory cell transistor of another calculation unit. The one or more control circuits are configured to program threshold voltages of the NAND memory cell transistors of the calculation units to represent a first vector. The one or more control circuits are configured to apply voltages to gates of the NAND memory cell transistors of the calculation units on at least one selected NAND string to represent a second vector. The at least one selected NAND string connected to a corresponding at least one bit line. The one or more control circuits are configured to sense a current for each of the at least one bit lines that results from applying the voltages to the gates of NAND memory cell transistors. The one or more control circuits are configured to determine a result of multiplying the first vector by the second vector based on the current of each of the at least one bit lines.

In a further embodiment, the one or more control circuits are further configured to measure the characteristic of the individual NAND memory cell transistors. The characteristic being an operational characteristic. The one or more control circuits are further configured to form each calculation unit from NAND memory cell transistors that are within a tolerance of each other in the operational characteristic.

In a further embodiment, the characteristic of the individual NAND memory cell transistors comprises a drain to source current for a set of in-memory compute operating conditions.

In a further embodiment, the one or more control circuits are configured to measure the drain to source current for the set of in-memory compute operating conditions for the individual NAND memory cell transistors. The one or more control circuits are further configured to form each calculation unit from NAND memory cell transistors that are within a tolerance of each other in the drain to source current for the set of in-memory compute operating conditions.

In a further embodiment, the characteristic of the individual NAND memory cell transistors comprises a drain to source current for a target threshold voltage of the individual NAND memory cell transistors and a gate to source voltage of the individual NAND memory cell transistors.

In a further embodiment, the characteristic of the individual NAND memory cell transistors comprises a physical characteristic upon which a drain-to-source current of the individual NAND memory cell transistors depend. The one or more control circuits are further configured to form each calculation unit from NAND memory cell transistors that are within a tolerance of each other in the physical characteristic.

In a further embodiment, the physical characteristic of the individual NAND memory cell transistors comprises a tunnel oxide thickness of the individual NAND memory cell transistors. The one or more control circuits are further configured to form each calculation unit from NAND memory cell transistors that are within a tolerance of each other in the tunnel oxide thickness.

In a further embodiment, the physical characteristic of the individual NAND memory cell transistors comprises a tunnel oxide capacitance of the individual NAND memory cell transistors. The one or more control circuits are further configured to form each calculation unit from NAND memory cell transistors that are within a tolerance of each other in the tunnel oxide capacitance.

In a further embodiment, the physical characteristic of the of the individual NAND memory cell transistors comprises a length of the individual NAND memory cell transistors. The one or more control circuits are further configured to form each calculation unit from NAND memory cell transistors that are within a tolerance of each other in transistor length.

In a further embodiment, the physical characteristic of the individual NAND memory cell transistors comprises a width of the individual NAND memory cell transistors. The one or more control circuits are further configured to form each calculation unit from NAND memory cell transistors that are within a tolerance of each other in transistor width.

In a further embodiment, each calculation unit comprises at least two NAND memory cell transistors on the same NAND string. For at least one calculation unit, at least two NAND memory cell transistors of the at least one calculation unit in the same NAND string are separated by at least one NAND memory cell transistors of another calculation unit.

In a further embodiment, each calculation unit comprises at least a first NAND memory cell transistor on a first NAND string and a second NAND memory cell transistor on a second NAND string. For at least one calculation unit, the first NAND memory cell transistor and the second NAND memory cell transistor are separated by a third NAND memory cell transistor on a third NAND string. The third NAND memory cell transistor is part of a different calculation unit.

An embodiment includes a method for performing in-memory computations. The method comprises measuring a characteristic of individual NAND memory cell transistors in a three-dimensional NAND memory structure. The method further comprises forming calculation units based on the characteristic of the individual NAND memory cell transistors. Each calculation unit comprises at least two NAND memory cell transistors. The at least two NAND memory cell transistors of at least one calculation unit are separated by at least one NAND memory cell transistors ell of another calculation unit. The method further comprises programming threshold voltages of the NAND memory cell transistors of the calculation units to represent a first vector. The method further comprises applying voltages to gates of NAND memory cell transistors of the calculation units on at least one selected NAND string to represent a second vector. The at least one selected NAND string connected to a corresponding at least one bit line. The method further comprises sensing a current for each of the at least one bit lines that results from applying the voltages to the gates of the NAND memory cell transistors of the calculation units. The method further comprises determining a dot product of the first vector times the second vector based on the current for each of the at least one bit lines.

An embodiment includes a NAND memory system comprising a three-dimensional NAND memory structure having bit lines and NAND strings associated with the bit lines.

Each NAND string has NAND memory cell transistors. The NAND memory system has one or more control circuits in communication with the three-dimensional NAND memory structure. The one or more control circuits configured to form calculation units based on a drain-to-source current of individual NAND memory cell transistors for equivalent operating parameters during an in-memory computation. Each calculation unit has at least two NAND memory cell transistors on a NAND string. The one or more control circuits configured to perform the in-memory computation using the calculation units.

What is claimed is:

1. An apparatus comprising:

one or more control circuits configured to connect to a three-dimensional (3D) NAND memory structure, the 3D NAND memory structure having a plurality of bit lines and NAND strings associated with the plurality of bit lines, the one or more control circuits configured to:

organize a plurality of calculation units based on a characteristic of individual NAND memory cell transistors on the NAND strings in the 3D memory structure, each calculation unit of the plurality of calculation units comprising a plurality of the individual NAND memory cell transistors, wherein at least one of the individual NAND memory cell transistors of a first calculation unit of the plurality of calculation units separates two of the plurality of NAND memory cell transistors of a second calculation unit of the plurlity of calcultion units;

program threshold voltages of the plurality of the individual NAND memory cell transistors of the plurality of calculation units to represent a first vector, the plurality of the programmed NAND memory cell transistors residing on at least one NAND string in the 3D memory structure, each NAND string of the at least one NAND string connected to a corresponding bit line in the 3D memory structure;

apply voltages to gates of the plurality of the programmed NAND memory cell transistors of the plurality of calculation units to represent a second vector;

sense a current of the corresponding bit line connected to each NAND string of the at least one NAND string that results from applying the voltages to the gates of the plurality of the programmed NAND memory cell transistors of the plurality of calculation units; and determine a result of multiplying the first vector by the second vector based on the current of the corresponding bit line connected to each NAND string of the at least one NAND string vector by the second vector based on the current of each of the at least one bit lines.

2. The apparatus of claim 1, wherein the one or more control circuits are further configured to:

measure the characteristic of the individual NAND memory cell transistors, the characteristic being an operational characteristic; and form each calculation unit of the plurality of calculation units from the individual NAND memory cell transistors that are within a tolerance of each other in the operational characteristic.

3. The apparatus of claim 1, wherein:

the characteristic of the individual NAND memory cell transistors comprises a drain to source current for a set of in-memory compute operating conditions.

4. The apparatus of claim 3, wherein the one or more control circuits are configured to:

measure the drain to source current for the set of in-memory compute operating conditions for the individual NAND memory cell transistors; and form each calculation unit of the plurality of calculation units from the individual NAND memory cell transistors that are within a tolerance of each other in the drain to source current for the set of in-memory compute operating conditions.

5. The apparatus of claim 1, wherein:

the characteristic of the individual NAND memory cell transistors comprises a drain to source current for a target threshold voltage of the individual NAND memory cell transistors and a gate to source voltage of the individual NAND memory cell transistors.

6. The apparatus of claim 1, wherein:

the characteristic of the individual NAND memory cell transistors comprises a physical characteristic upon which a drain-to-source current of the individual NAND memory cell transistors depend; and the one or more control circuits are further configured to form each calculation unit of the plurality of calculation units from the individual NAND memory cell transistors that are within a tolerance of each other in the physical characteristic.

7. The apparatus of claim 6, wherein the physical characteristic of the individual NAND memory cell transistors comprises a tunnel oxide thickness of the individual NAND memory cell transistors, the one or more control circuits are further configured to form each calculation unit from NAND memory cell transistors that are within a tolerance of each other in the tunnel oxide thickness.

8. The apparatus of claim 6, wherein the physical characteristic of the individual NAND memory cell transistors comprises a tunnel oxide capacitance of the individual NAND memory cell transistors, the one or more control circuits are further configured to form each calculation unit of the plurality of calculation units from the individual NAND memory cell transistors that are within a tolerance of each other in the tunnel oxide capacitance.

9. The apparatus of claim 6, wherein the physical characteristic of the of the individual NAND memory cell transistors comprises a length of the individual NAND memory cell transistors, the one or more control circuits are further configured to form each calculation unit of the plurality of calculation units from the individual NAND memory cell transistors that are within a tolerance of each other in transistor length.

10. The apparatus of claim 6, wherein the physical characteristic of the individual NAND memory cell transistors comprises a width of the individual NAND memory cell transistors, the one or more control circuits are further configured to form each calculation unit of the plurality of calculation units from the individual NAND memory cell transistors that are within a tolerance of each other in transistor width.

11. The apparatus of claim 1, wherein each calculation unit of the plurality of calculation units comprises two NAND memory cell transistors on the same NAND string, wherein the at least one individual NAND memory cell transistor of the first calculation unit separates the two NAND memory cell transistors of the second calculation unit on the same NAND string.

12. The apparatus of claim 11, wherein a first individual NAND memory cell transistor of the plurality of the individual NAND memory cell transistors of the second calculation unit resides on a first NAND string and a second individual NAND memory cell transistor of the plurality of the individual NAND memory cell transistors of the second calculation unit resides on a second NAND string, the first individual NAND memory cell transistor and the second individual NAND memory cell transistor each connected to a first word line in the 3D NAND memory structure, wherein a third individual NAND memory cell transistor of the plurality of NAND memory cell transistors of the first calculation unit resides on a third NAND string connected to the first word line, the third NAND string is between the first NAND string and the second NAND string.

13. A method for performing in-memory computations, the method comprising:

measuring a characteristic of individual NAND memory cell transistors in a three-dimensional (3D) NAND memory structure;

forming a plurality of calculation units based on the characteristic of the individual NAND memory cell transistors, each calculation unit of the plurality of calculation units comprising a plurality of the individual NAND memory cell transistors, wherein at least one of the individual NAND memory cell transistors of a first calculation unit of the plurality of calculation units separates two of the plurality of the individual NAND memory cell transistors of a second calculation unit of the plurality of calculation unit;

programming threshold voltages of the plurality of the individual NAND memory cell transistors of the plurality of calculation units to represent a first vector, the plurality of the programmed NAND memory cell transistors residing on at least one NAND string in the three-dimensional NAND memory structure, each NAND string of the at least one NAND string connected to a corresponding bit line in the 3D memory structure;

applying voltages to gates of the plurality of the programmed NAND memory cell transistors of the plurality of calculation units to represent a second vector;

sensing a current of the corresponding bit line connected to each NAND string of the at least one NAND string that results from applying the voltages to the gates of the plurality of the programmed NAND memory cell transistors of the plurality of calculation units; and determining a dot product of the first vector times the second vector based on the current of the corresponding bit line connected to each NAND string of the at least one NAND string.

14. The method of claim 13, wherein:

measuring the characteristic of the individual NAND memory cell transistors in the three-dimensional NAND memory structure comprises measuring an operational characteristic of the individual NAND memory cell transistors; and forming the plurality of calculation units based on the characteristic of the individual NAND memory cell transistors comprises forming each calculation unit from the individual NAND memory cell transistors that are within a tolerance of each other in the operational characteristic.

15. The method of claim 14, wherein:

measuring the operational characteristic of the individual NAND memory cell transistors comprises measuring a drain to source current for typical in-memory compute conditions; and forming each calculation unit of the plurality of calculation units from the individual NAND memory cell transistors that are within a tolerance of each other in the operational characteristic comprises forming each calculation unit of the plurality of calculation units from the individual NAND memory cell transistors that are within a tolerance of each other in the drain to source current.

16. A NAND memory system comprising:

a three-dimensional NAND memory structure having bit lines and NAND strings associated with the bit lines, each NAND string having individual NAND memory cell transistors; and one or more control circuits in communication with the three-dimensional NAND memory structure, the one or more control circuits configured to:

form a plurality of calculation units based on a drain-to-source current of the individual NAND memory cell transistors for equivalent operating parameters during an in-memory computation, each calculation unit of the plurality of calculation units having a plurality of the individual NAND memory cell transistors on a NAND string in the three-dimensional NAND memory structure; and perform the in-memory computation using the plurality of calculation units.

17. The NAND memory system of claim 16, wherein the one or more control circuits are configured to:

form each calculation unit of the plurality of calculation units to include the individual NAND memory cell transistors having a drain-to-source current for the equivalent operating parameters that is within a tolerance of each other.

18. The NAND memory system of claim 16, wherein the equivalent operating parameters comprises the same Vt and the same gate-to-source voltage.

19. The NAND memory system of claim 16, wherein the one or more control circuits are configured to:

program threshold voltages of the plurality of the individual NAND memory cell transistors of the plurality of the calculation units to represent a first vector, the plurality of the programmed NAND memory cell transistors of the plurality of the calculation units residing on one or more selected NAND strings connected to a corresponding one or more bit lines;

apply voltages to gates of the plurality of the programmed NAND memory cell transistors of the plurality of the calculation units to represent a second vector;

sense a current for each bit line of the one or more bit lines that results from applying the voltages to the gates of plurality of the programmed NAND memory cell transistors of the plurality of the calculation units; and determine a dot product of the first vector times the second vector based on the current for each bit line of the one or more bit lines.

* * * * *